United States Patent
Fukuda

(10) Patent No.: US 9,087,783 B2
(45) Date of Patent: Jul. 21, 2015

(54) METHOD OF MANUFACTURING SEMICONDUCTOR DEVICE

(71) Applicant: FUJITSU SEMICONDUCTOR LIMITED, Yokohama-shi, Kanagawa (JP)

(72) Inventor: Masatoshi Fukuda, Akiruno (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 98 days.

(21) Appl. No.: 14/066,416

(22) Filed: Oct. 29, 2013

(65) Prior Publication Data
US 2014/0235045 A1 Aug. 21, 2014

(30) Foreign Application Priority Data

Feb. 19, 2013 (JP) .................... 2013-030321

(51) Int. Cl.
*H01L 21/3205* (2006.01)
*H01L 21/4763* (2006.01)
*H01L 21/28* (2006.01)
*H01L 21/308* (2006.01)

(52) U.S. Cl.
CPC ........ *H01L 21/28008* (2013.01); *H01L 21/308* (2013.01)

(58) Field of Classification Search
None
See application file for complete search history.

(56) References Cited

U.S. PATENT DOCUMENTS

| 2008/0286698 | A1* | 11/2008 | Zhuang et al. ................. 430/323 |
| 2010/0102389 | A1* | 4/2010 | Muller et al. ................. 257/347 |
| 2011/0104863 | A1* | 5/2011 | Beyer et al. .................. 438/283 |
| 2011/0254106 | A1 | 10/2011 | Katakami et al. |
| 2012/0045901 | A1 | 2/2012 | Kim et al. |

FOREIGN PATENT DOCUMENTS

| JP | 2003-303963 A | 10/2003 |
| JP | 2011-228395 A | 11/2011 |
| JP | 2012-044184 A | 3/2012 |

* cited by examiner

*Primary Examiner* — Charles Garber
*Assistant Examiner* — Abdulfattah Mustapha
(74) *Attorney, Agent, or Firm* — Westerman, Hattori, Daniels & Adrian, LLP

(57) ABSTRACT

A hard mask formed above a gate film is patterned with a first mask pattern, the patterned hard mask film is processed into a gate pattern with a second mask pattern, the gate film is patterned with the hard mask film as a mask, a spacer insulating film is formed, a third mask pattern covering an edges of the gate pattern is formed above the spacer insulating film, the spacer insulating film is etched with the third mask pattern as a mask, and a sidewall insulating film is formed on side walls of the gate film leaving the spacer insulating film in a region of the edge of the gate pattern.

9 Claims, 73 Drawing Sheets

METHOD OF MANUFACTURING SEMICONDUCTOR DEVICE

CROSS-REFERENCE TO RELATED APPLICATION

This application is based upon and claims the benefit of priority of the prior Japanese Patent Application No. 2013-030321, filed on Feb. 19, 2013, the entire contents of which are incorporated herein by reference.

FIELD

The embodiments discussed herein are related to a method of manufacturing a semiconductor device.

BACKGROUND

Conventionally, interconnections, as of the gate electrodes, etc. of MOSFETs have been patterned by one photolithography process. However, as the semiconductor integrated circuits have been more downsized, effects, such as the rounding and shortening of the end parts of narrow interconnections, due to the optical proximity effect, etc., have become conspicuous. It has been difficult to control the configurations of the end parts of the interconnections.

In such background, recently multiple patterning techniques are used to control with high precision the configurations of the end parts of the interconnections. In the typical multiple patterning technique, interconnections are patterned by combining a processing with a first mask pattern for forming narrow lines and a processing with a second mask patterns for cutting the narrow lines to form the end parts of the interconnections.

On the other hand, the gate insulating film and the gate electrode of the MOSFETs have been formed of the combination of a high dielectric constant insulating film of higher dielectric constant, and a metal film in place of the combination of silicon oxide film formed by thermally oxidizing a silicon substrate, and polycrystalline silicon film.

The followings are examples of related: Japanese Laid-open Patent Publication No. 2003-303963; Japanese Laid-open Patent Publication No. 2011-228395; and Japanese Laid-open Patent Publication No. 2012-044184.

In order to suppress the corrosion of the gate insulating film and the gate electrode with the chemical treatment in the manufacturing process, often the gate insulating film and the gate electrode are covered with a silicon oxide film, a silicon nitride film or a polycrystalline silicon film. However, the inventor of the present application has found for the first time the problem that in forming the gate electrode by the multiple patterning described above, the gate insulating film and the gate electrode are often exposed by once chemical treatment or processing in the manufacturing process and are corroded by the chemical treatment or processing in the following manufacturing process. This problem takes place with the gate insulating film and the gate electrode formed respectively of high dielectric constant insulating film and metal film.

SUMMARY

According to one aspect of the embodiments, there is provided a method of manufacturing a semiconductor device including forming a gate insulating film above a semiconductor substrate, forming a gate film above the gate insulating film, forming a hard mask film above the gate insulating film, patterning the hard mask with a first mask pattern, processing the patterned hard mask film into a gate pattern with a second mask pattern, patterning the gate film and the gate insulating film with the hard mask film having the gate pattern as a mask, forming a spacer insulating film above the semiconductor substrate with the patterned gate film and the gate insulating film, forming above the spacer insulating film a third mask pattern covering an edge of the patterned gate film and the gate insulating film, and etching the spacer insulating film with the third mask patterns as the mask to form a sidewall insulating film of the spacer insulating film on side walls of the patterned gate film and the gate insulating film, leaving the spacer insulating film below the third mask pattern.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

An Embodiment

A method of manufacturing a semiconductor device according to an embodiment will be described with reference to FIGS. 1 to 48B.

FIGS. 1 to 48B are plan views and cross-sectional views illustrating the method of manufacturing the semiconductor device according to the present embodiment.

First, a device isolation insulating film 12 for defining active regions 14 is formed in a silicon substrate by STI (Shallow Trench Isolation) method. As the device isolation insulating film 12, silicon oxide film deposited by CVD method using, e.g., TEOS or others as the raw material may be used.

Next, well ion implantation, channel ion implantation, etc. are made as required, and then thermal processing for activating the implanted impurities is made to thereby form prescribed wells (not illustrated) in the active regions 14.

Then, the silicon oxide film (not illustrated) on the surfaces of the active regions 14 is removed by wet etching using, e.g., a hydrofluoric acid based aqueous solution. This silicon oxide film is the pad oxide film to be used in forming the device isolation insulating film 12 and/or the sacrificial oxidation film to be used in ion implantation.

Next, a silicon oxide film 16 is formed anew above the surface of the silicon substrate 10 by thermal oxidation method (FIGS. 1-3B). This silicon oxide film 16 is the film to be the base film of a gate insulating film of a high dielectric constant insulating material.

Figure 1:
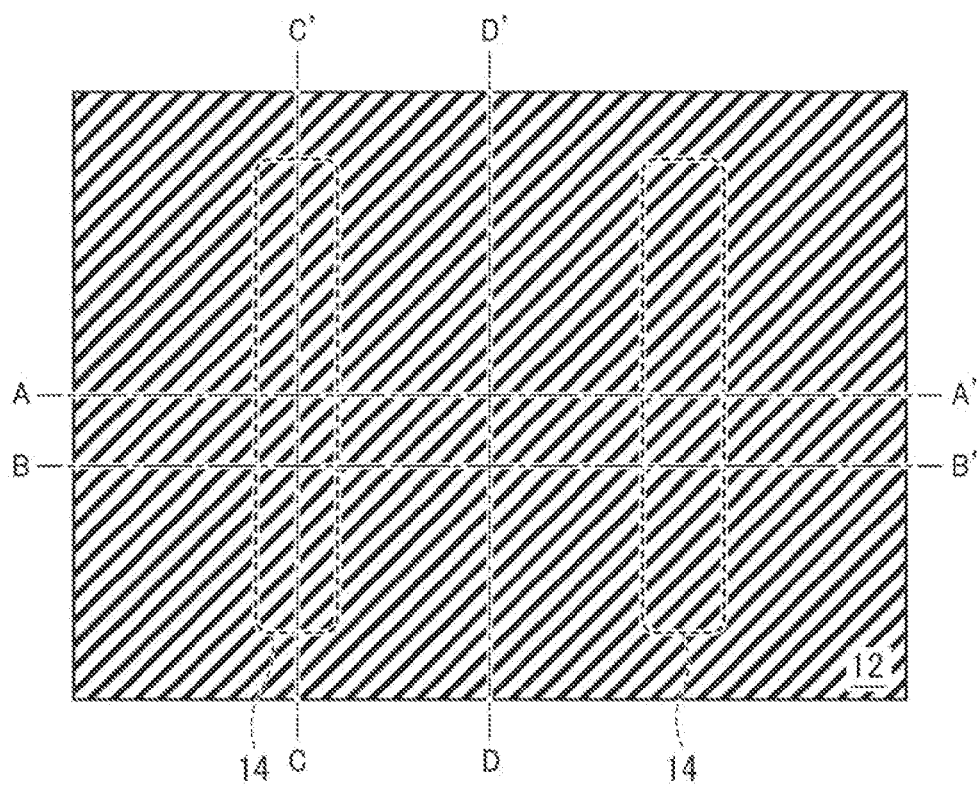
FIGS. 1, 4, 7, 10, 13, 16, 19, 22, 25, 28, 31, 34, 37, 40, 43 and 46 are plan views illustrating a method of manufacturing a semiconductor device according to an embodiment.
Figure 2A:
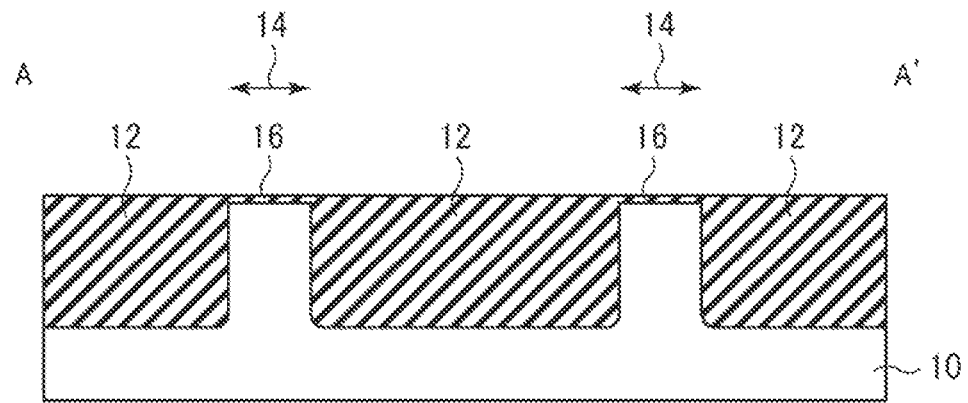
FIGS. 2A, 2B, 3A, 3B, 5A, 5B, 6A, 6B, 8A, 8B, 9A, 9B, 11A, 11B, 12A, 12B, 14A, 14B, 15A, 15B, 17A, 17B, 18A, 18B, 20A, 20B, 21A, 21B, 23A, 23B, 24A, 24B, 26A, 26B, 27A, 27B, 29A, 29B, 30A, 30B, 32A, 32B, 33A, 33B, 35A, 35B, 36A, 36B, 38A, 38B, 39A, 39B, 41A, 41B, 42A, 42B, 44A, 44B, 45A, 45B, 47A, 47B, 48A and 48B are cross-sectional views illustrating the method of manufacturing the semiconductor device according to the embodiment.
Figure 2B:
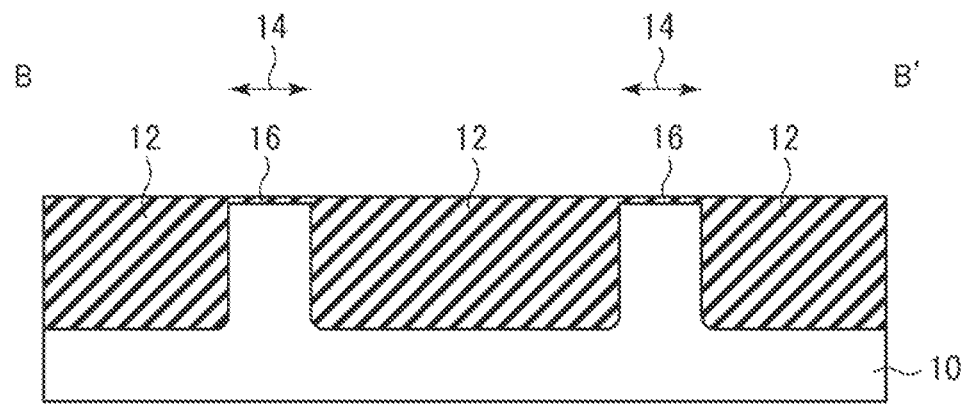
Figure 3A:
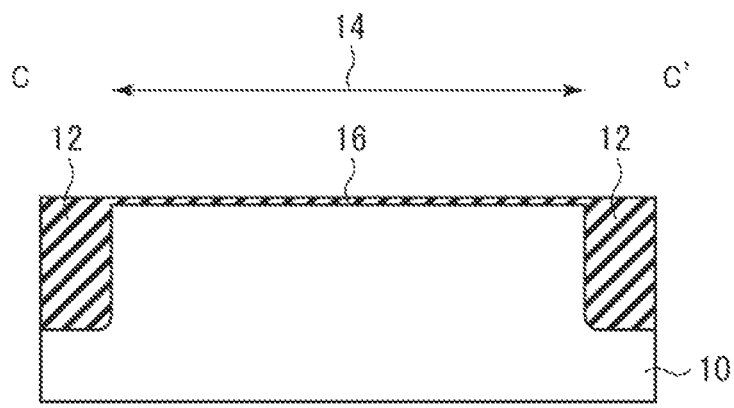
Figure 3B:
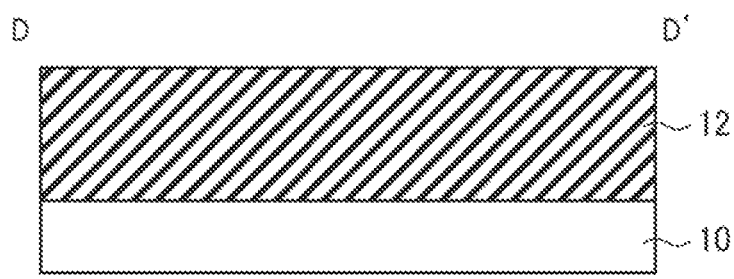

FIG. 1 is a plan view of the semiconductor device after said steps as viewed from above the surface of the semiconductor device. FIG. 2A is the A-A' line cross-sectional view of FIG. 1, and FIG. 2B is the B-B' line cross-sectional view of FIG. 1. FIG. 3A is the C-C' line cross-sectional view of FIG. 1, and FIG. 3B is the D-D' line cross-sectional view of FIG. 1.

In this embodiment, two active regions 14 extended in Y direction (longitudinally in the plan view) are laid out adjacent to each other in X direction (laterally in the plan view).

FIGS. 2A-3D illustrate the example that the surface of the device isolation insulating film 12 and the surfaces of the active regions 14 are even with each other. It is not essential that the surface of the device isolation insulating film 12 and the surfaces of the active regions 14 are even with each other. The method of manufacturing the semiconductor device according to the present embodiment is applicable to the case where the surface of the device isolation insulating film 12 is higher than the surfaces of the active regions 14 and the case where the surfaces of the active regions 14 are higher than the surface of the device isolation insulating film 12.

Then, a high dielectric constant insulating film 18 of, e.g., $HfO_2$, HfSiO, HfAlON, $Y_2O_3$, ZrO, TiO, TaO or others is formed above the entire surface by, e.g., CVD method, sputtering method or others. Thus, a gate insulating film 20 of the layer film of the silicon oxide film 16 and the high dielectric constant insulating film is formed on the active regions 14. The high dielectric constant insulating film 18 may have a single layer structure or a layer structure of a combination of arbitrary high dielectric constant insulating materials.

Next, a conductive film of, e.g., TiN, Ti, TaN, Ta or others is deposited above the gate insulating film 20 by CVD method, sputtering method or others to form a buffer layer 22 of such conductive film.

Next, amorphous silicon, for example, is deposited above the buffer layer 22 to form a gate film 24 of amorphous silicon. In this specification, the gate film means a film to be a dummy gate electrode which is to be replaced with a gate electrode material in a later step or a film to be patterned into the gate electrodes in a later step.

In the present embodiment, the method of manufacturing the semiconductor device will be described by means of the example of the so-called gate last process, in which the gate film 24 (dummy gate electrode) is replaced with a metal gate electrode in a later step. The buffer layer 22 is a film for suppressing the damage to the gate insulating film 20 in removing the gate film in a later step. The buffer layer 22 is not essentially formed in the case that the gate film 24 can be removed without damaging the gate insulating film 20.

In the case where the gate electrode is formed by the so-called gate first process, in which the source/drain regions, etc. are formed after the gate electrode has been formed, a metal film of, e.g., Ti, Ta, TiN, TaN, W, Cu, Al, Ru or others may be formed in place of the buffer layer 22 and the gate film 24. In this case, the process of replacing the gate film 24 with the metal gate electrode illustrated in FIGS. 35-45B to be described later is unnecessary.

Then, a silicon oxide film and a silicon nitride film, for example, are deposited above the gate film 24 by, e.g., CVD method to form a first hard mask 26 of the silicon oxide film and a second hard mask 28 of the silicon nitride film (FIGS. 4-6B).

The second hard mask 28 is mainly used as the mask in patterning the gate film 24, the buffer layer 22 and the high dielectric constant insulating film 18.

The first hard mask 26 is mainly for reducing the damage to be applied to the base in patterning the second hard mask 28. The first hard mask 26 also acts to block, in forming a silicide layer above the source/drain regions in a later step, the formation of the silicide layer above the gate film 24. In the case that the gate first process is adopted, it is possible that the first hard mask 26 is omitted, and the silicide layer is formed above the gate film 24.

Figure 4:
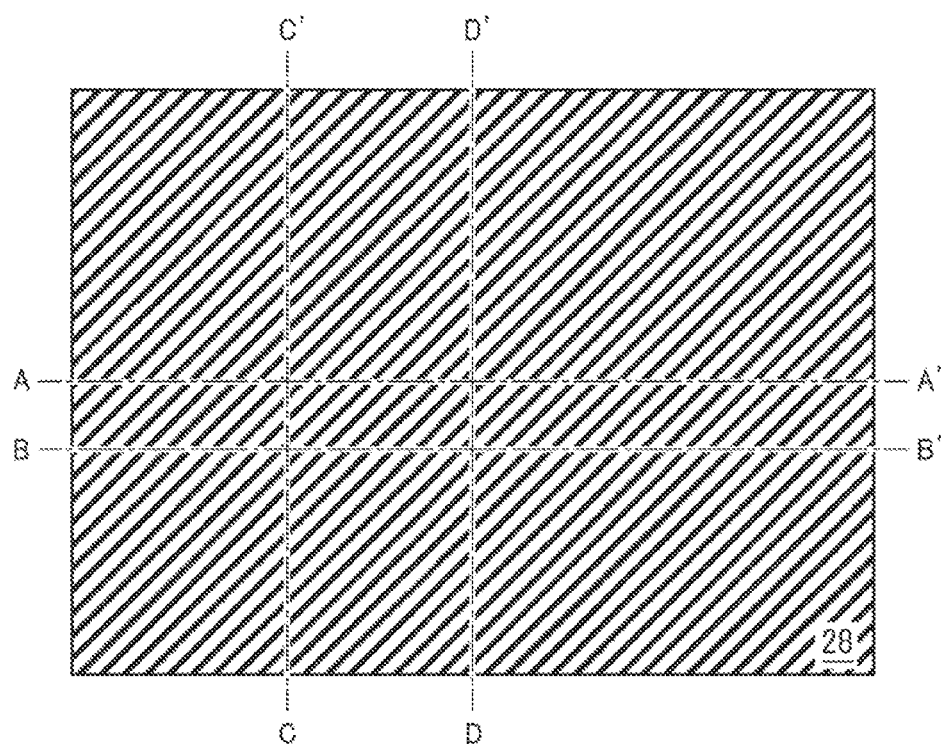
Figure 5A:
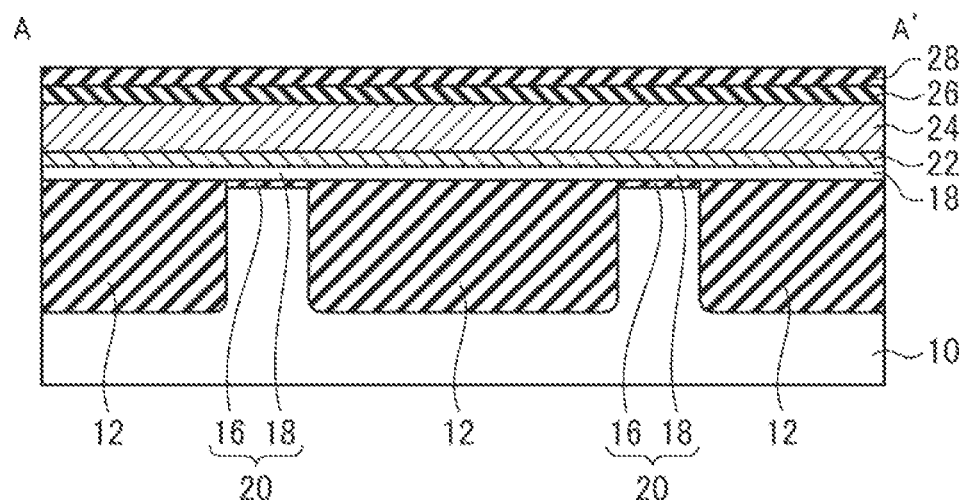
Figure 5B:
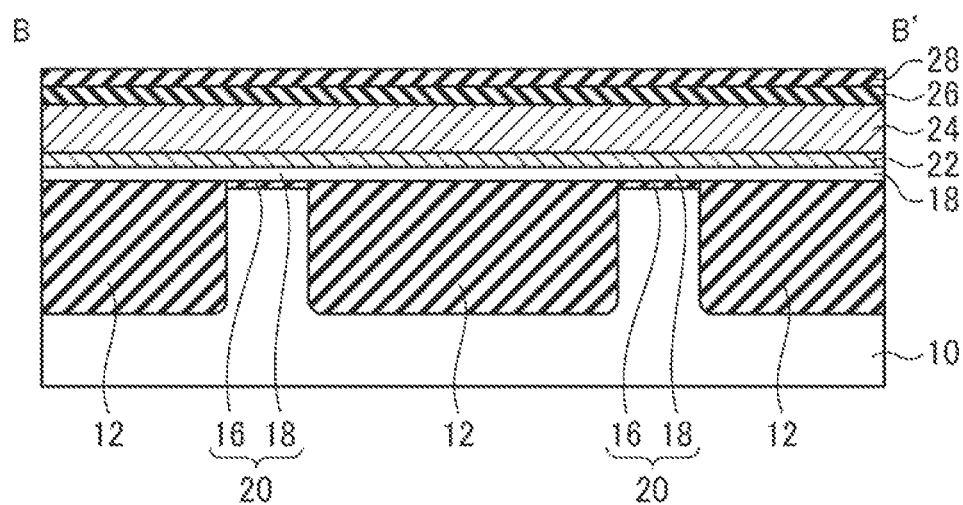
Figure 6A:
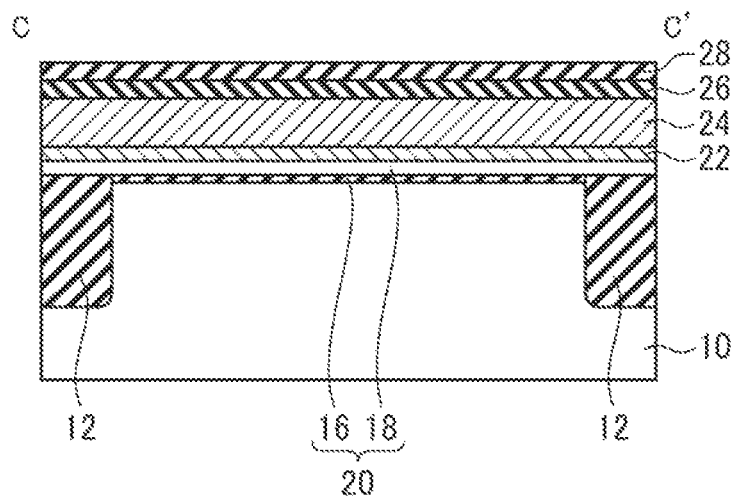
Figure 6B:
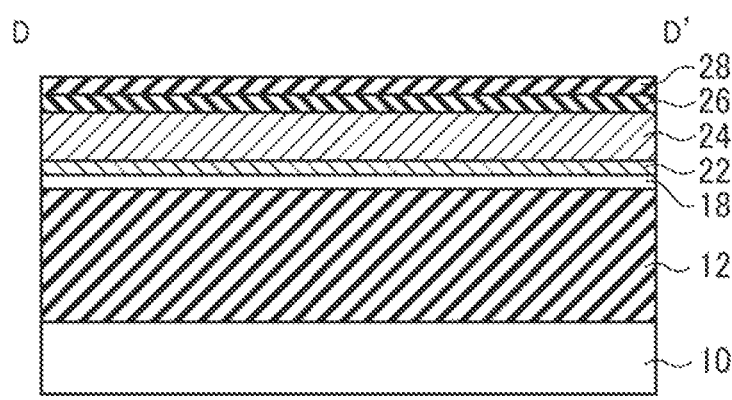

FIG. 4 is a plan view of the semiconductor device after said steps as viewed from above the surface of the semiconductor device. FIG. 5A is the A-A' line cross-sectional view of FIG. 4, and FIG. 5B is the B-B' line cross-sectional view of FIG. 4. FIG. 6A is the C-C' line cross-sectional view of FIG. 4, and FIG. 6B is the D-D' line cross-sectional view of FIG. 4.

Then, a photoresist film and an anti-reflection coating film are formed above the second hard mask 28, and then the photoresist film is patterned by photolithograph to form a first mask pattern 30 for forming the gate electrodes.

Next, the second hard mask 28 is dry etched with the first mask pattern 30 as the mask to transfer the pattern of the first mask pattern 30 to the second hard mask 28 (FIGS. 7-9B).

Figure 7:
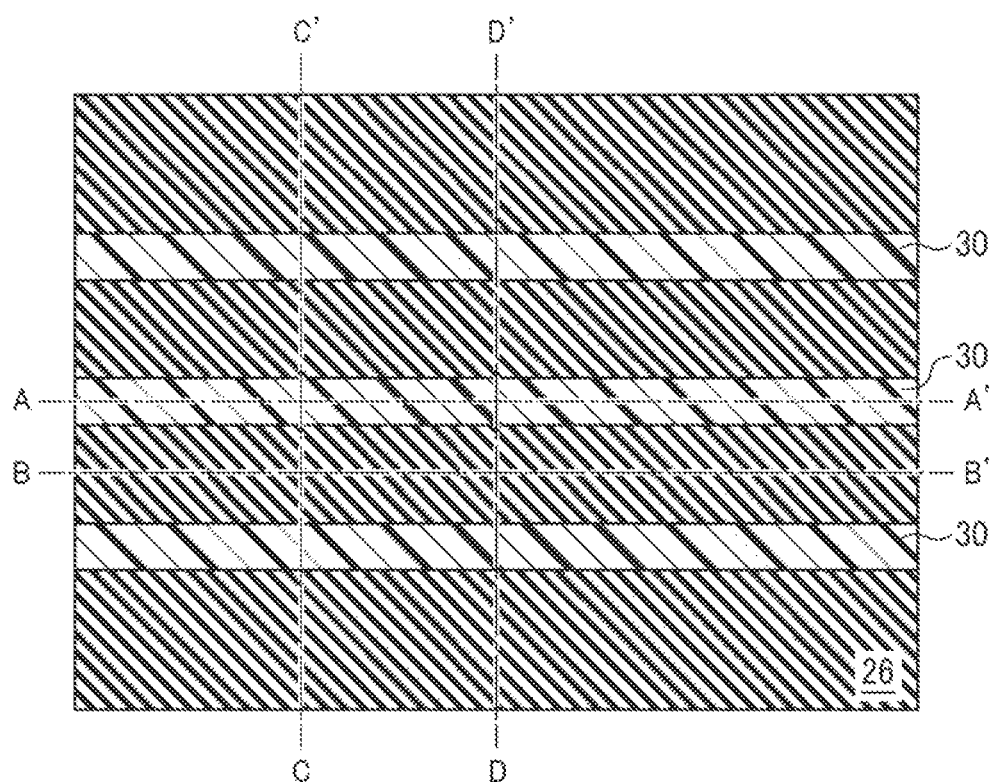
Figure 8A:
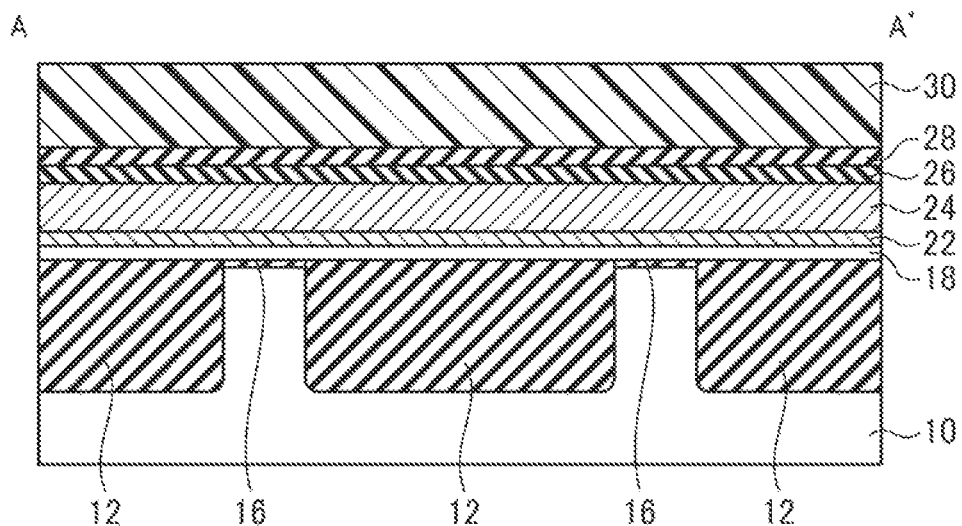
Figure 8B:
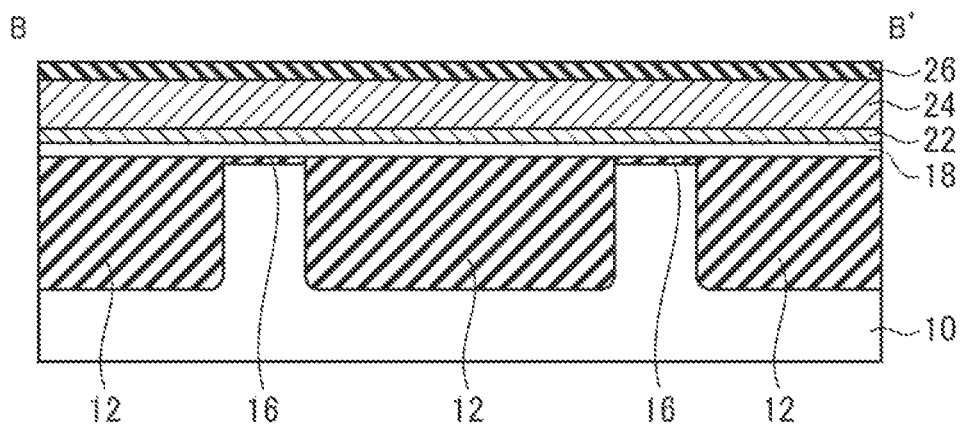
Figure 9A:
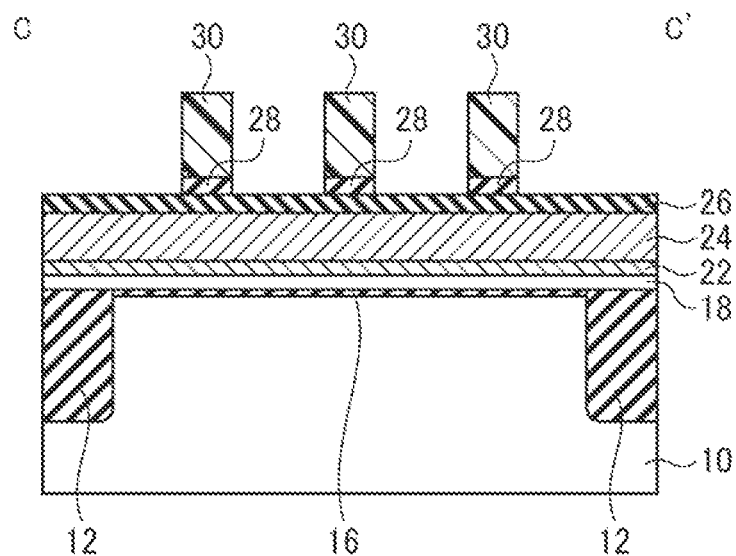
Figure 9B:
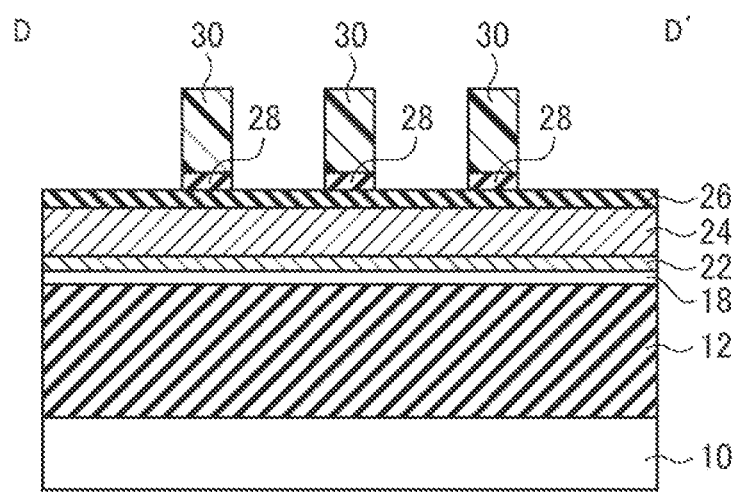

FIG. 7 is a plan view of the semiconductor device after said steps as viewed from above the surface of the semiconductor device. FIG. 8A is the A-A' line cross-sectional view of FIG. 7, and FIG. 8B is the B-B' line cross-sectional view of FIG. 7. FIG. 9A is the C-C' line cross-sectional view of FIG. 7, and FIG. 9B is the D-D' line cross-sectional view of FIG. 7.

The first mask pattern 30 is for defining the longer sides of the gate electrodes (forming narrow lines) and, as exemplified in FIGS. 7 to 9B, includes three line patterns extended in the X direction, transversing the two active regions 14. One line pattern may contain plural regions for the gate electrodes to be formed in.

Then, the first mask pattern 30 is removed by, e.g., asking method.

Then, a photoresist film and an anti-reflection coating film are formed above the first hard mask 26 with the patterned second hard mask formed on, and then the photoresist film is patterned by photolithography to form the second mask pattern 32 for forming the gate electrodes (FIGS. 10-12B).

Figure 10:
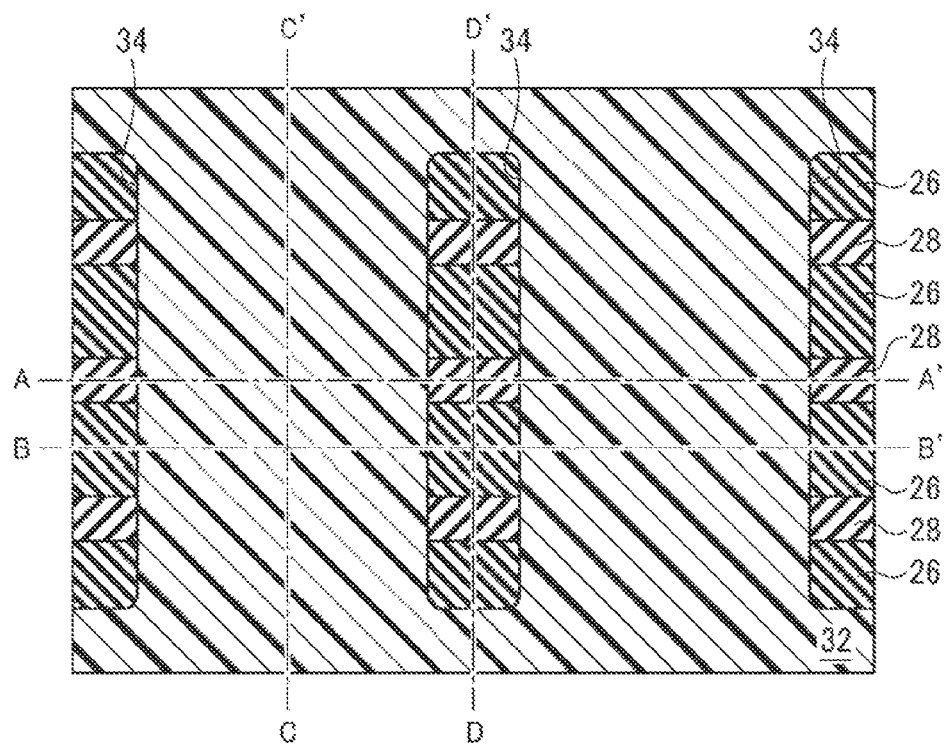
Figure 11A:
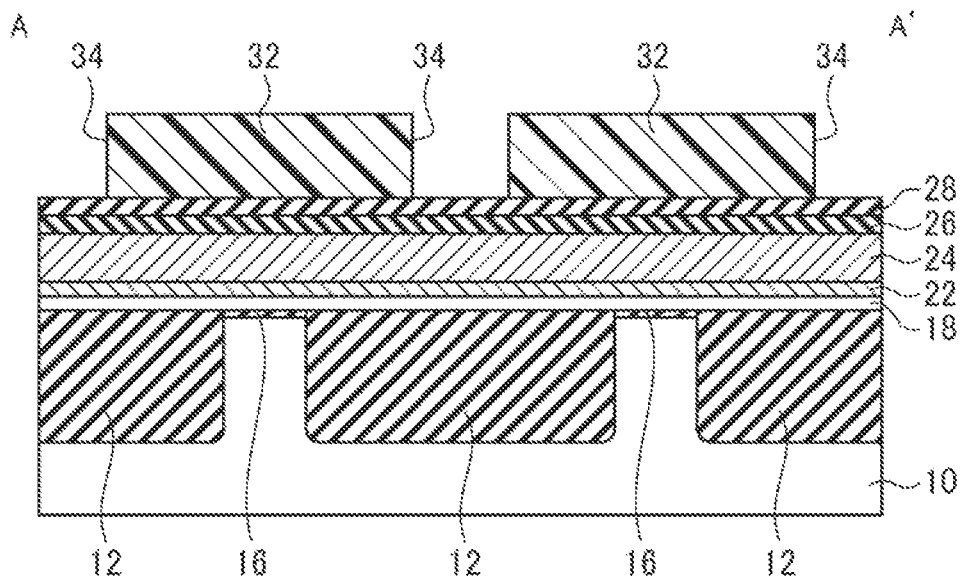
Figure 11B:
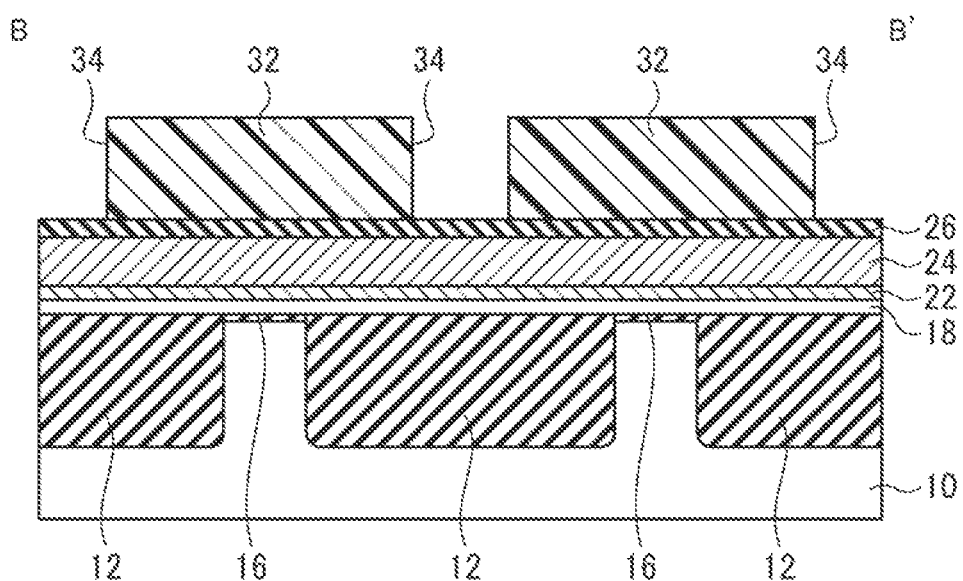
Figure 12A:
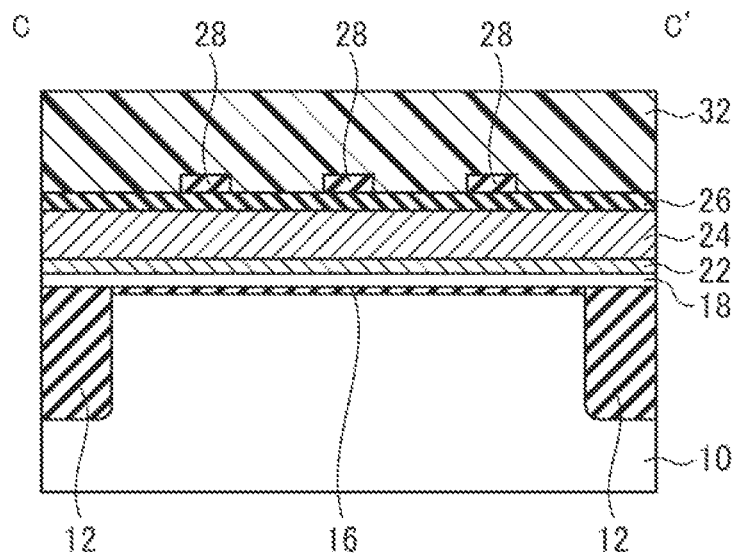
Figure 12B:
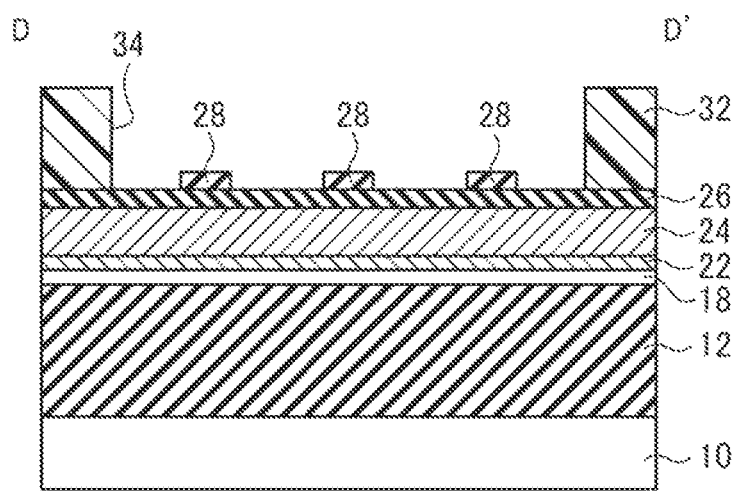

FIG. 10 is a plan view of the semiconductor device after said steps as viewed from above the surface of the semiconductor device. FIG. 11A is the A-A' line cross-sectional view of FIG. 10, and FIG. 11B is the B-B' line cross-sectional view of FIG. 10. FIG. 12A is the C-C' line cross-sectional view of FIG. 10, and FIG. 12B is the D-D' line cross-sectional view of FIG. 10.

The second mask pattern 32 is for defining the shorter sides of the gate electrodes (cutting the line patterns to a prescribed length) and has openings 34 extended in the Y direction orthogonal to the line patterns of the second hard mask 28 extended in the X direction.

Then, the second hard mask 28 is dry etched with the second mask pattern 32 as the mask to further pattern the second hard mask 28 patterned with the first mask pattern 30.

Next, the second mask pattern 32 is removed by, e.g., asking method (FIGS. 13-15B).

Figure 13:
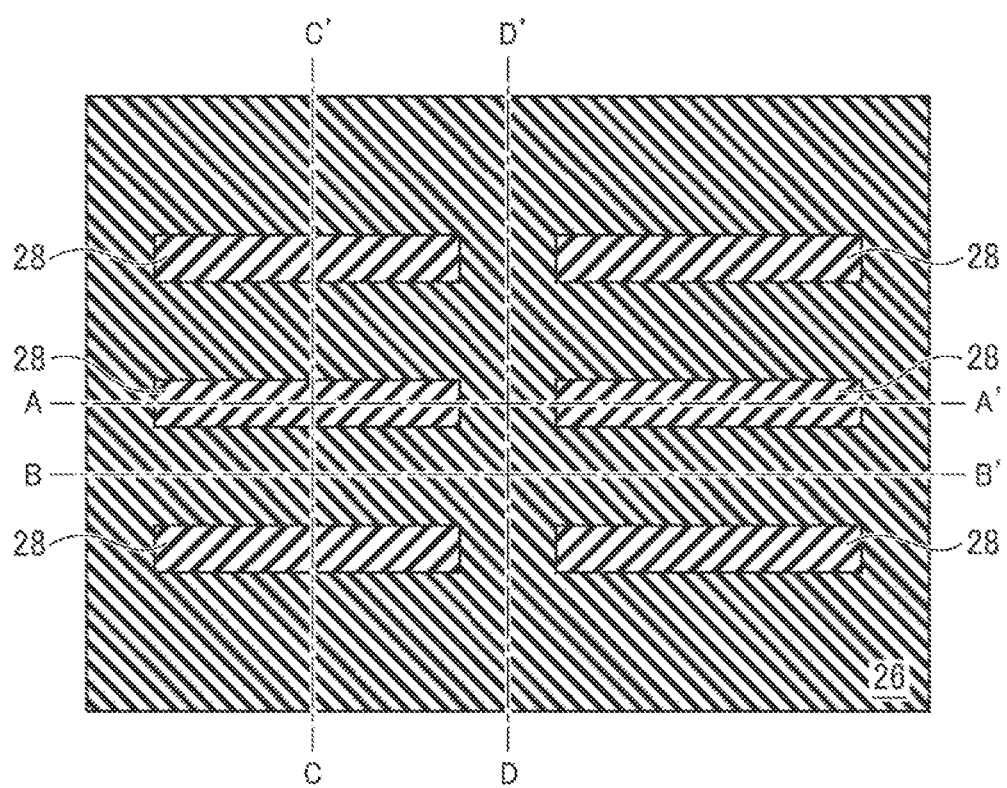
Figure 14A:
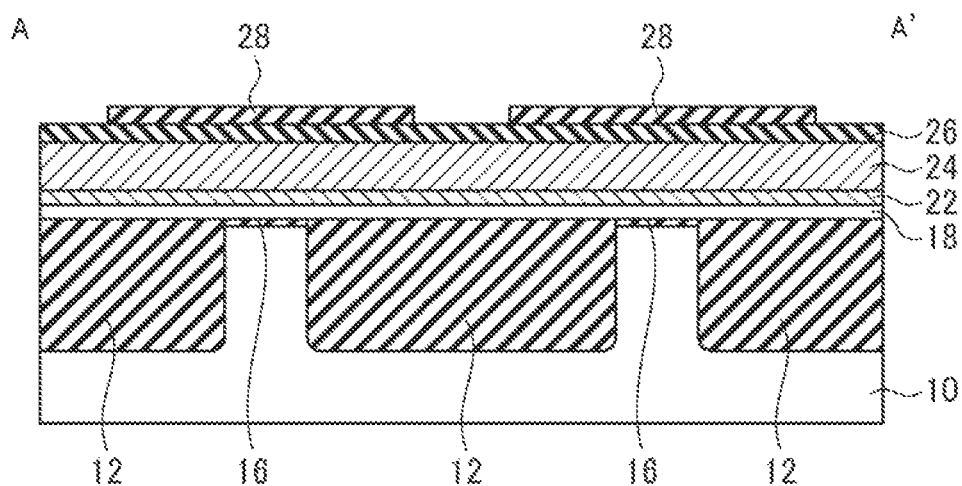
Figure 14B:
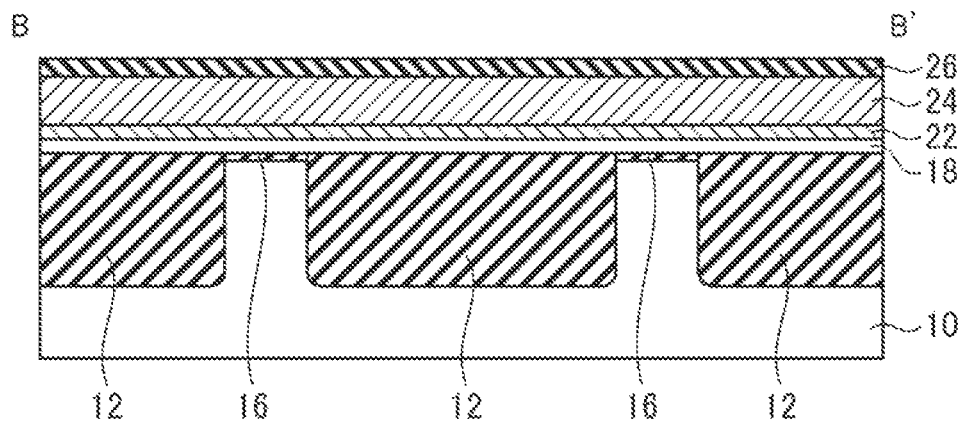
Figure 15A:
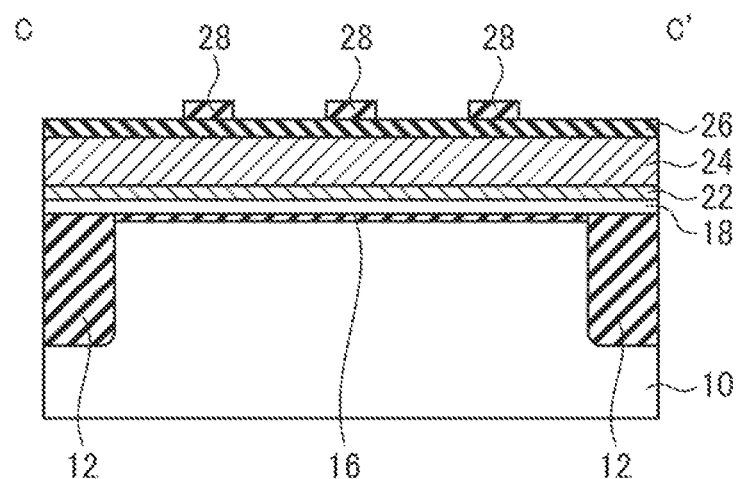
Figure 15B:
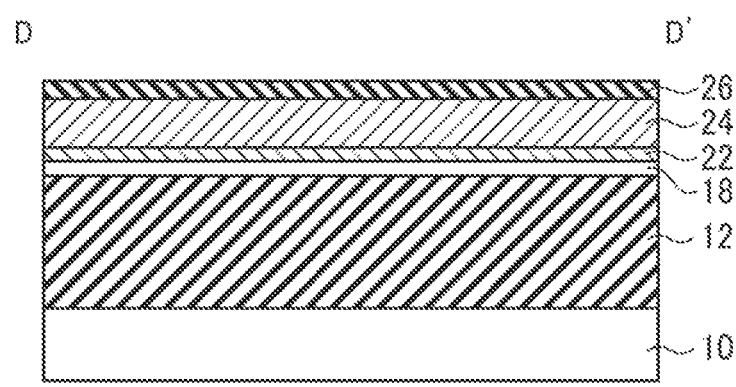

FIG. 13 is a plan view of the semiconductor device after said steps as viewed from above the surface of the semiconductor device. FIG. 14A is the A-A' line cross-sectional view of FIG. 13, and FIG. 14B is the B-B' line cross-sectional view of FIG. 13. FIG. 15A is the C-C' line cross-sectional view of FIG. 13, and FIG. 15B is the D-D' line cross-sectional view of FIG. 13.

The second hard mask 28 is patterned with the first mask pattern 30 and the second mask pattern 32 as the mask, whereby the patterns of the gate electrodes can be transferred to the second hard mask 28 without causing the rounding and the shortening of the end parts.

In the example described above, the second hard mask film 28 is patterned with the first mask pattern 30 and then patterned with the second mask pattern 32 but may be patterned with the second mask pattern 32 and then with the first mask pattern 30.

Then, the first hard mask 26, the gate film 24, the buffer layer 22 and the high dielectric constant insulating film 18 are dry etched with the second hard mask 28 as the mask.

Then, ion implantation is made with the layer structure of the patterned second hard mask 28, the first hard mask 26, the gate film 24, the buffer layer 22 and the high-dielectric constant film 18 (layer structure of gate pattern) as the mask to form an impurity layer 36 in the active regions 14 (FIGS. 16-18B). The impurity layer is to be the LDD (Lightly Doped Drain) or the extension regions of the transistors. Ion implantation, such as pocket implantation, hollow implantation or others, may be further made.

Figure 16:
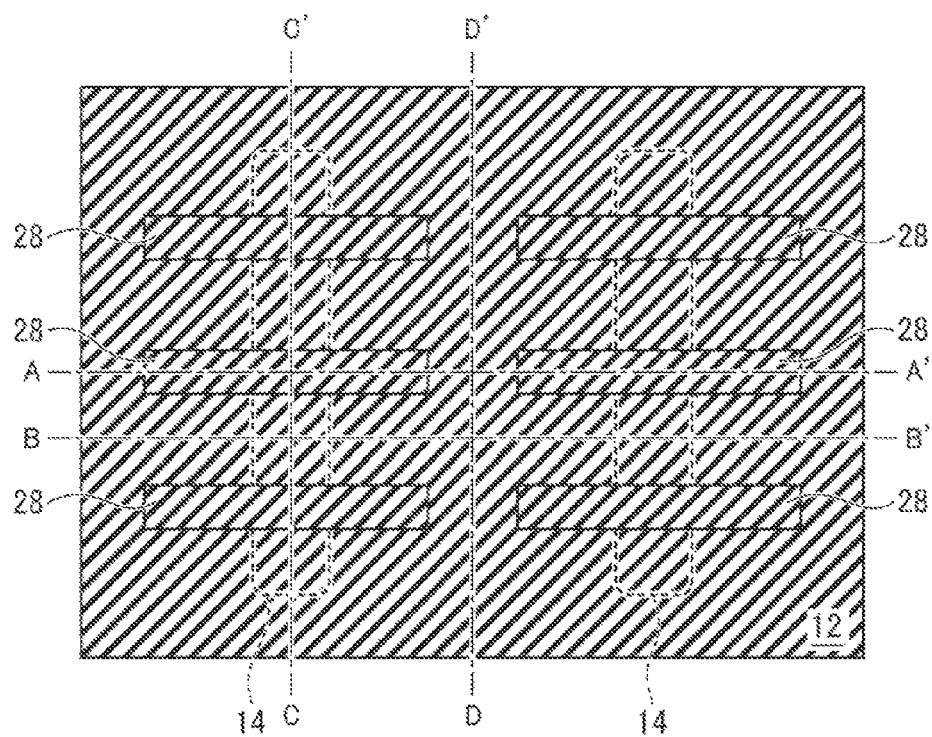
Figure 17A:
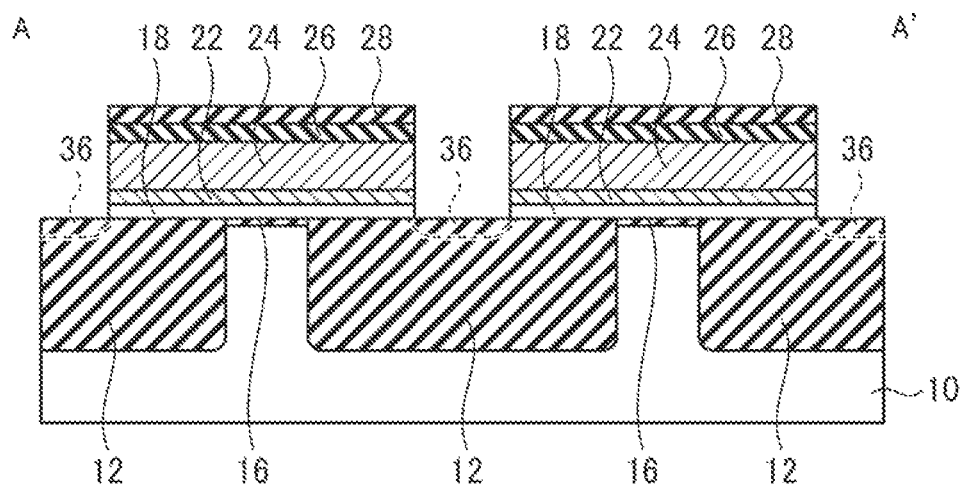
Figure 17B:
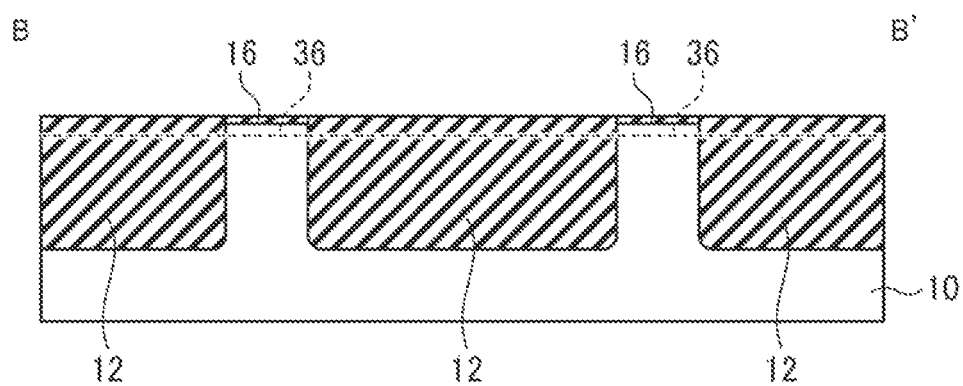
Figure 18A:
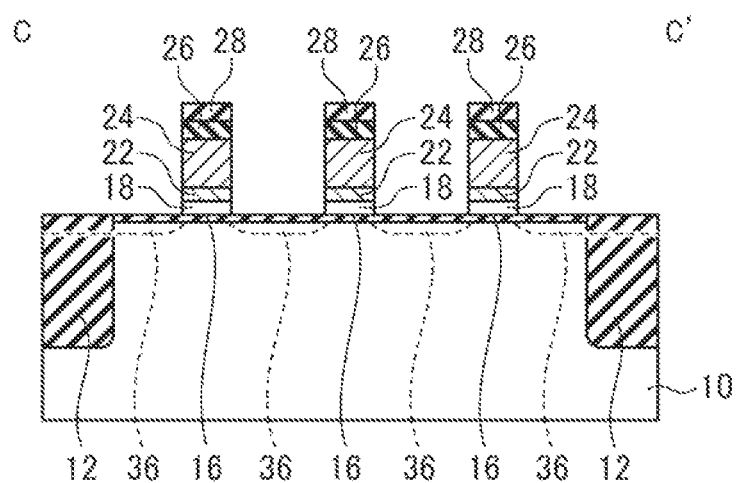
Figure 18B:
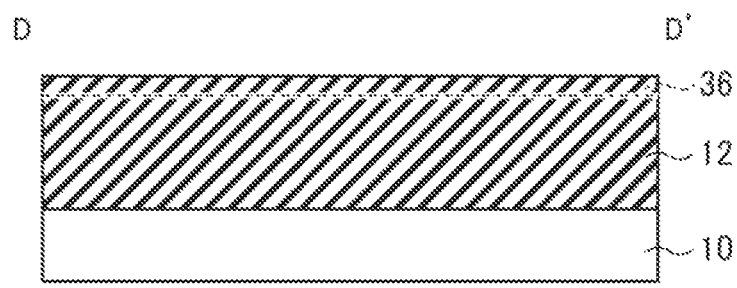

FIG. 16 is a plan view of the semiconductor device after said steps as viewed from above the surface of the semiconductor device. FIG. 17A is the A-A' line cross-sectional view of FIG. 16, and FIG. 17B is the B-B' line cross-sectional view of FIG. 16. FIG. 18A is the C-C' line cross-sectional view of FIG. 16, and FIG. 18B is the D-D' line cross-sectional view of FIG. 16.

FIGS. 17A, 17B, 18A and 18B schematically illustrate that the impurity for forming the impurity layer 36 has been implanted not only into the silicon substrate 10 in the active regions 14 but also into the device isolation insulating film 12. Although not illustrated, in the ion implantation for forming the impurity layer 36, the impurity is implanted also into the gate film 24.

Then, a silicon nitride film is deposited above the entire surface by, e.g., CVD method to form a spacer insulating film 38 of the silicon nitride film. The spacer insulating film 38 may be formed of, in place of the silicon nitride film, a silicon oxide film or others, or a high dielectric constant insulating film, such as $HfO_2$, HfSiO, HfAlON, $Y_2O_3$, ZrO, TiO, TaO or others.

Next, a photoresist film and an anti-reflection film are formed above the spacer insulating film 38, and then the photoresist film is patterned by photolithography to form the third mask pattern 40 having the negative-positive inverted pattern of the second mask pattern 32 (FIGS. 19-21B).

The third mask pattern 40 has a pattern which covers the end parts of the layer structure of the gate pattern, at least the corners of the shorter sides of the layer structure of the gate pattern. This permits the third mask pattern 40 of the inverted pattern of the second mask pattern 32 to be suitably used. The third mask pattern 40 being the inverted pattern of the second mask pattern 32 has the effect of decreasing the design steps for forming data of the third mask pattern 40. It is possible to use the same reticle in forming the second mask pattern and the third mask pattern and respectively use the positive resist and the negative resist.

Figure 19:
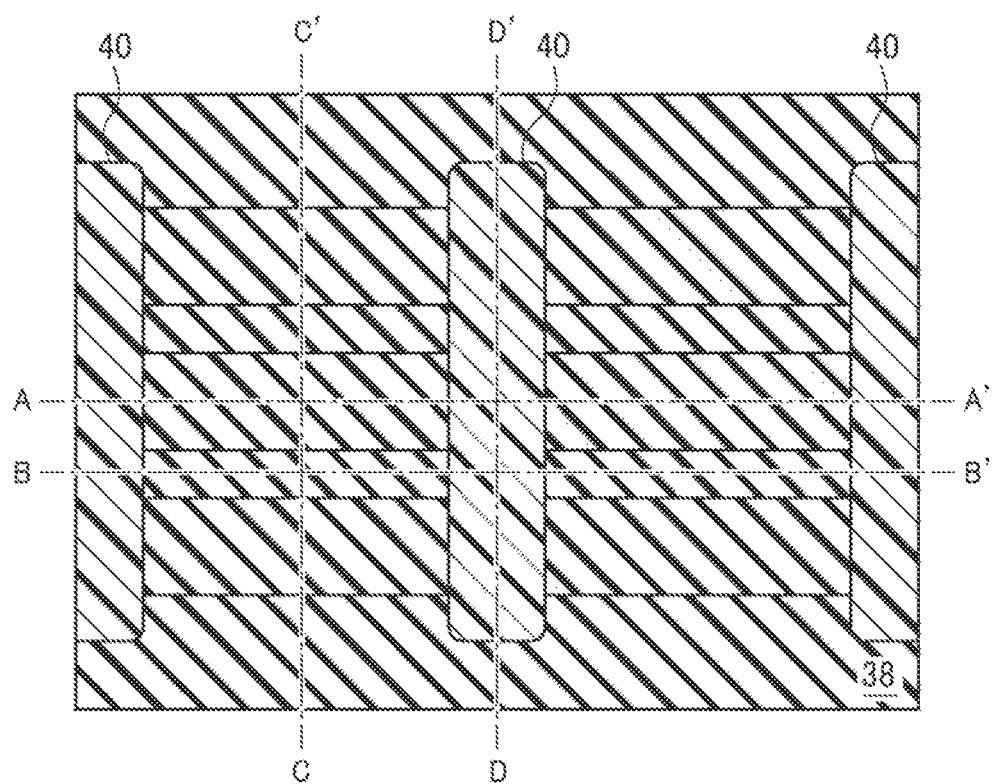
Figure 20A:
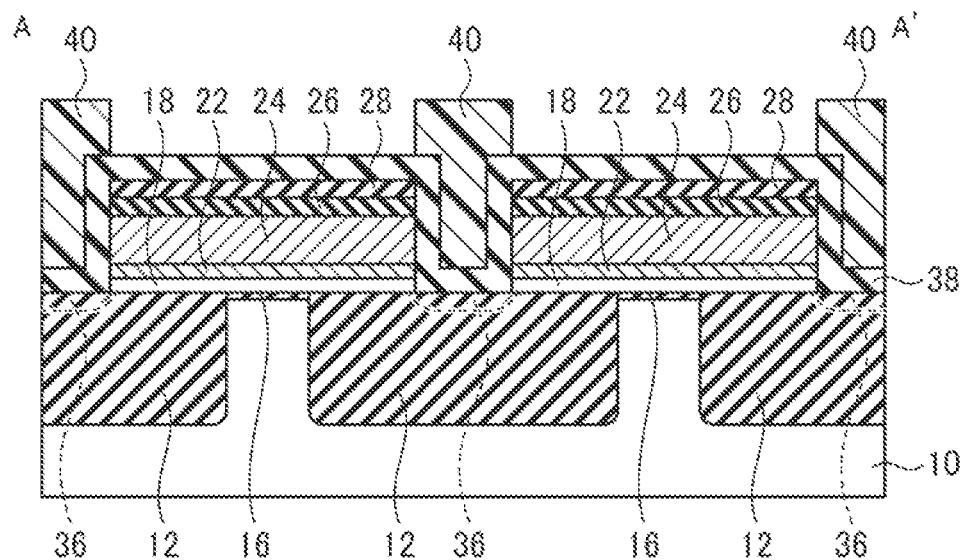
Figure 20B:
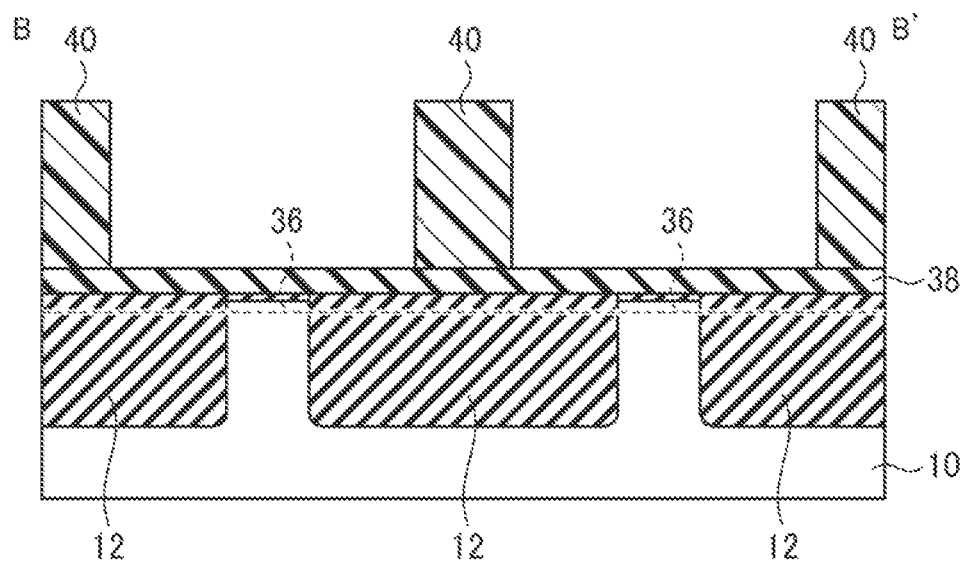
Figure 21A:
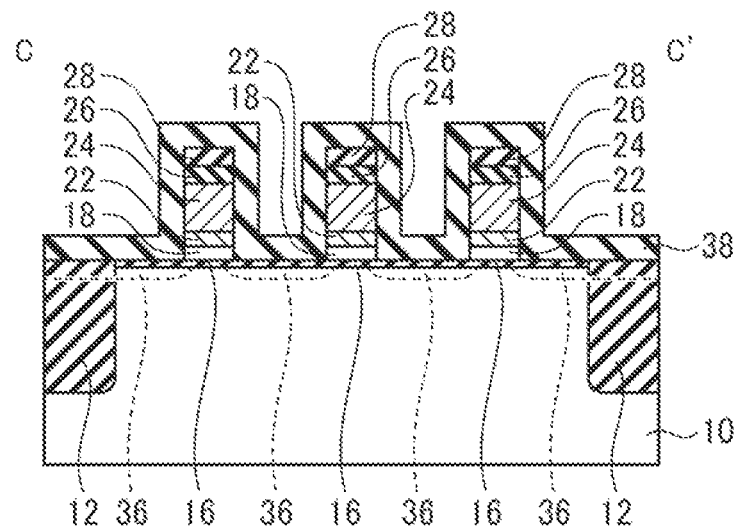
Figure 21B:
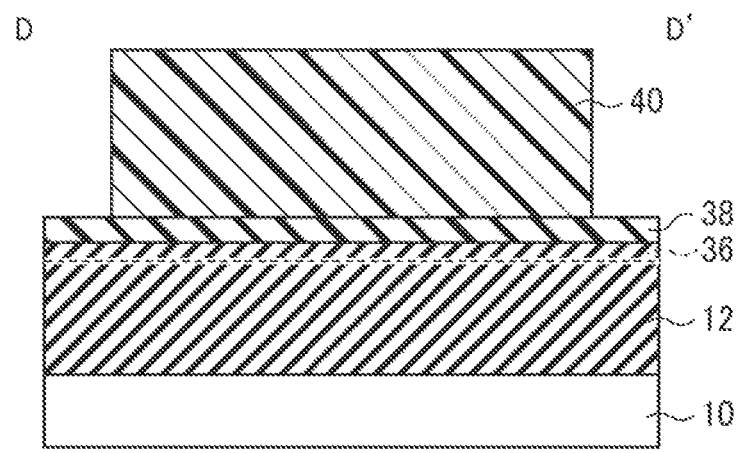

FIG. 19 is a plan view of the semiconductor device after said steps as viewed from above the surface of the semiconductor device. FIG. 20A is the A-A' line cross-sectional view of FIG. 19, and FIG. 20B is the B-B' line cross-sectional view of FIG. 19. FIG. 21A is the C-C' line cross-sectional view of FIG. 19, and FIG. 21B is the D-D' line cross-sectional view of FIG. 19.

Then, the spacer insulating film 38 is dry etched with the third mask pattern 40 as the mask (FIGS. 22-24B).

Figure 22:
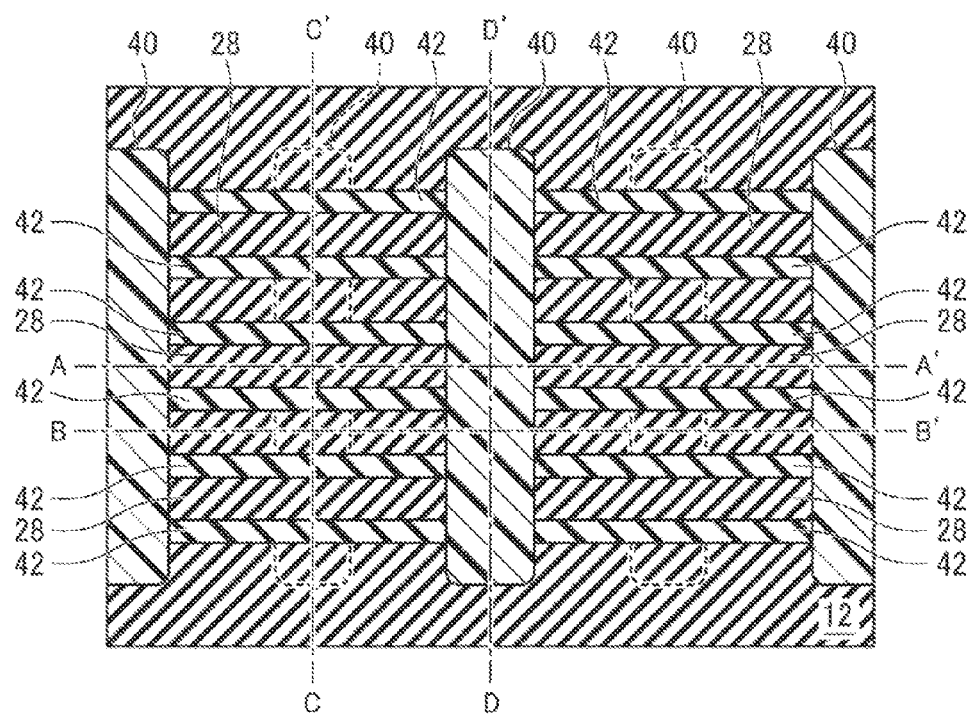
Figure 23A:
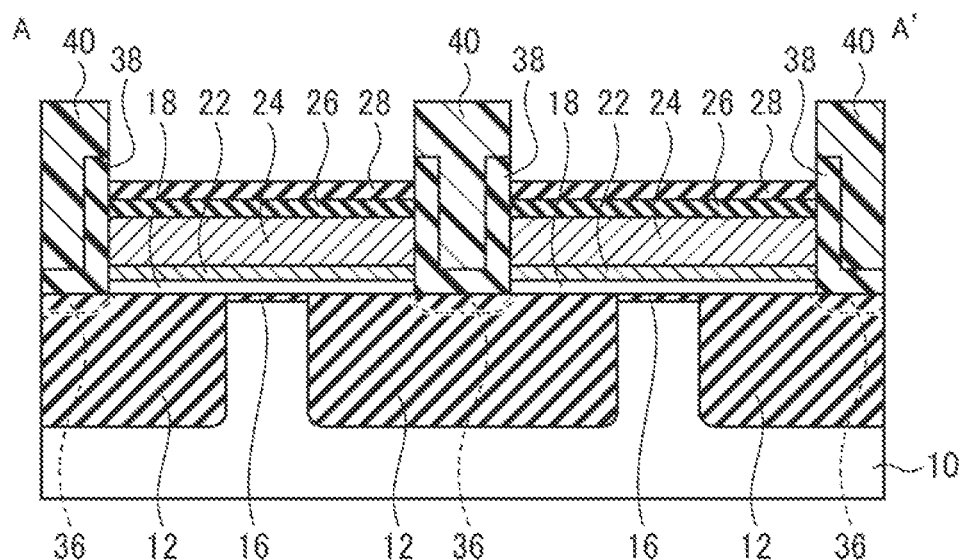
Figure 23B:
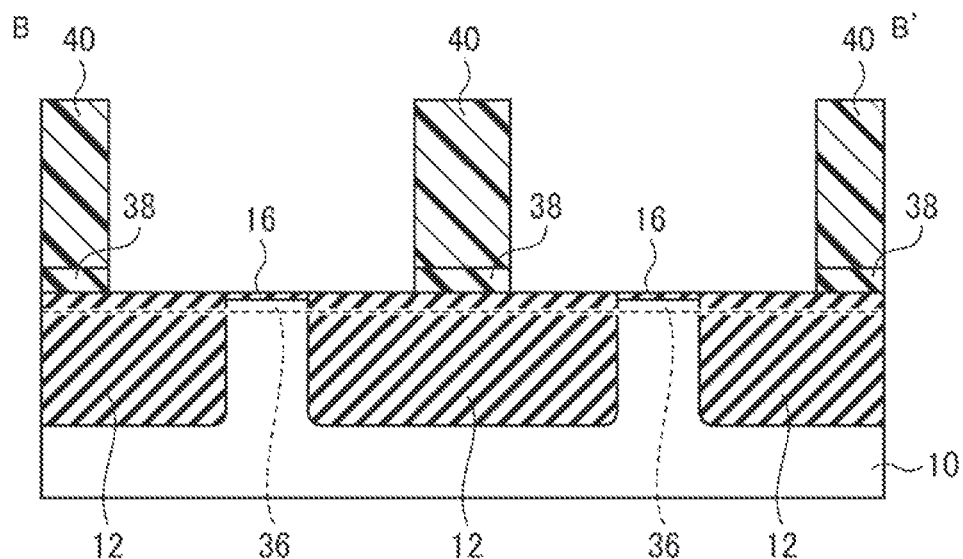
Figure 24A:
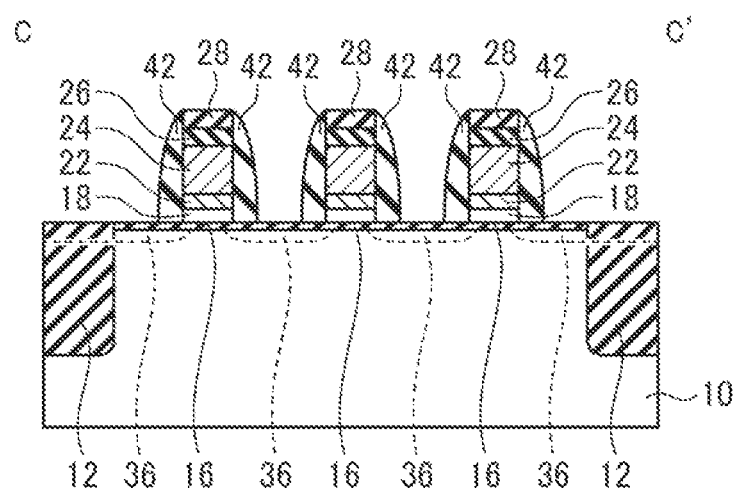
Figure 24B:
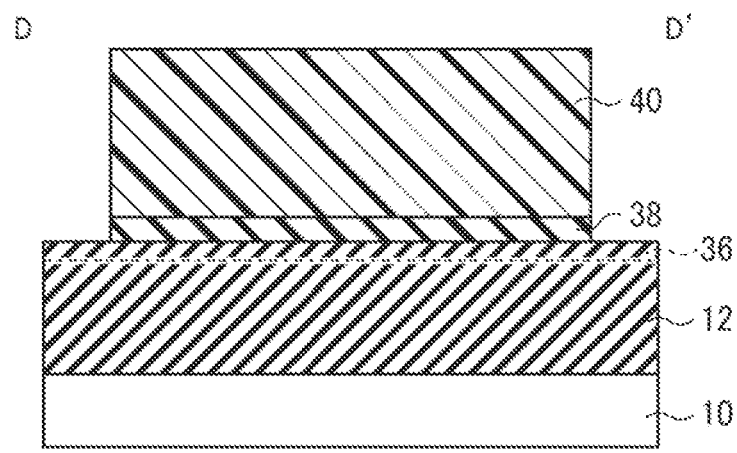

FIG. 22 is a plan view of the semiconductor device after said steps as viewed from above the surface of the semiconductor device. FIG. 23A is the A-A' line cross-sectional view of FIG. 22, and FIG. 23B is the B-B' line cross-sectional view of FIG. 22. FIG. 24A is the C-C' line cross-sectional view of FIG. 22, and FIG. 24B is the D-D' line cross-sectional view of FIG. 22.

The spacer insulating film 38 is etched with the third mask pattern 40 as the mask, whereby a sidewall insulating film 42 is formed on the longer side walls of the layer structure of the gate pattern. The spacer insulating film 38 remains in the region between the layer structures of the gate patterns which are covered by the third mask pattern 40.

Next, the third mask pattern 40 is removed by, e.g., asking method.

Then, ion implantation is made with the layer structure of the gate pattern, the spacer insulating film and the sidewall insulating film 42 as the mask, impurity layers 44 to be the source/drain regions are formed in the active regions 14 (FIGS. 25-27B).

Figure 25:
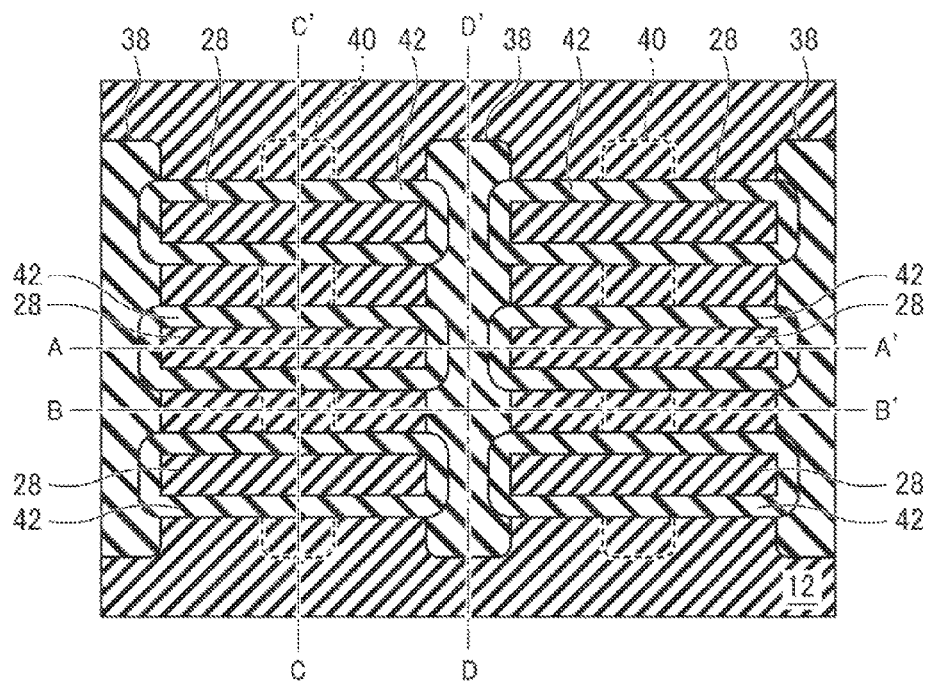
Figure 26A:
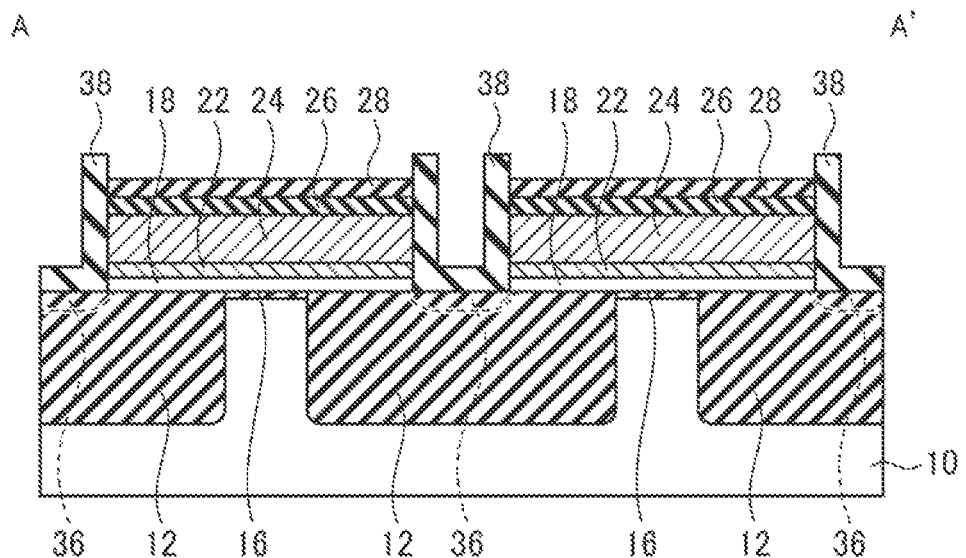
Figure 26B:
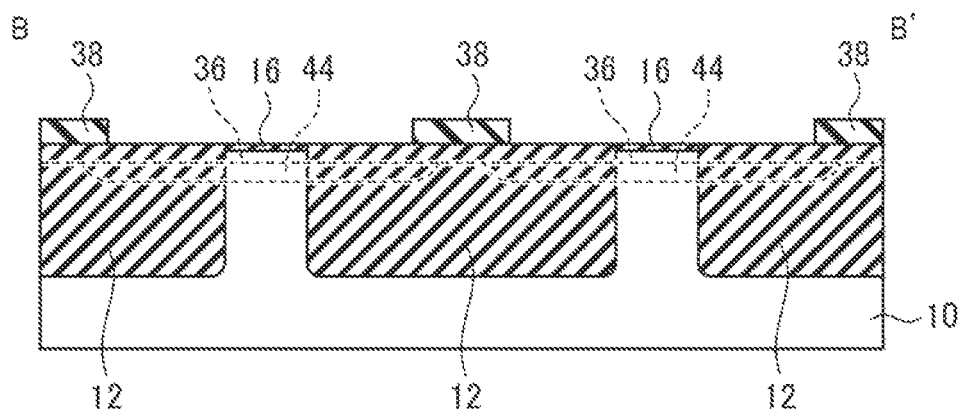
Figure 27A:
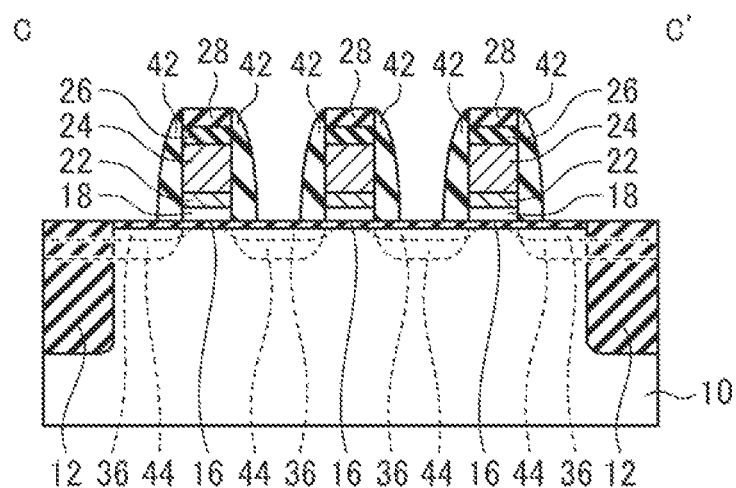
Figure 27B:
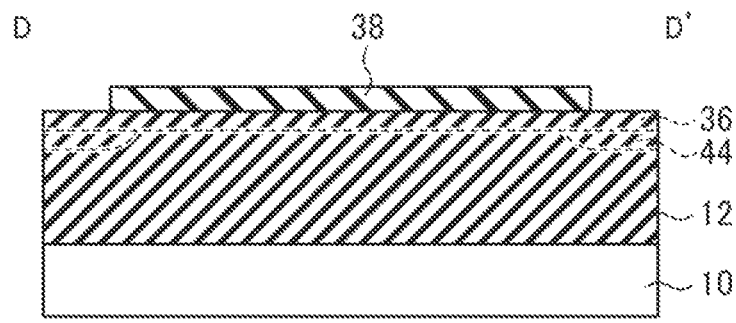

FIG. 25 is a plan view of the semiconductor device after said steps as viewed from above the surface of the semiconductor device. FIG. 26A is the A-A' line cross-sectional view of FIG. 25, and FIG. 26B is the B-B' line cross-sectional view of FIG. 25. FIG. 27A is the C-C' line cross-sectional view of FIG. 25, and FIG. 27B is the D-D' line cross-sectional view of FIG. 25.

FIGS. 26A, 26B, 27A and 27B schematically show that the impurity for forming the impurity layers 44 have been implanted also into the device isolation insulating film 12. In the ion implantation for forming the impurity layers 44, the impurity is also implanted into the gate film 24 although not illustrated.

Then, as the preprocessing for forming a silicide layer above the surfaces of the active regions 14, the silicon oxide film 16 above the surfaces of the active regions 14 is removed. To remove the silicon oxide film 16, wet etching with hydrofluoric acid aqueous solution or dry etching may be applied. When the silicon oxide film 16 is removed, the second hard mask 28 and the device isolation insulating film 12 of silicon oxide film are also etched (FIGS. 28-30B).

Figure 28:
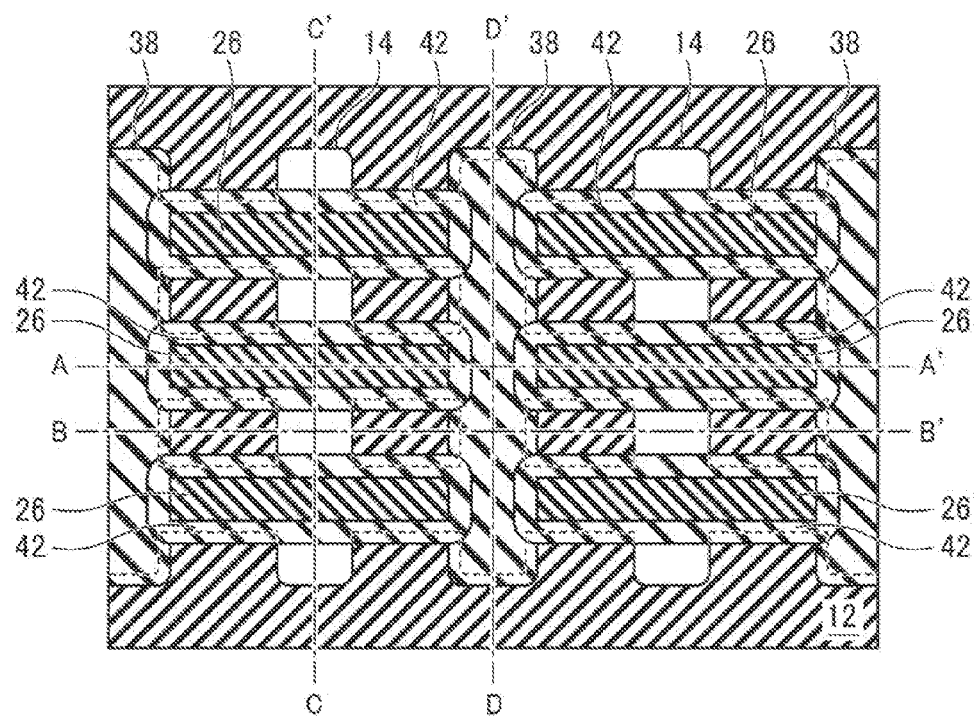
Figure 29A:
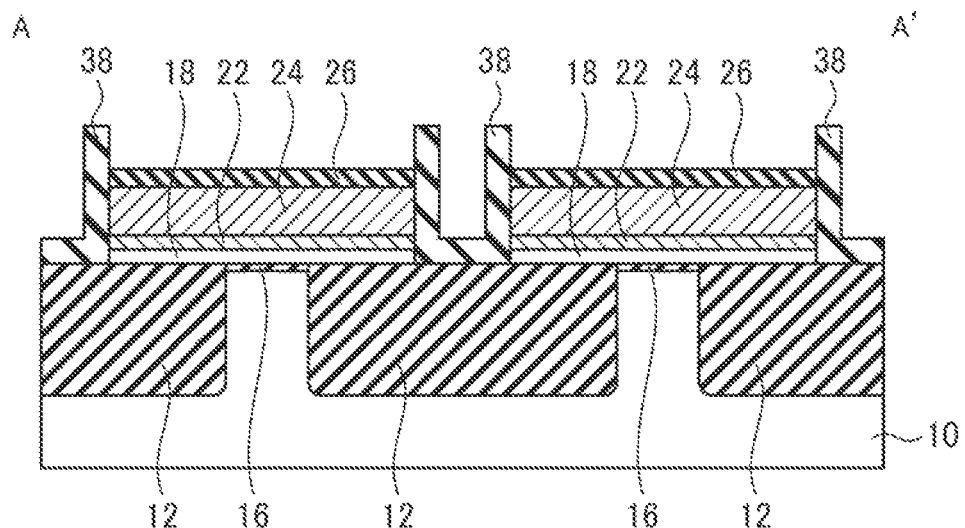
Figure 29B:
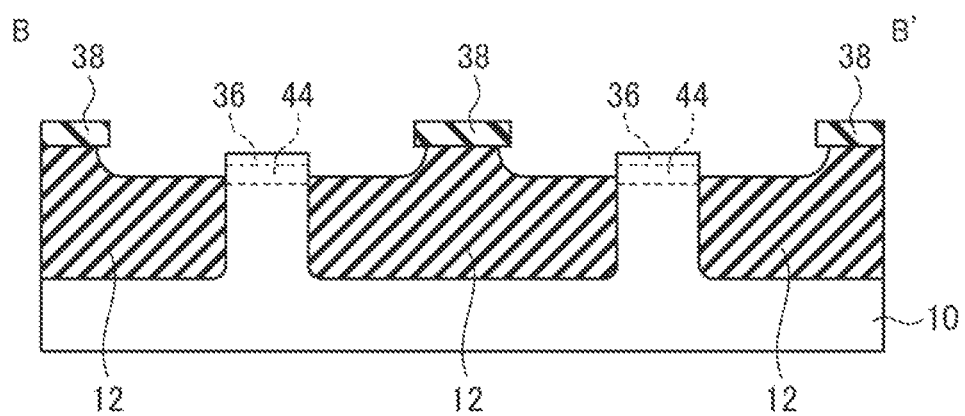
Figure 30A:
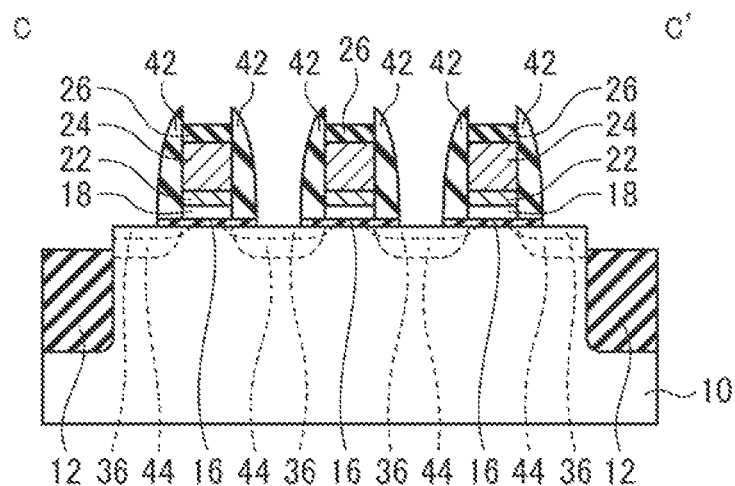
Figure 30B:
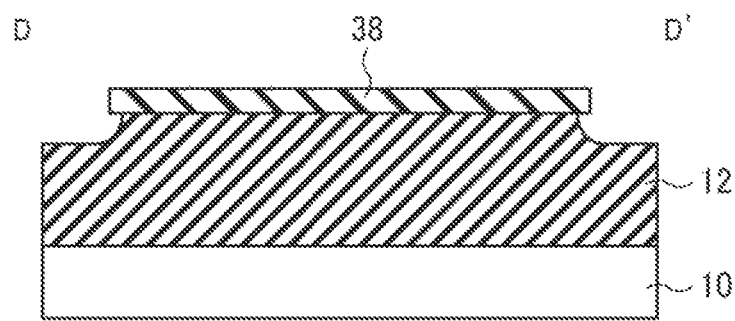

FIG. 28 is a plan view of the semiconductor device after said steps as viewed from above the surface of the semiconductor device. FIG. 29A is the A-A' line cross-sectional view of FIG. 28, and FIG. 29B is the B-B' line cross-sectional view of FIG. 28. FIG. 30A is the C-C' line cross-sectional view of FIG. 28, and FIG. 30B is the D-D' line cross-sectional view of FIG. 28.

The silicon oxide film formed by CVD method, such as the silicon oxide film forming the device isolation insulating film 12 has a higher etching rate in comparison with the silicon oxide film formed by thermal oxidation. The etching rate of the silicon oxide film with the impurity implanted, such as the surface regions of the device isolation insulating film 12 with the impurities for the impurity layers 36, 44 implanted also has a higher etching rate. Accordingly, when the silicon oxide film 16 is etched, the amount of the device isolation insulating film to be etched is larger in comparison with the film thickness of the silicon oxide film 16.

When the silicon oxide film 16 is removed with the etching which isotropically advances, the etching of the device isolation insulating film 12 advances into below the spacer insulating film 38 (refer to FIGS. 29B and 30B). In FIG. 28, the edges of the device isolation insulating film 12 which is below the spacer insulating film 28 are illustrated by the dotted lines. Thus, when the spacer insulating film 38 is thinned at the corners of the gate patterns as will be described later in Reference Embodiment 2, the edges of the device isolation insulating film 12 reach the regions below the gate insulating film 20, and there is a risk that the gate insulating film will be corroded.

Regarding this point, in the method of manufacturing the semiconductor device according to the present embodiment, with the spacer insulating film 38 remaining in the regions between the shorter sides of the layer structures of the gate patterns, the edges of the device isolation insulating film 12 never reach layer structures of the gate patterns. Thus, the corrosion of the high dielectric constant insulating film 18 can be prevented.

Next, silicide layers 46 are formed above the exposed silicon surfaces by the so-called self-aligned silicide (salicide) process (FIGS. 31-33B). For example, a metal film of, e.g., Ni, Co, Ti or others is deposited above the entire surface by sputtering method or others, thermal processing is made to form silicide layers 46 of, NiSi, CoSi, TiSi or others selectively above the exposed silicon surfaces, and the non-reacted metal film is removed.

Because of the first hard mask 26 formed above the gate film 24, the salicide layer 46 is not formed above the gate patterns.

Figure 31:
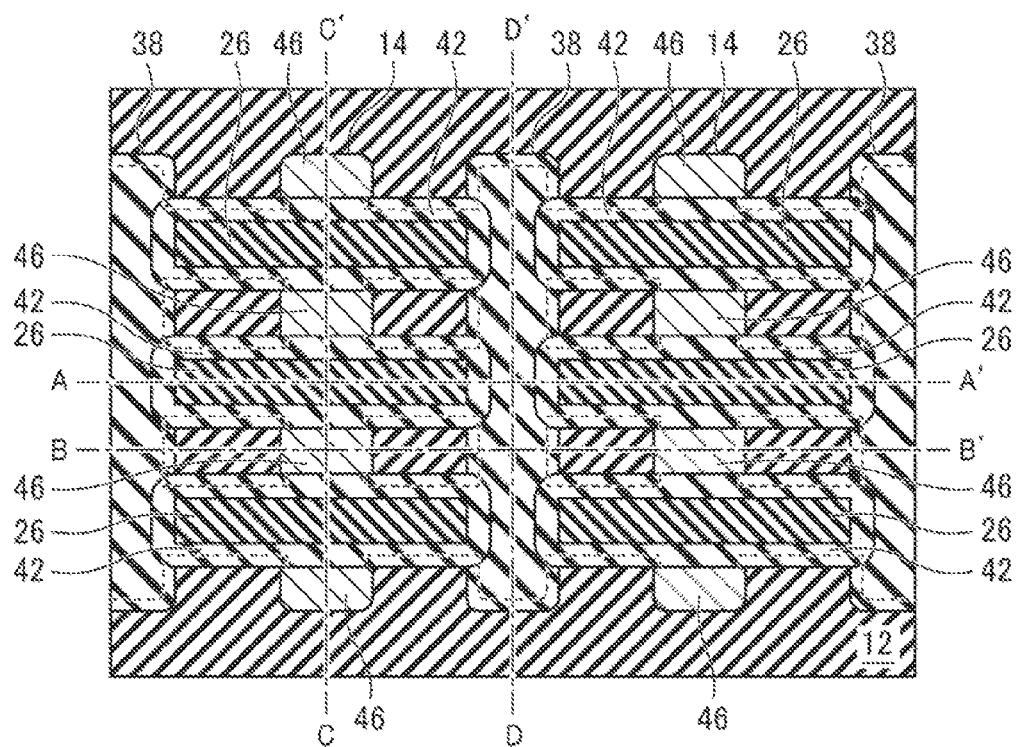
Figure 32A:
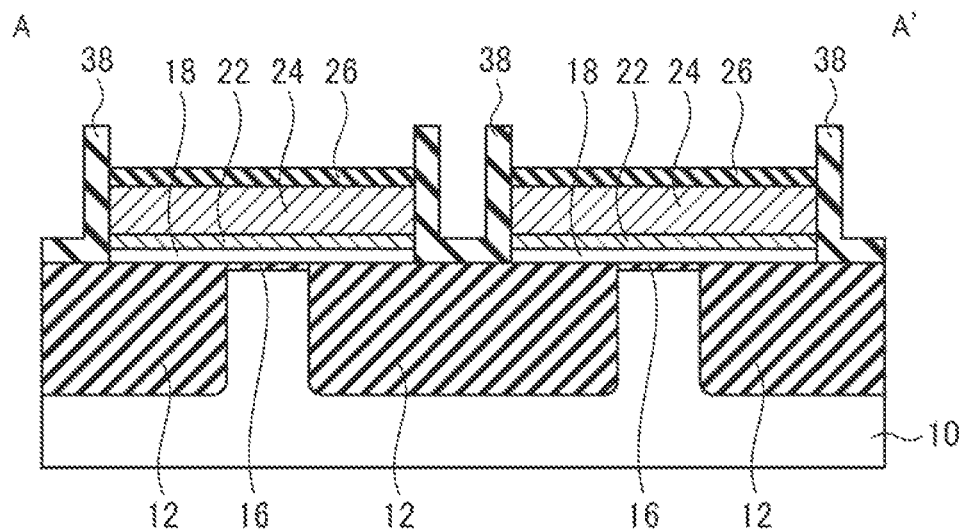
Figure 32B:
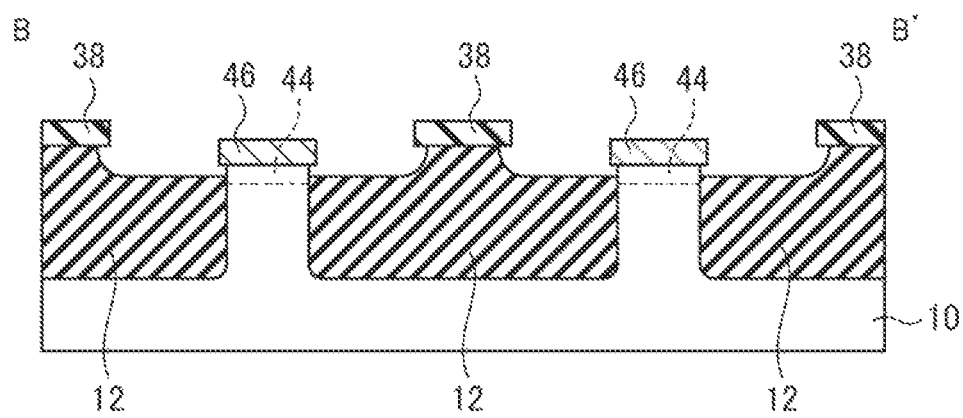
Figure 33A:
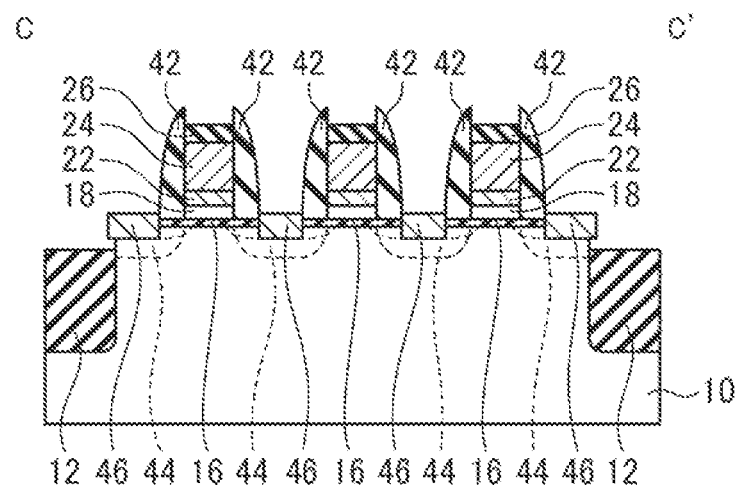
Figure 33B:
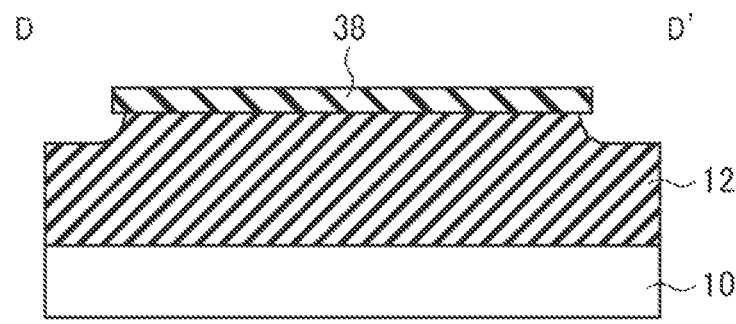

FIG. 31 is a plan view of the semiconductor device after said steps as viewed from above the surface of the semiconductor device. FIG. 32A is the A-A' line cross-sectional view of FIG. 31, and FIG. 32B is the B-B' line cross-sectional view of FIG. 31. FIG. 33A is the C-C' line cross-sectional view of FIG. 31, and FIG. 33B is the D-D' line cross-sectional view of FIG. 31.

Then, an insulating film of, e.g., silicon oxide film, TEOS oxide film, USG (Undoped Silicate Glass) film, BPSG (Boro-Phospho-Silicate Glass) film, SiOC film, porous low-k film or others is deposited by CVD method or spin coating method to form an inter-layer insulating film 48 (FIGS. 34-36B). As the base of the inter-layer insulating film 48, an etching stopper film (CESL: Contact Etch Stop Layer) of silicon nitride film or others may be provided.

Figure 34:
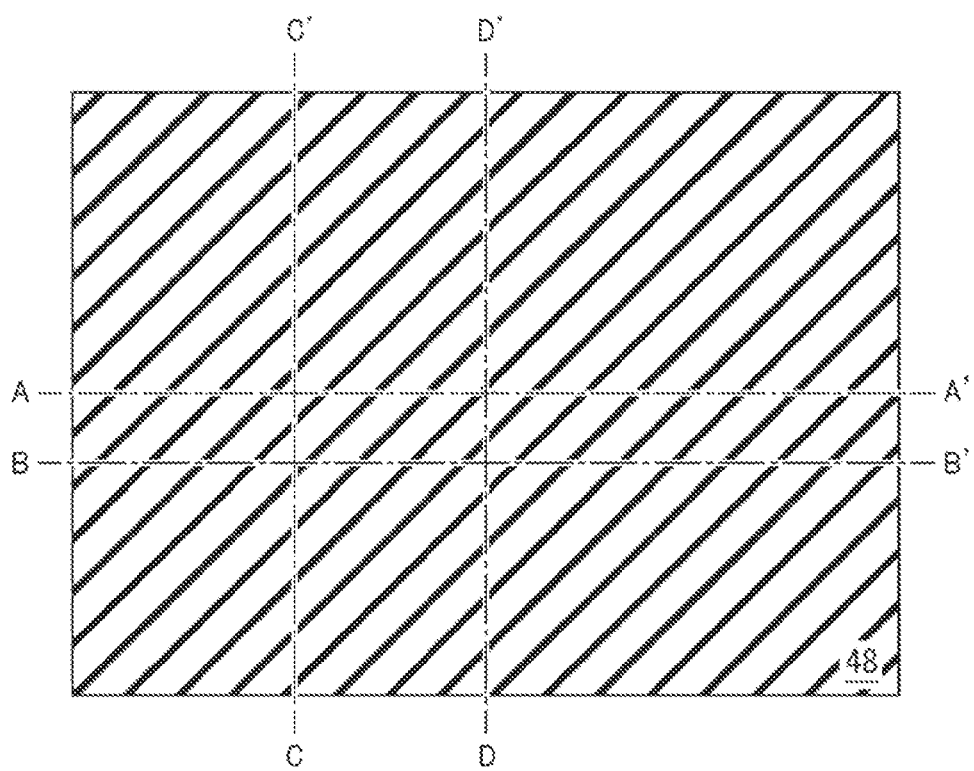
Figure 35A:
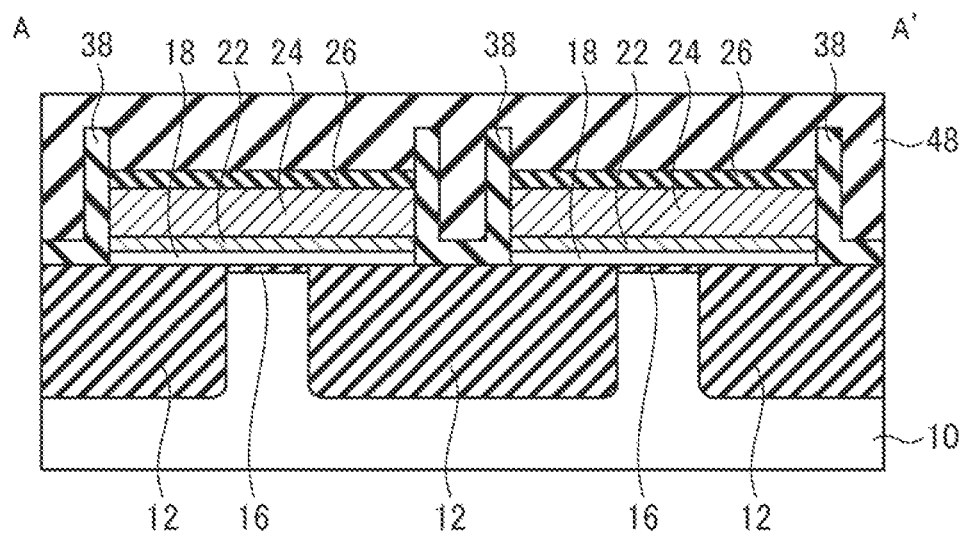
Figure 35B:
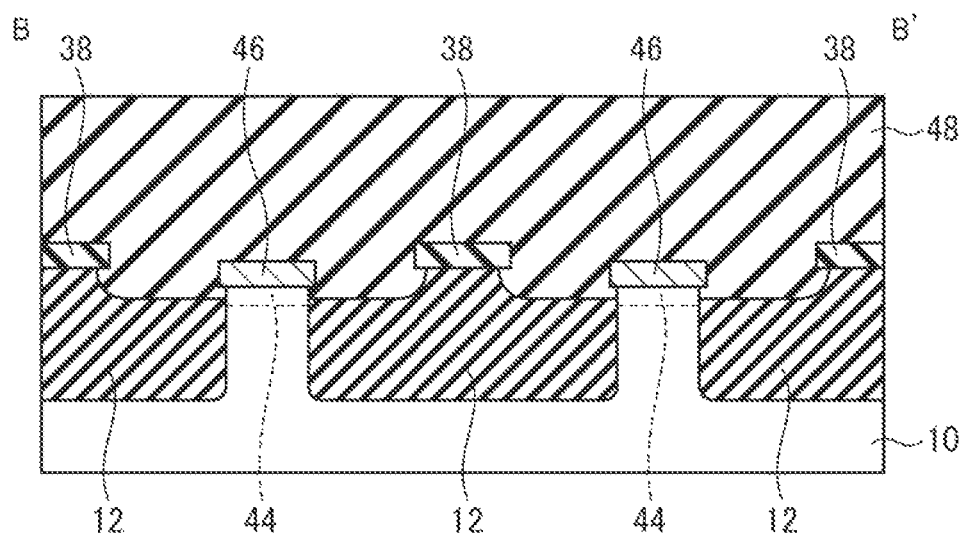
Figure 36A:
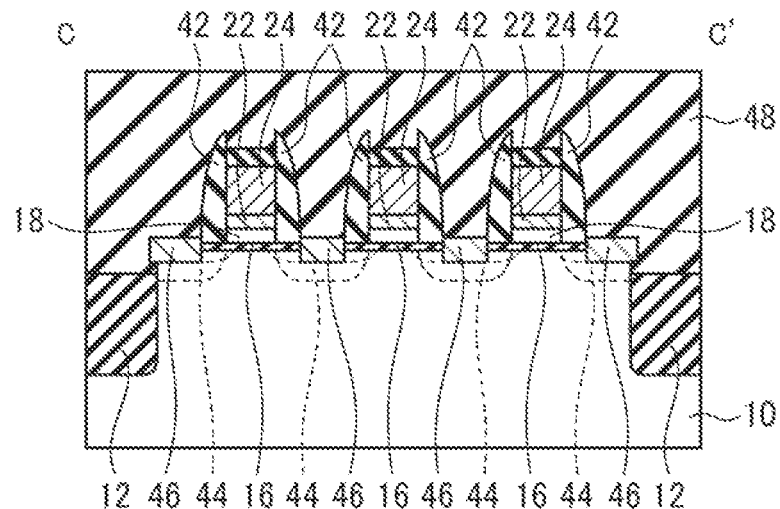
Figure 36B:
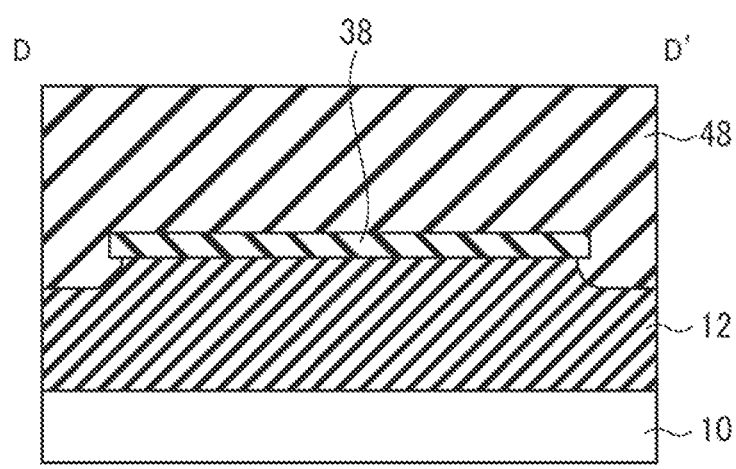

FIG. 34 is a plan view of the semiconductor device after said steps as viewed from above the surface of the semiconductor device. FIG. 35A is the A-A' line cross-sectional view of FIG. 34, and FIG. 35B is the B-B' line cross-sectional view of FIG. 34. FIG. 36A is the C-C' line cross-sectional view of FIG. 34, and FIG. 36B is the D-D' line cross-sectional view of FIG. 34.

Next, the inter-layer insulating film 48, the spacer insulating film 38 and the first hard mask 26 are polished by CMP (Chemical Mechanical Polishing) method to planarize the surface (FIGS. 37-39B).

Figure 37:
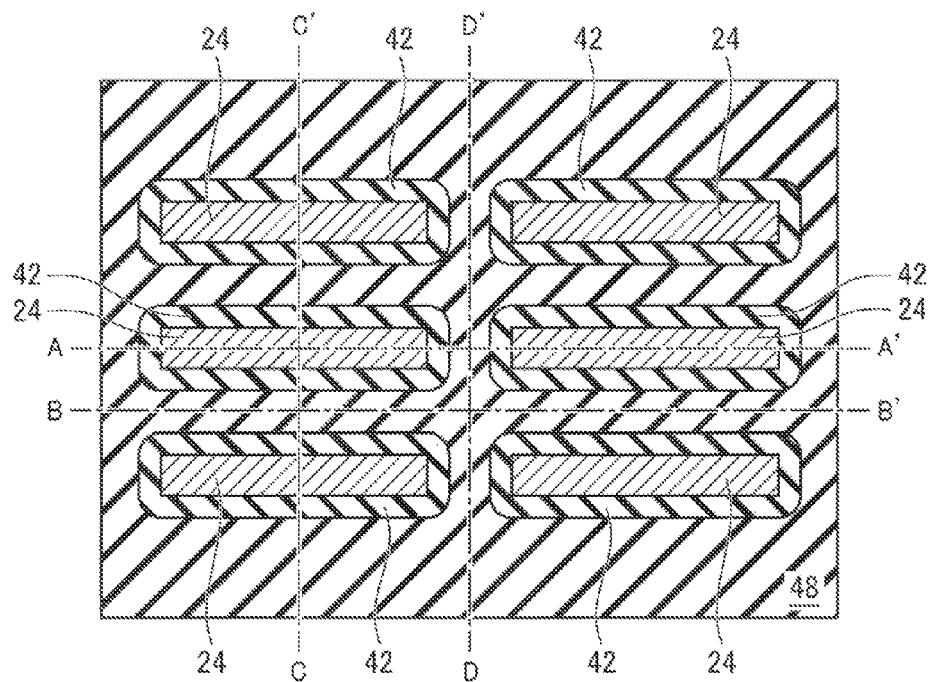
Figure 38A:
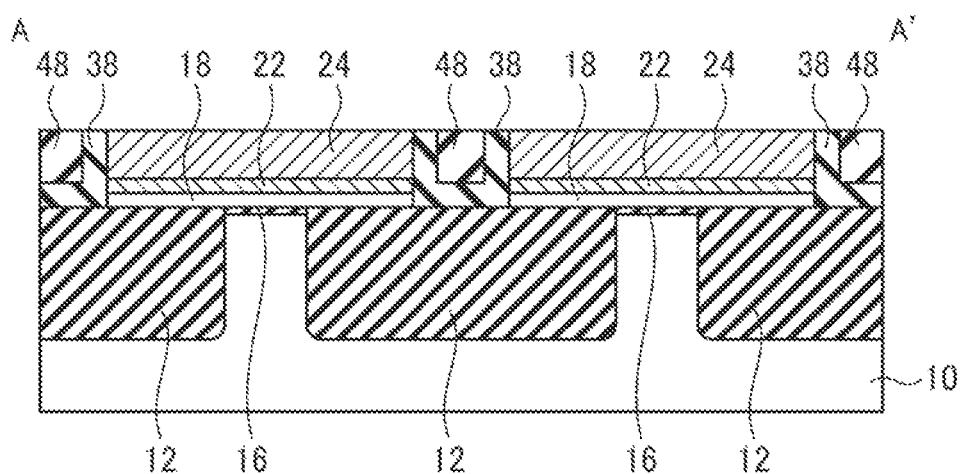
Figure 38B:
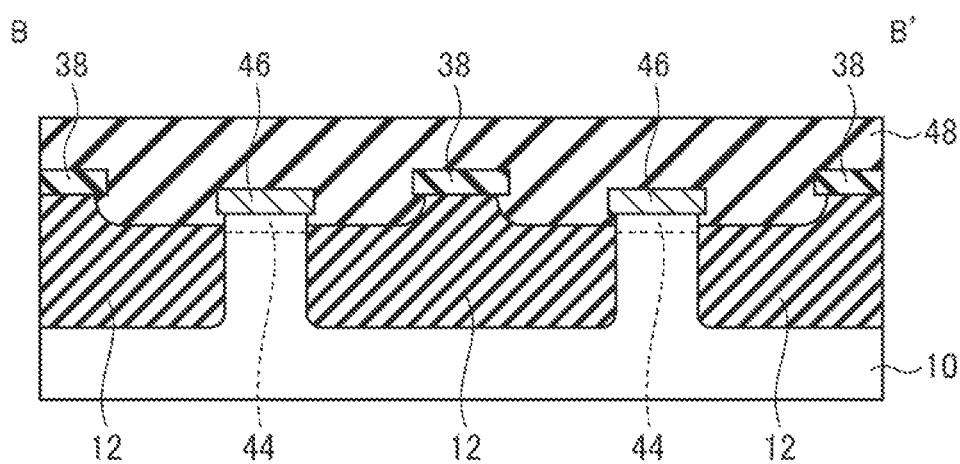
Figure 39A:
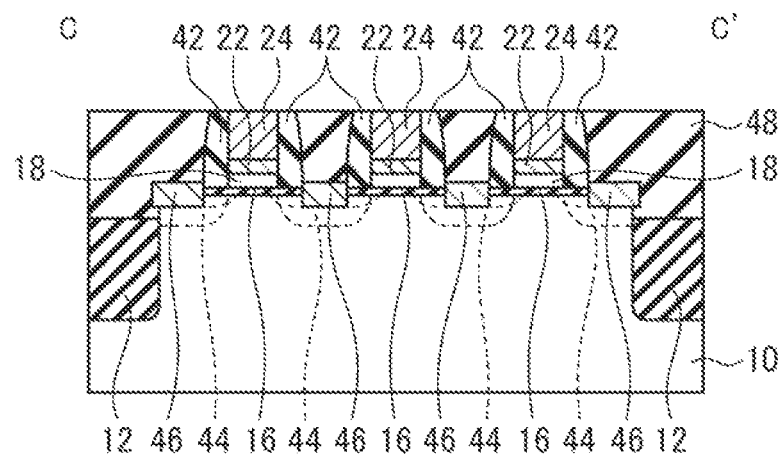
Figure 39B:
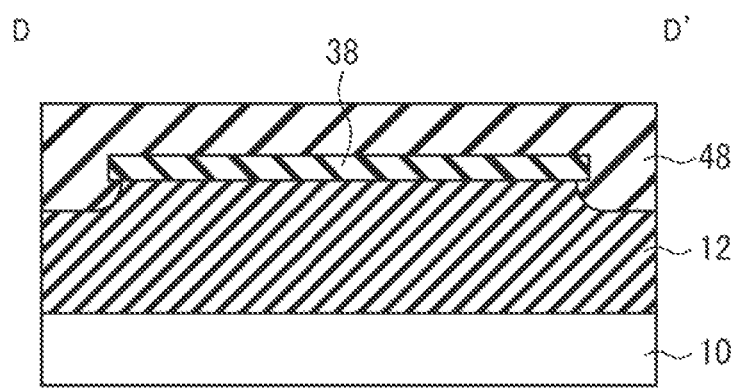

FIG. 37 is a plan view of the semiconductor device after said steps as viewed from above the surface of the semiconductor device. FIG. 38A is the A-A' line cross-sectional view of FIG. 37, and FIG. 38B is the B-B' line cross-sectional view of FIG. 37. FIG. 39A is the C-C' line cross-sectional view of FIG. 37, and FIG. 39B is the D-D' line cross-sectional view of FIG. 37.

Next, the gate film 24 is selectively removed by, e.g., dry etching (FIGS. 40-42B). At this time, the buffer layer 22 as the base of the gate film 24 prevents the high dielectric constant insulating film 18 from being damaged by the etching.

Figure 40:
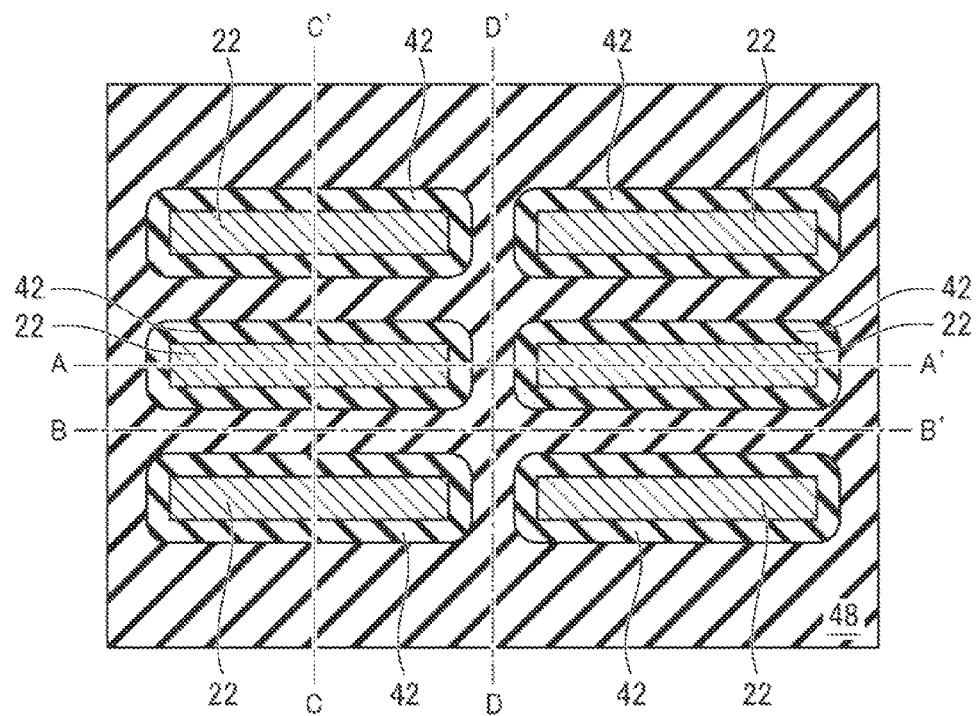
Figure 41A:
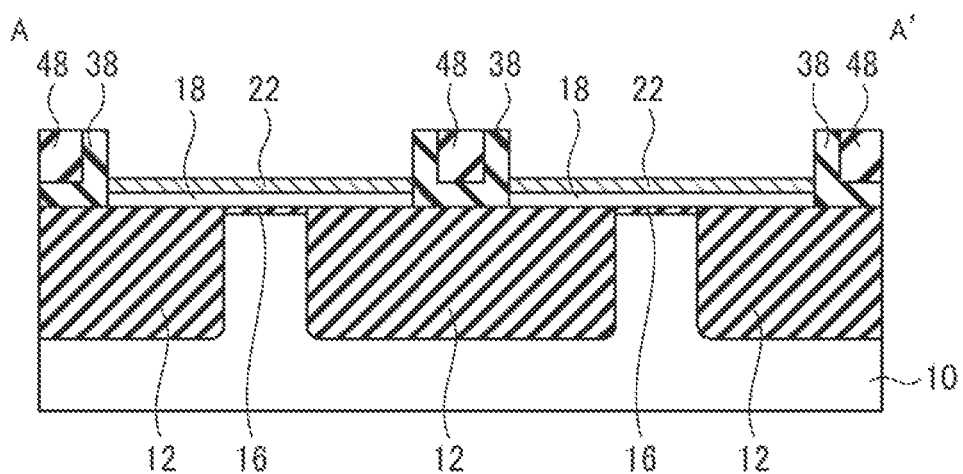
Figure 41B:
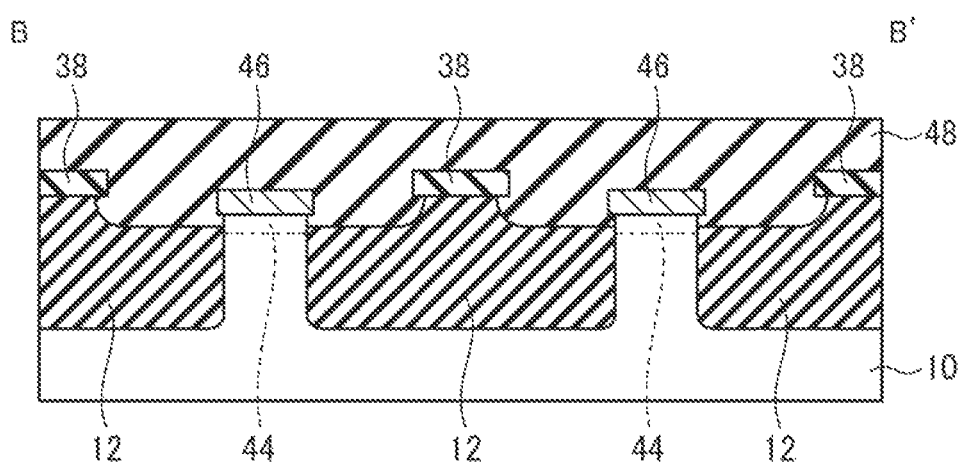
Figure 42A:
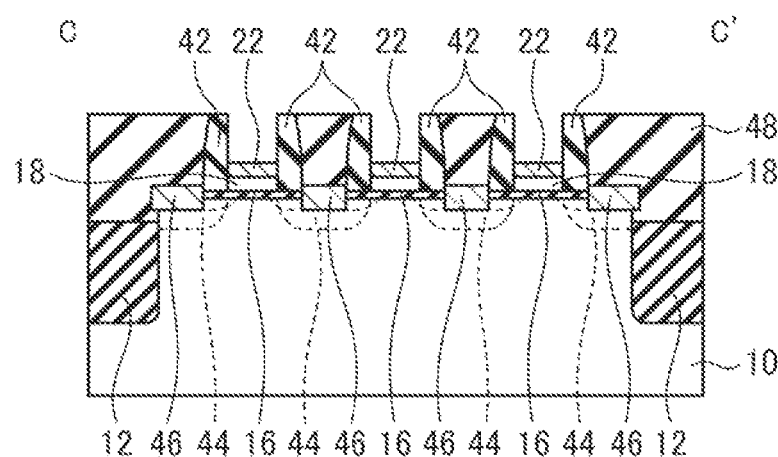
Figure 42B:
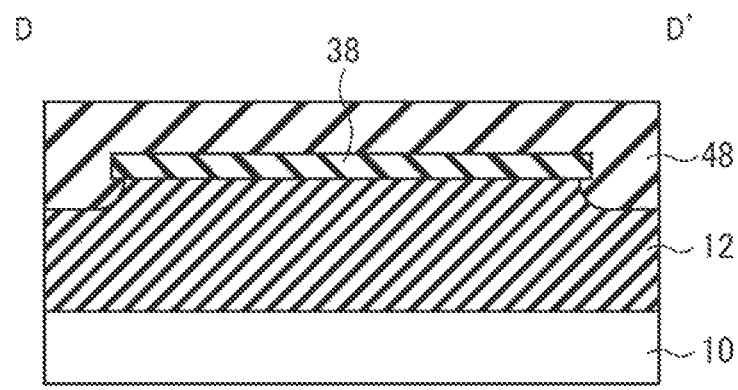

FIG. 40 is a plan view of the semiconductor device after said steps as viewed from above the surface of the semiconductor device. FIG. 41A is the A-A' line cross-sectional view of FIG. 40, and FIG. 41B is the B-B' line cross-sectional view of FIG. 40. FIG. 42A is the C-C' line cross-sectional view of FIG. 40, and FIG. 42B is the D-D' line cross-sectional view of FIG. 40.

Next, a metal film of, e.g., Ti, Ta, TiN, TaN, W, Cu, Al, Ru or others is deposited above the entire surface by, e.g., CVD method or sputtering method.

Next, this metal film is polished for planarization until the inter-layer insulating film 48 is exposed. Thus, in the openings formed by removing the gate film 24, gate electrodes 50 of metal film are formed (FIGS. 43-45B). In the drawings, the buffer layer 22 and the gate electrode 50 are separately illustrated, but they function integrally as the metal gate electrode.

Figure 43:
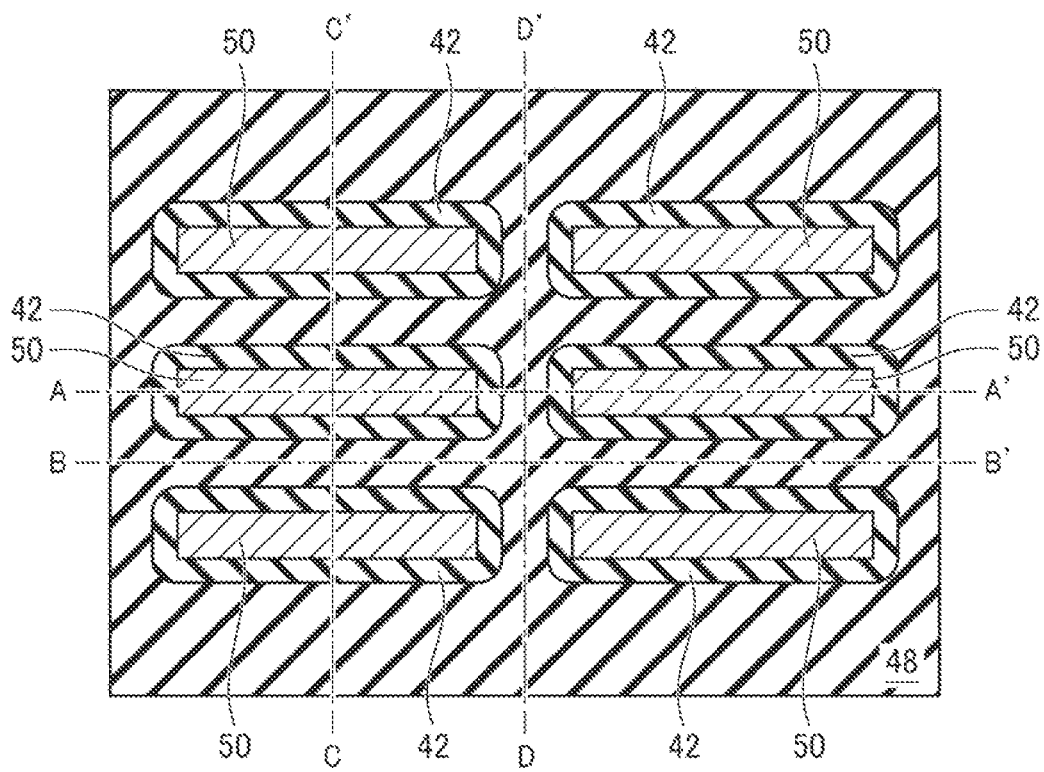
Figure 44A:
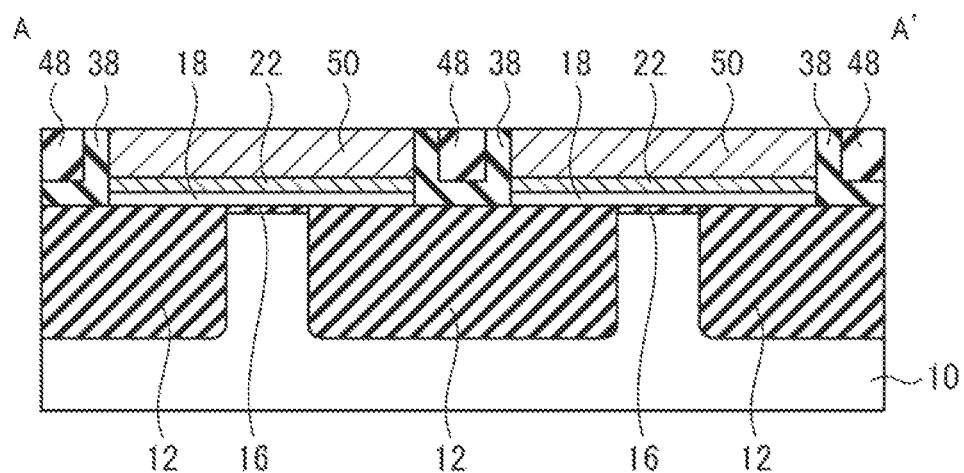
Figure 44B:
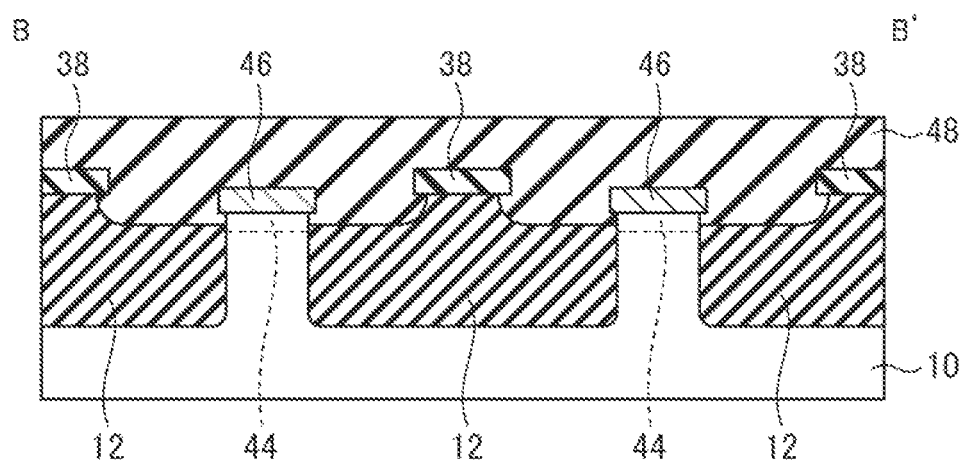
Figure 45A:
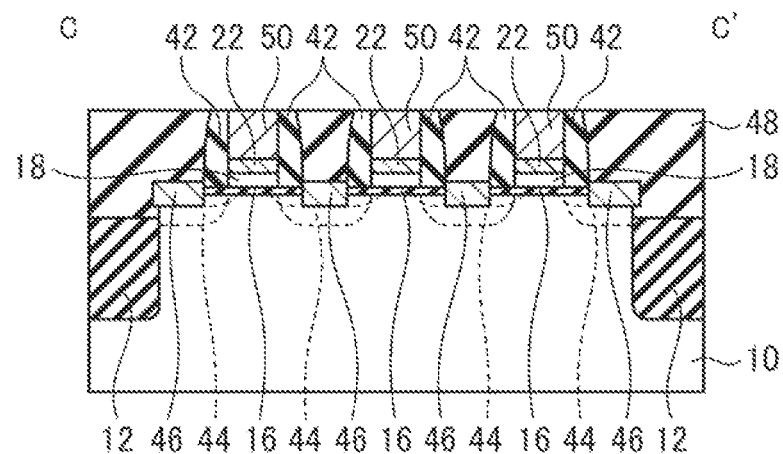
Figure 45B:
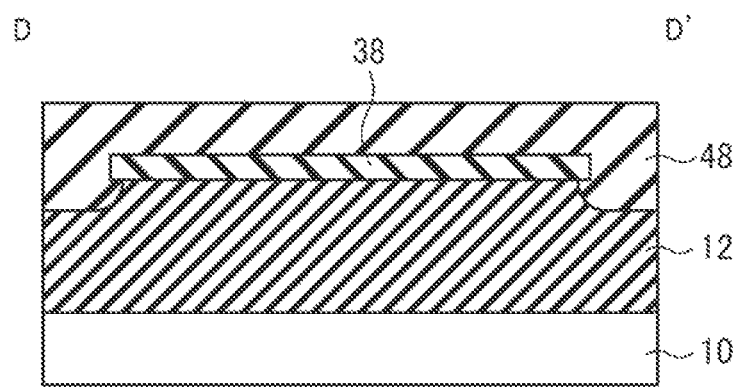

FIG. 43 is a plan view of the semiconductor device after said steps as viewed from above the surface of the semiconductor device. FIG. 44A is the A-A' line cross-sectional view of FIG. 43, and FIG. 44B is the B-B' line cross-sectional view of FIG. 43. FIG. 45A is the C-C' line cross-sectional view of FIG. 43, and FIG. 45B is the D-D' line cross-sectional view of FIG. 43.

Then, an insulating film of, e.g., silicon oxide film, TEOS oxide film, USG film, BPSG film, SiOC film, porous low-k film or others, is deposited by CVD method, spin coating method or others to form an inter-layer insulating film 52.

Next, by photolithography and dry etching, contact holes 54 reaching the silicide layer 46 and contact holes reaching the gate electrodes 50 are formed in the inter-layer insulating films 52, 48.

Then, a conductive film of, e.g., Ti, TiN, W, Cu or others is deposited by CVD method, sputtering method or others and then is polished back by CMP method to form contact plugs 58 buried in the contact holes 54, 56 (FIGS. 46-48B).

Figure 46:
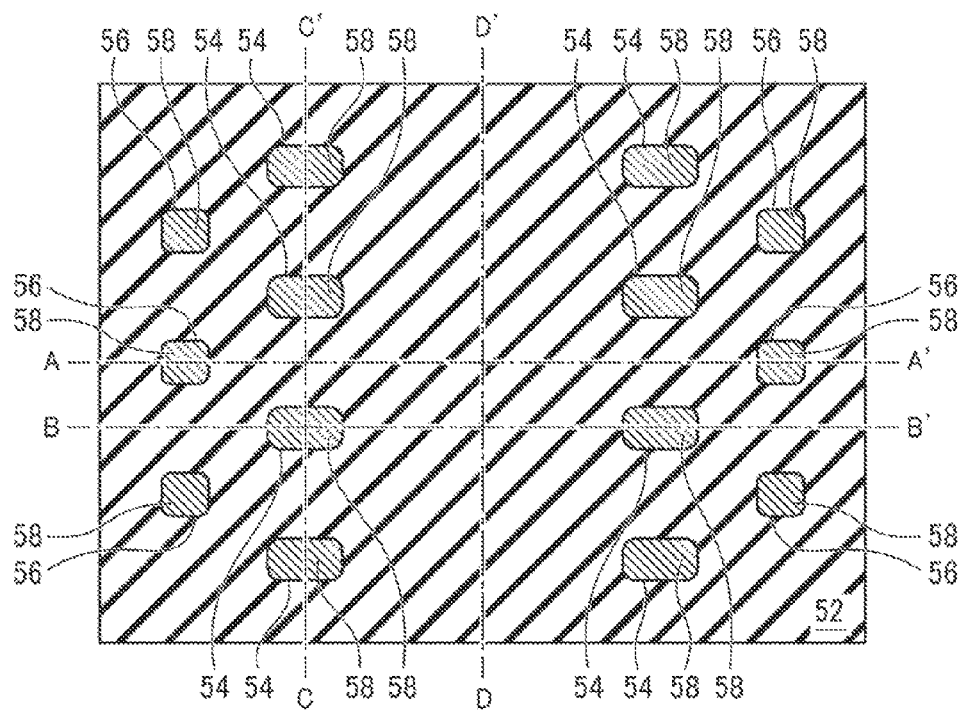
Figure 47A:
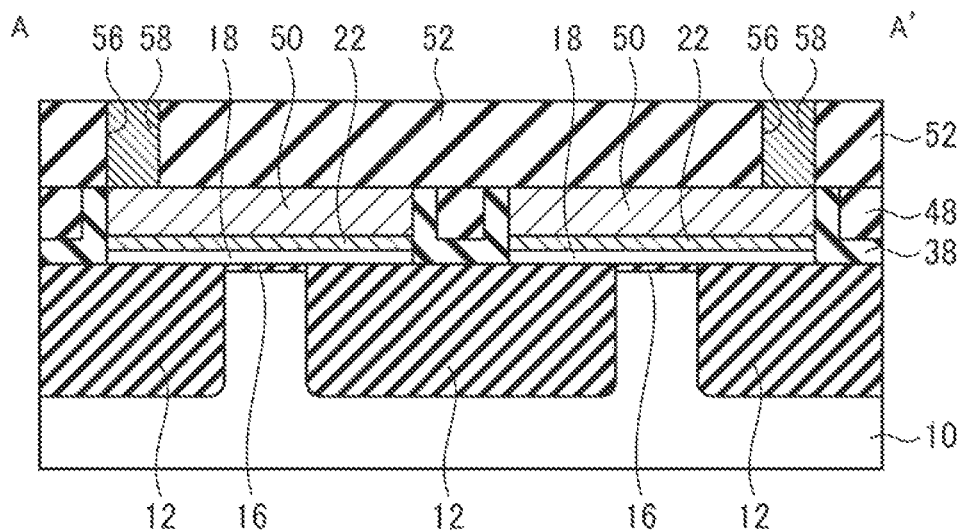
Figure 47B:
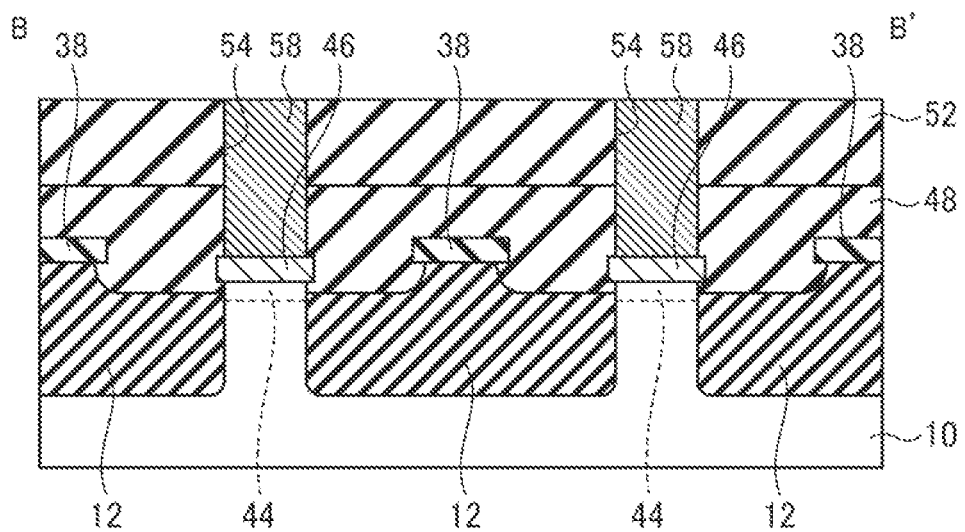
Figure 48A:
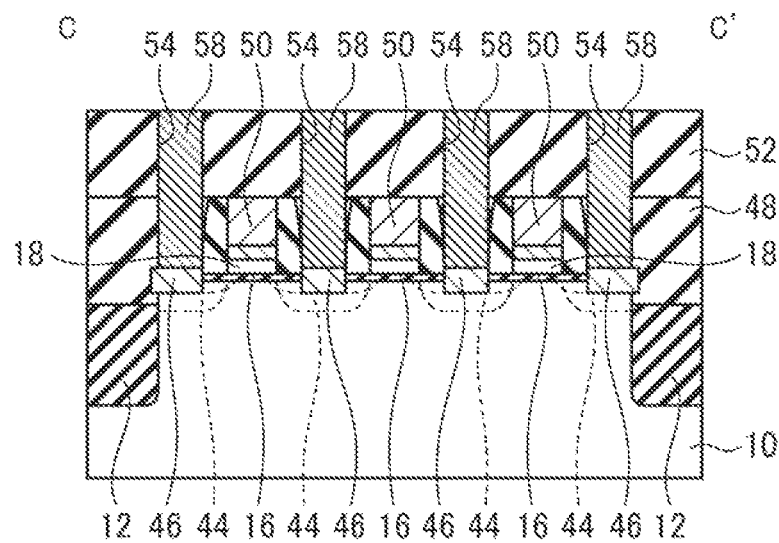
Figure 48B:
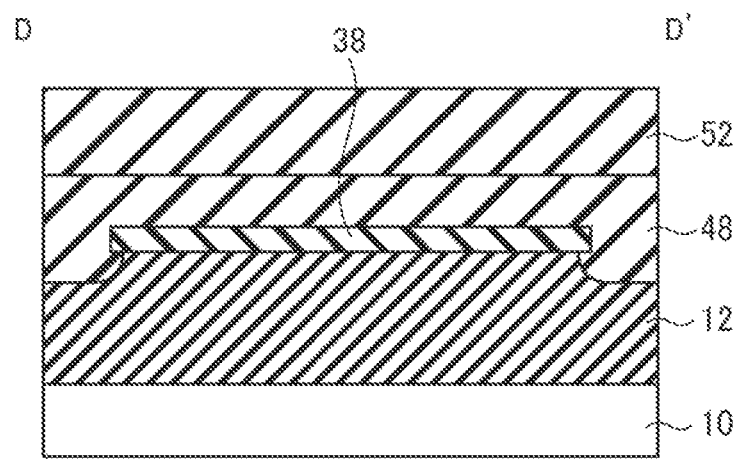

FIG. 46 is a plan view of the semiconductor device after said steps as viewed from above the surface of the semiconductor device. FIG. 47A is the A-A' line cross-sectional view of FIG. 46, and FIG. 47B is the B-B' line cross-sectional view of FIG. 46. FIG. 48A is the C-C' line cross-sectional view of FIG. 46, and FIG. 48B is the D-D' line cross-sectional view of FIG. 46.

Then, after a prescribed backend process, the semiconductor device is completed.

As described above, according to the present embodiment, in forming the sidewall insulating film, the edge of the gate pattern is covered with a mask and with the spacer insulating film remained in the edge region of the gate pattern, whereby the gate electrodes of high configuration controllability is formed by the multiple patterning while the corrosion of the gate insulating film and the gate electrode is suppressed in later chemical processing and manufacturing process. Thus, a semiconductor device of high performance and high reliability can be manufactured.

The First Reference Embodiment

A method of manufacturing a semiconductor device according to a first reference embodiment will be described with reference to FIGS. 49 to 63B. The same members of the embodiment illustrated in FIGS. 1 to 48B are represented by the same reference numbers not to repeat or simplify the description.

FIGS. 49 to 63B are plan views and cross-sectional views illustrating the method of manufacturing the semiconductor device according to the present reference embodiment.

First, in the same way as in the method of manufacturing the semiconductor device according to the embodiment illustrated in FIGS. 1 to 6B, the device isolation insulating film 12, the silicon oxide film 16, the high dielectric constant insulating film 18, the burrier layer 22, the gate film 24, the first had mask 26 and the second hard mask 28 are formed above the silicon substrate 10.

Then, a photoresist film and an anti-reflection coating film are formed above the second hard mask 28, and then the photoresist film is patterned by the photolithography to form a mask pattern 60 for forming the gate electrodes (FIGS. 49-51B).

Figure 49:
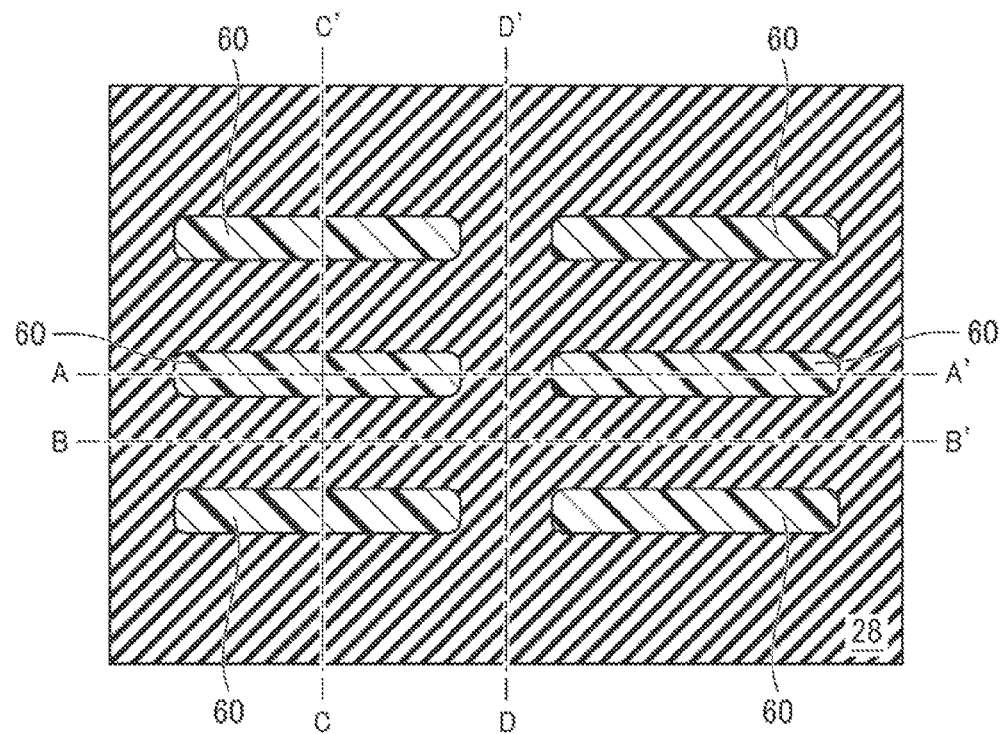
FIGS. 49, 52, 55, 58 and 61 are plan views illustrating a method of manufacturing a semiconductor device according to a first reference embodiment.
Figure 50A:
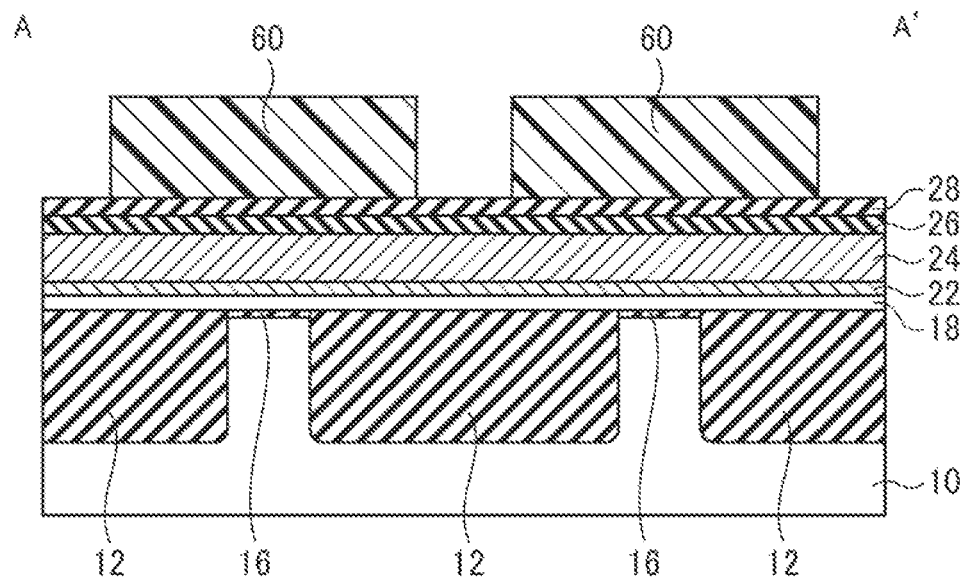
FIGS. 50A, 50B, 51A, 51B, 53A, 53B, 54A, 54B, 56A, 56B, 57A, 57B, 59A, 59B, 60A, 60B, 62A, 62B, 63A and 63B are cross-sectional views illustrating the method of manufacturing the semiconductor device according to the first reference embodiment.
Figure 50B:
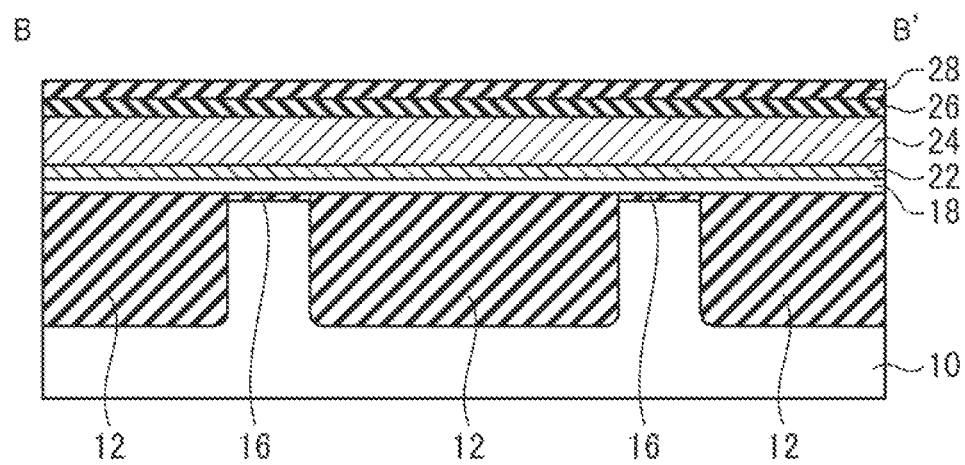
Figure 51A:
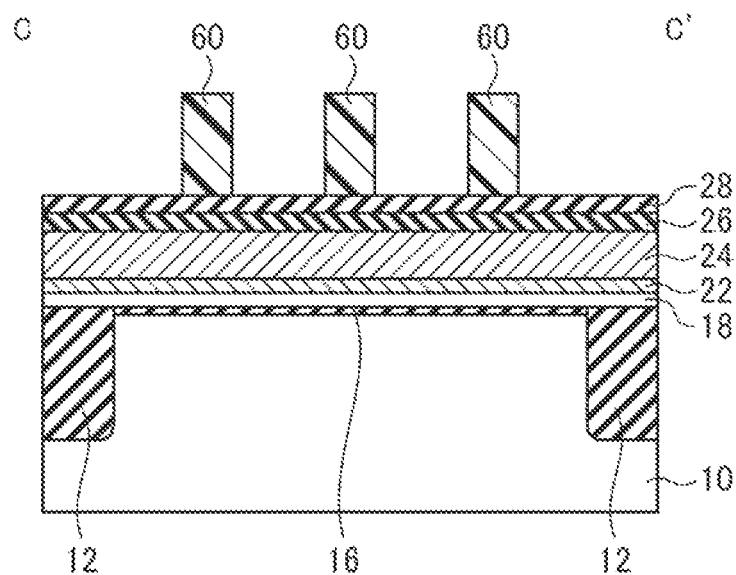
Figure 51B:
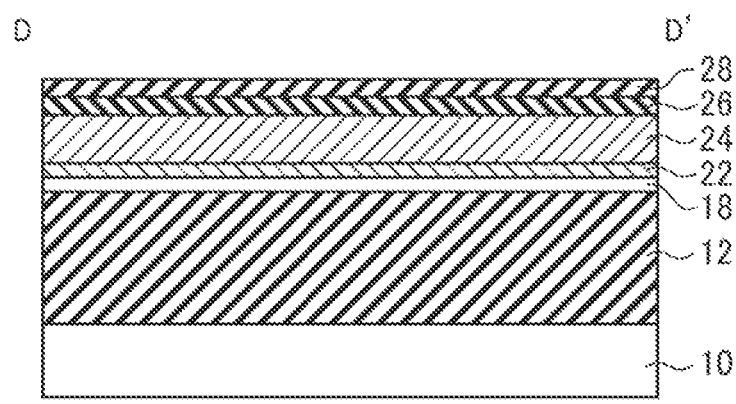

FIG. 49 is a plan view of the semiconductor device after said steps as viewed from above the surface of the semiconductor device. FIG. 50A is the A-A' line cross-sectional view of FIG. 49, and FIG. 50B is the B-B' line cross-sectional view of FIG. 49. FIG. 51A is the C-C' line cross-sectional view of FIG. 49, and FIG. 51B is the D-D' line cross-sectional view of FIG. 49.

When the mask pattern 60 for forming the gate electrodes is formed once photolithography, as exemplified in FIG. 49, the rounding and shortening of the edges of the patterns take place due to the optical proximity effect. As described, it is difficult to control the edge configuration of the gate electrodes by the method of manufacturing the semiconductor device according to the present reference embodiment using single exposure.

Next, the second hard mask 38, the first hard mask 26, the gate film 24, the buffer layer 22 and the high dielectric constant insulating film 18 are dry etched with the mask patterns 60 as the mask.

Next, the mask pattern 60 is removed by, e.g., asking method.

Otherwise, it is possible that the second hard mask 28 is dry etched with the mask pattern 60 to transfer the pattern to the second hard mask 28, and after the mask pattern 60 has been removed, the first hard mask 26, the gate film 24, the buffer layer 22 and the high dielectric constant insulating film 18 are dry etched with the patterned second hard mask 28 as the mask.

Then, ion implantation is made with the patterned layer structure of the second hard mask 28, the first hard mask 26, the gate film 24, buffer layer 22 and the high dielectric constant insulating film 18 as the mask to form the impurity layer 36 in the active regions 14 (FIGS. 52-54B).

Figure 52:
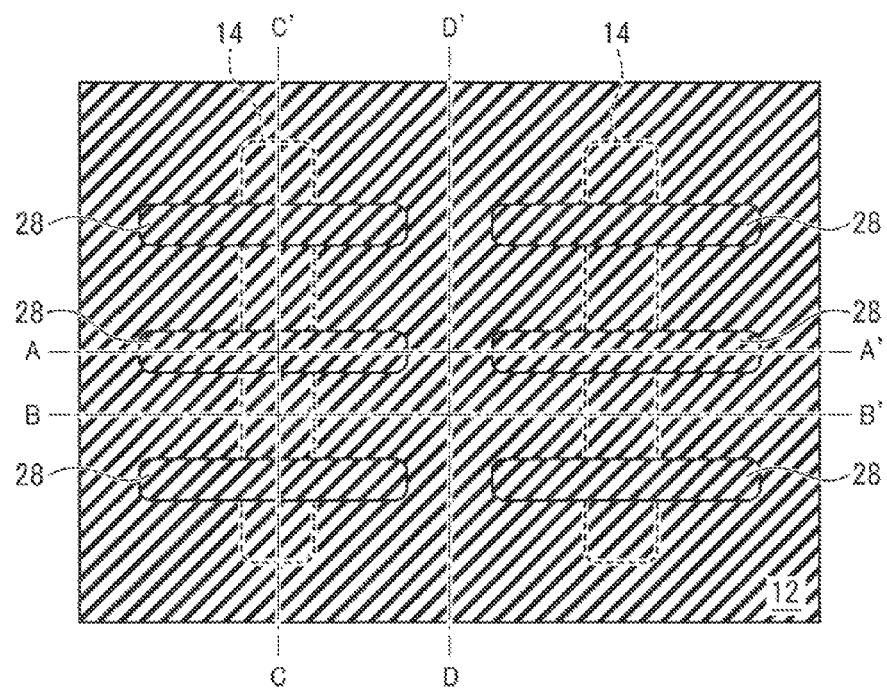
Figure 53A:
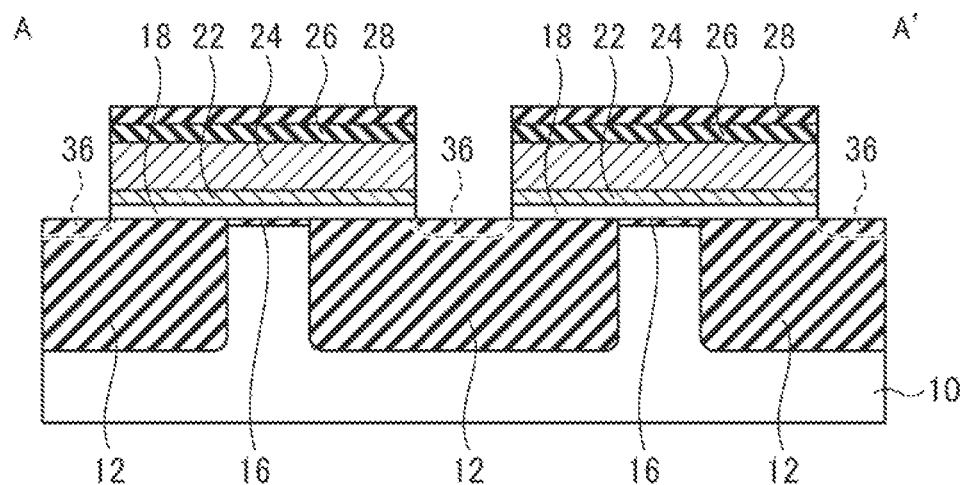
Figure 53B:
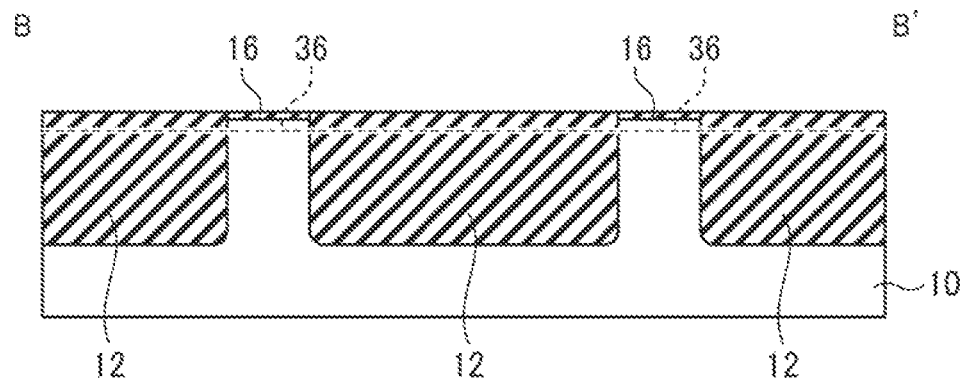
Figure 54A:
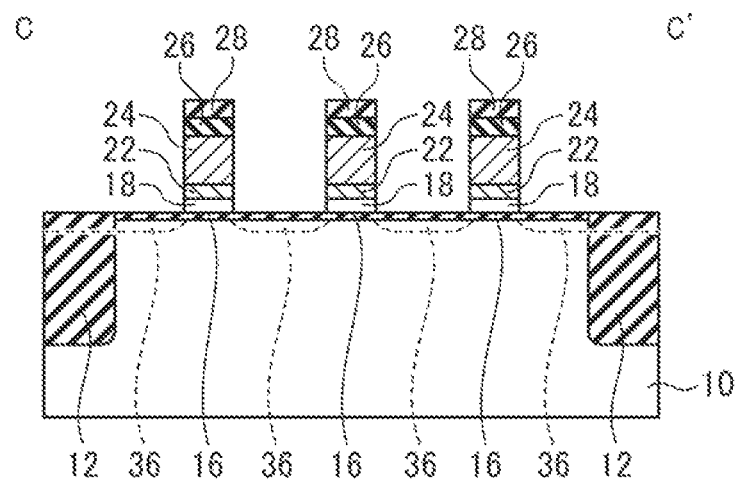
Figure 54B:
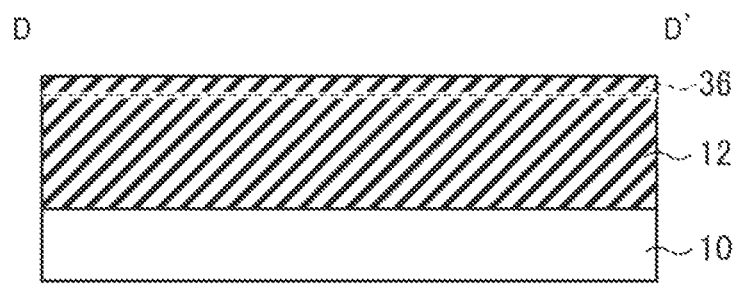

FIG. 52 is a plan view of the semiconductor device after said steps as viewed from above the surface of the semiconductor device. FIG. 53A is the A-A' line cross-sectional view of FIG. 52, and FIG. 53B is the B-B' line cross-sectional view of FIG. 52. FIG. 54A is the C-C' line cross-sectional view of FIG. 52, and FIG. 54B is the D-D' line cross-sectional view of FIG. 52.

Next, a silicon nitride film is deposited above the entire surface by, e.g., CVD method to form the spacer insulating film 38 of the silicon nitride film.

Then, the spacer insulating film 38 is dry etched to form the sidewall insulating film 42 on the side walls of the layer structure of the gate pattern (FIGS. 55-57B).

Figure 55:
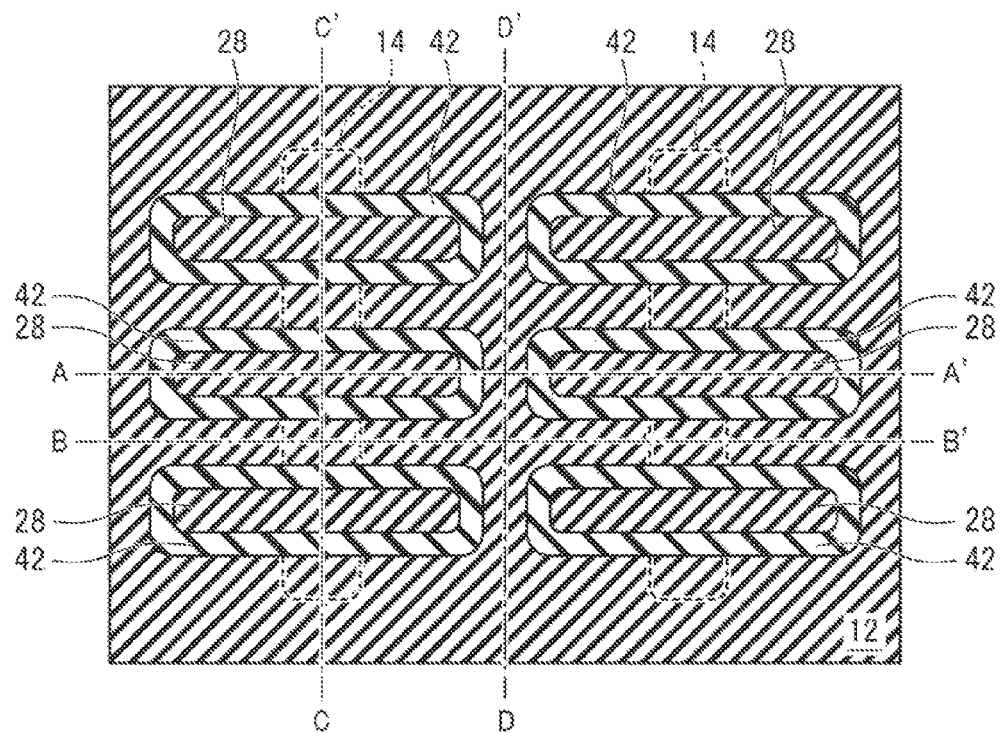
Figure 56A:
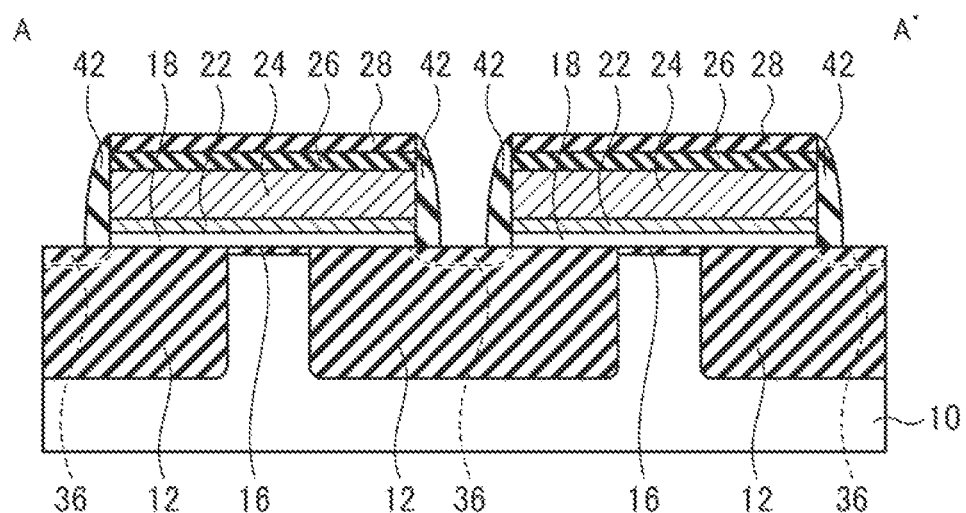
Figure 56B:
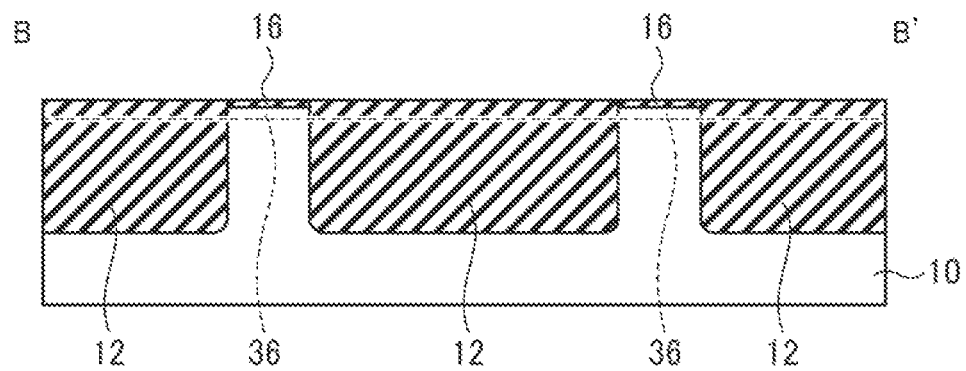
Figure 57A:
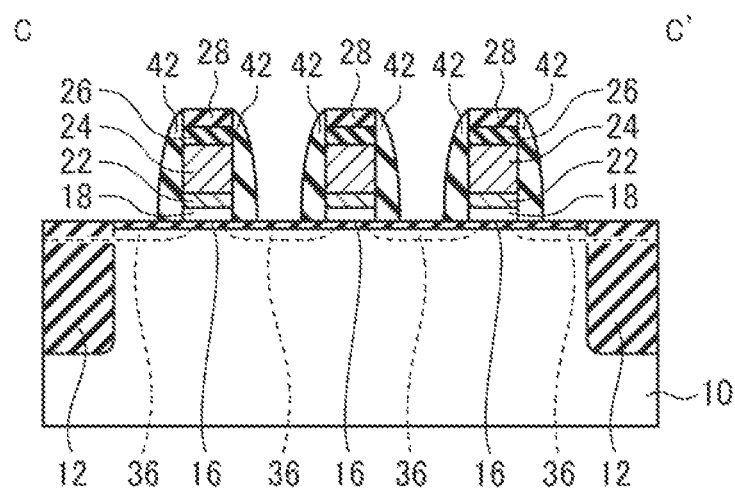
Figure 57B:
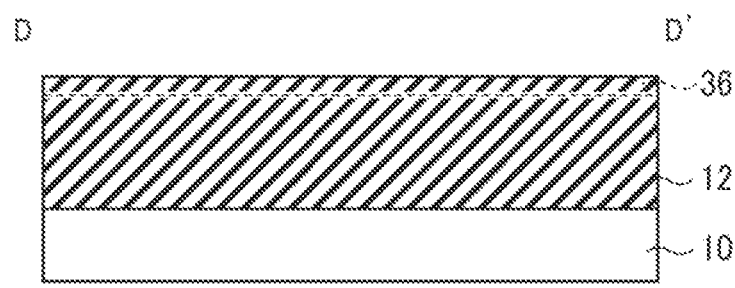

FIG. 55 is a plan view of the semiconductor device after said steps as viewed from above the surface of the semiconductor device. FIG. 56A is the A-A' line cross-sectional view of FIG. 55, and FIG. 56B is the B-B' line cross-sectional view of FIG. 55. FIG. 57A is the C-C' line cross-sectional view of FIG. 55, and FIG. 57B is the D-D' line cross-sectional view of FIG. 55.

In this reference embodiment, wherein the space insulating film 38 is dry etched without using the third mask pattern 40 as illustrated in FIG. 19, the sidewall insulating film 42 is formed all surrounding the side walls of the gate patterns (refer to FIG. 55). That is, different from the first embodiment described above, the sidewall insulating film 42 is formed also on the side walls of the shorter sides of the layer structure of the gate pattern.

Then, ion implantation is made with the layer structure of the gate pattern and the sidewall insulating film 42 as the mask to form the impurity layer 44 to be the source/drain regions in the active regions (FIGS. 58-60B).

Figure 58:
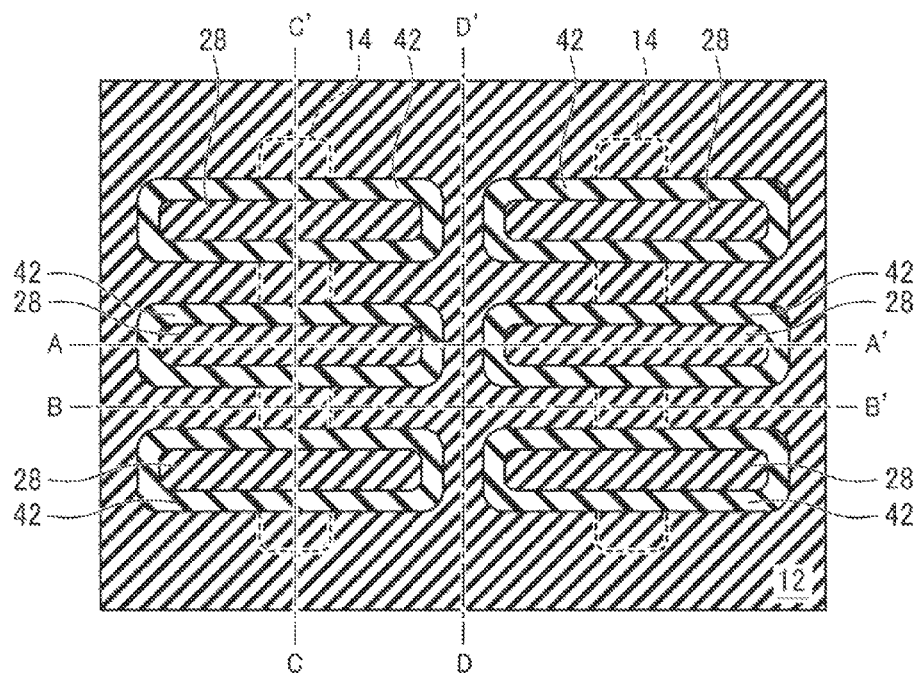
Figure 59A:
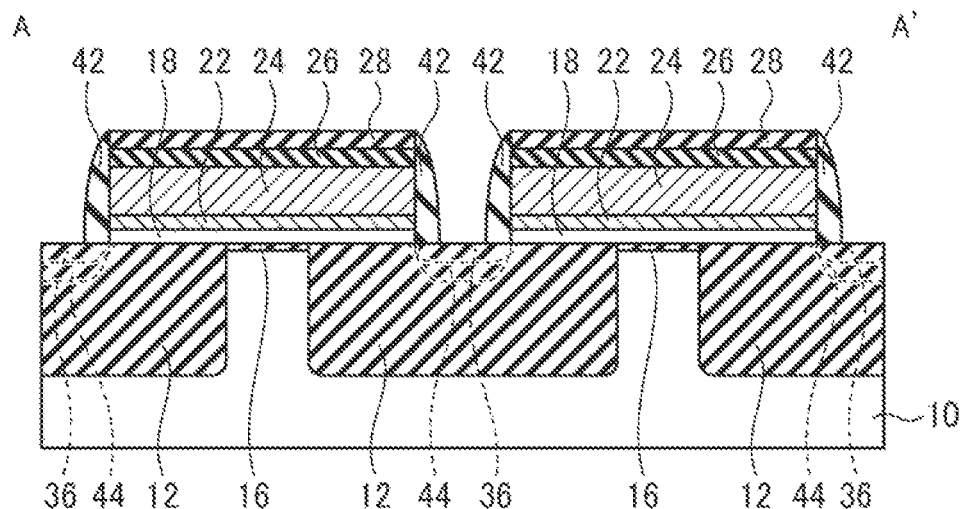
Figure 59B:
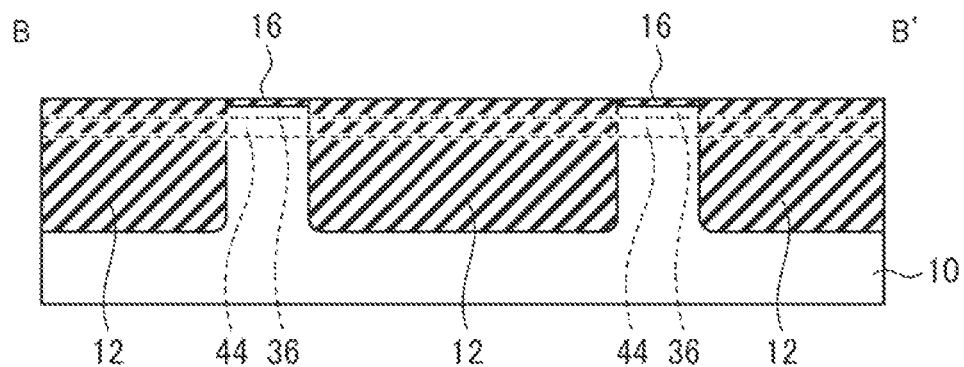
Figure 60A:
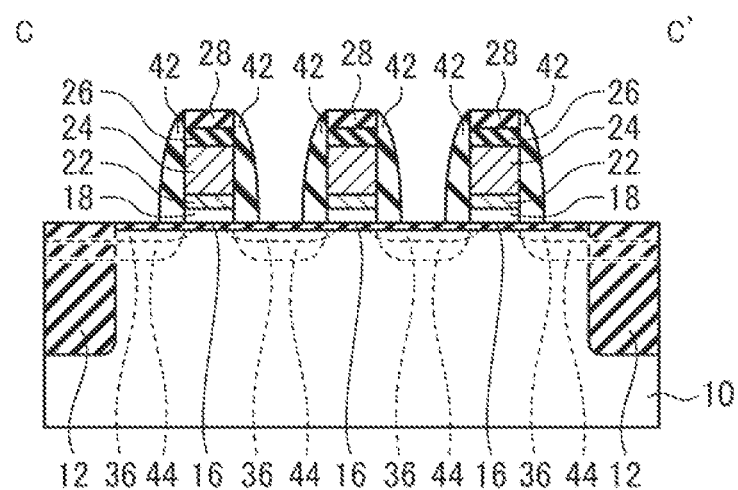
Figure 60B:
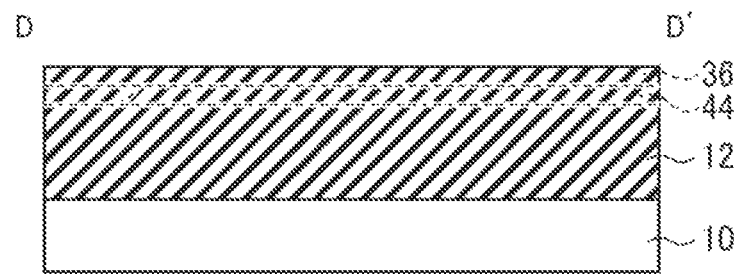

FIG. 58 is a plan view of the semiconductor device after said steps as viewed from above the surface of the semiconductor device. FIG. 59A is the A-A' line cross-sectional view of FIG. 58, and FIG. 59B is the B-B' line cross-sectional view of FIG. 58. FIG. 60A is the C-C' line cross-sectional view of FIG. 58, and FIG. 60B is the D-D' line cross-sectional view of FIG. 58.

Then, as the preprocessing for forming the silicide layer above the surfaces of the active regions 14, the silicon oxide film 16 above the surfaces of the active regions 14 is removed. To remove the silicon oxide film 16, wet etching using hydrofluoric acid aqueous solution or dry etching can be used. In removing the silicon oxide film 16, the second hard mask 28 of the silicon oxide film and the device isolation insulating film 12 of the silicon oxide film are also etched (FIGS. 61-63B).

Figure 61:
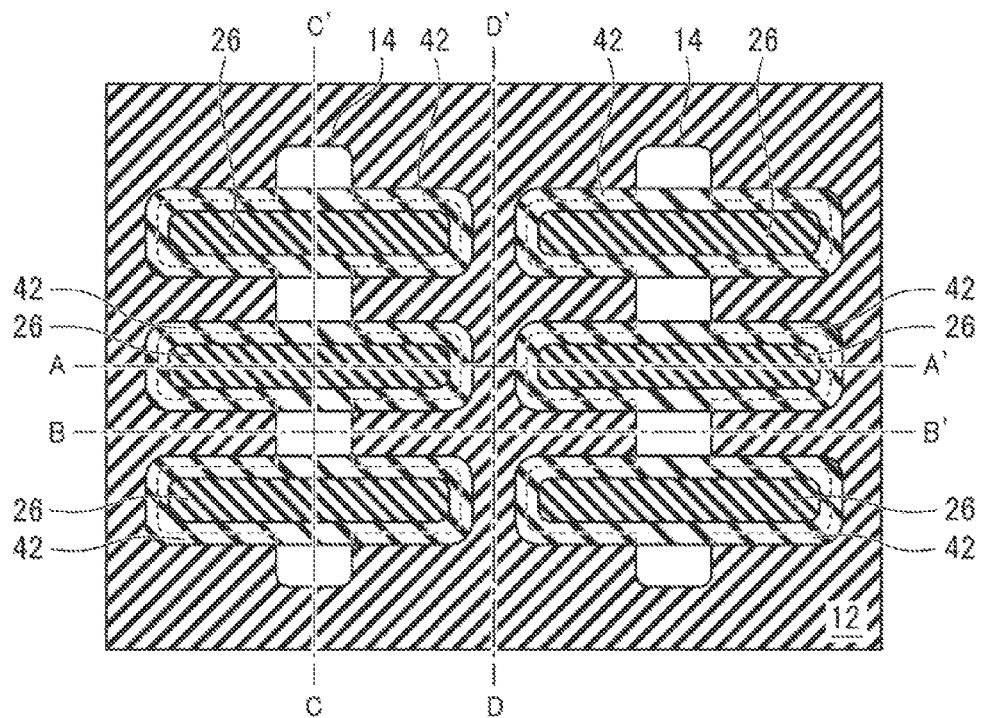
Figure 62A:
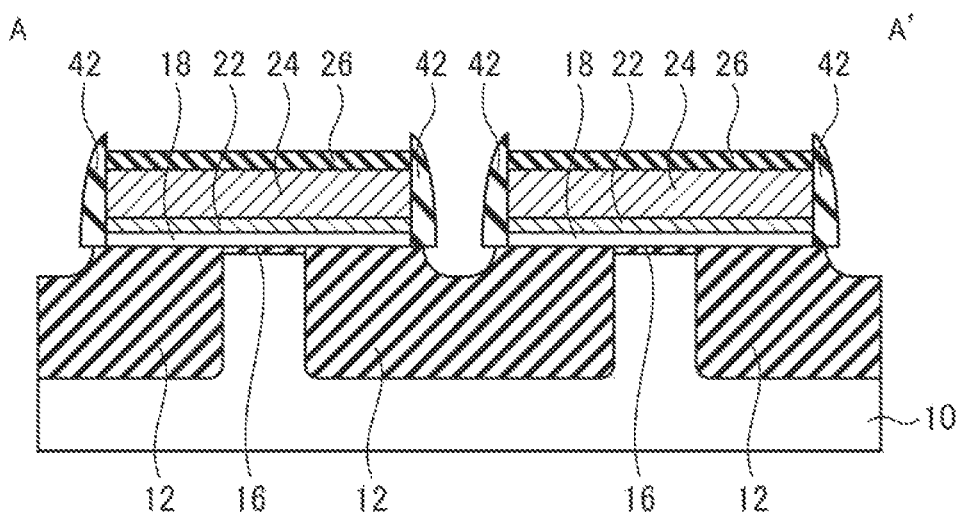
Figure 62B:
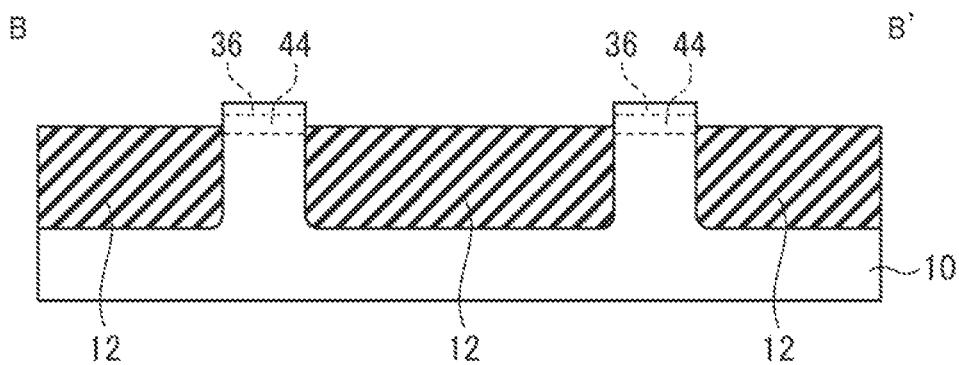
Figure 63A:
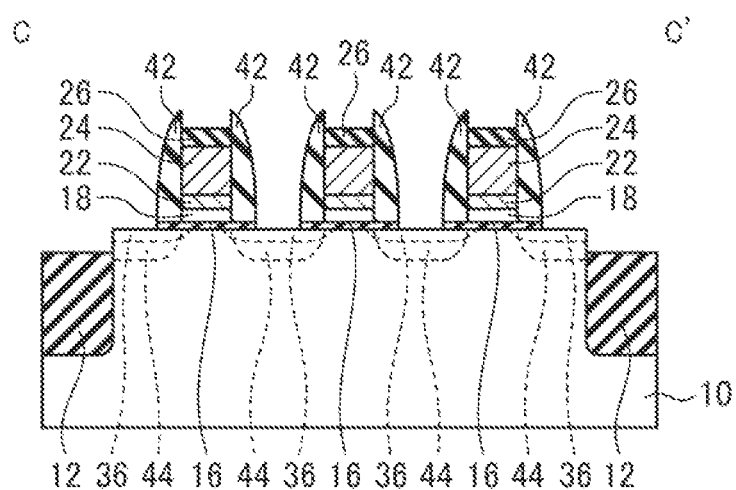
Figure 63B:
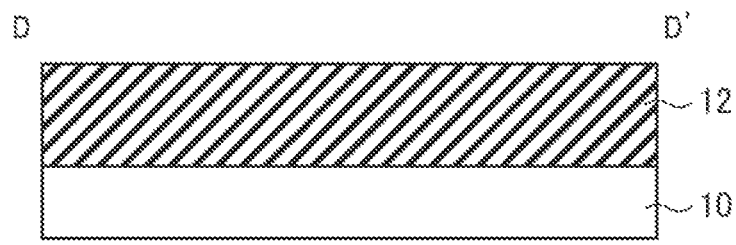

FIG. 61 is a plan view of the semiconductor device after said steps as viewed from above the surface of the semiconductor device. FIG. 62A is the A-A' line cross-sectional view of FIG. 61, and FIG. 62B is the B-B' line cross-sectional view of FIG. 61. FIG. 63A is the C-C' line cross-sectional view of FIG. 61, and FIG. 63B is the D-D' line cross-sectional view of FIG. 61.

Silicon oxide film such as the silicon oxide film forming the device isolation insulating film 12 formed by CVD method has a higher etching rate in comparison with the silicon oxide film formed by thermal oxidation method. The silicon oxide film with an impurity implanted has a further higher etching rate. Accordingly, in etching the silicon oxide film 16, the amount of the device isolation insulating film 12 to be etched is larger in comparison with the film thickness of the silicon oxide film 16.

When etching which isotropically etches the silicon oxide film 16 is used, the etching of the device isolation insulating film 12 advances into below the sidewall insulating film 42 (refer to FIG. 62A). In FIG. 61, the edges of the device isolation insulating film 12 which is below the sidewall insulating film 38 is illustrated by the dotted lines.

However, the corners of the gate patterns are rounded as exemplified in FIG. 61, and the sidewall insulating film 42 formed on the side walls of the layer structures of the gate patterns is never locally thinned (refer to the second reference embodiment).

The Second Reference Embodiment

A method of manufacturing a semiconductor device according to a second reference embodiment will be described with reference to FIGS. 64 to 73B. The same members of the present reference embodiment as those of the method of manufacturing the semiconductor manufacturing method according to the embodiment illustrated in FIGS. 1-48B and the first reference embodiment illustrated in FIGS. 49-63B are represented by the same reference numbers not to repeat or to simplify the description.

FIGS. 64 to 73B are plan views and cross-sectional views illustrating the method of manufacturing the semiconductor device according to the present reference embodiment.

First, in the same way as in the method of manufacturing the semiconductor device according to the embodiment illustrated in FIGS. 1 to 18B, the device isolation insulation layer 12 and the layer structure of the gate pattern are formed above the silicon substrate 10. The layer structure of the gate pattern is formed by the same multiple exposure technique as in the embodiment, whereby the gate patterns are formed without causing rounding and shortening of the edges.

Next, ion implantation is made with the patterned layer structure (layer structure of gate pattern) of the second hard mask 28, the first hard mask 26, the gate film 24, the buffer layer 22 and the high dielectric constant insulating film 18 as the mask to form the impurity layer 36 in the active regions 14.

Next, a silicon nitride film is deposited above the entire surface by, e.g., CVD method to form the spacer insulating film 38 of the silicon nitride film.

Next, the spacer insulating film 38 is dry etched to form the sidewall insulating film 42 on the side walls of the layer structure of the gate pattern (FIGS. 64-66B).

Figure 64:
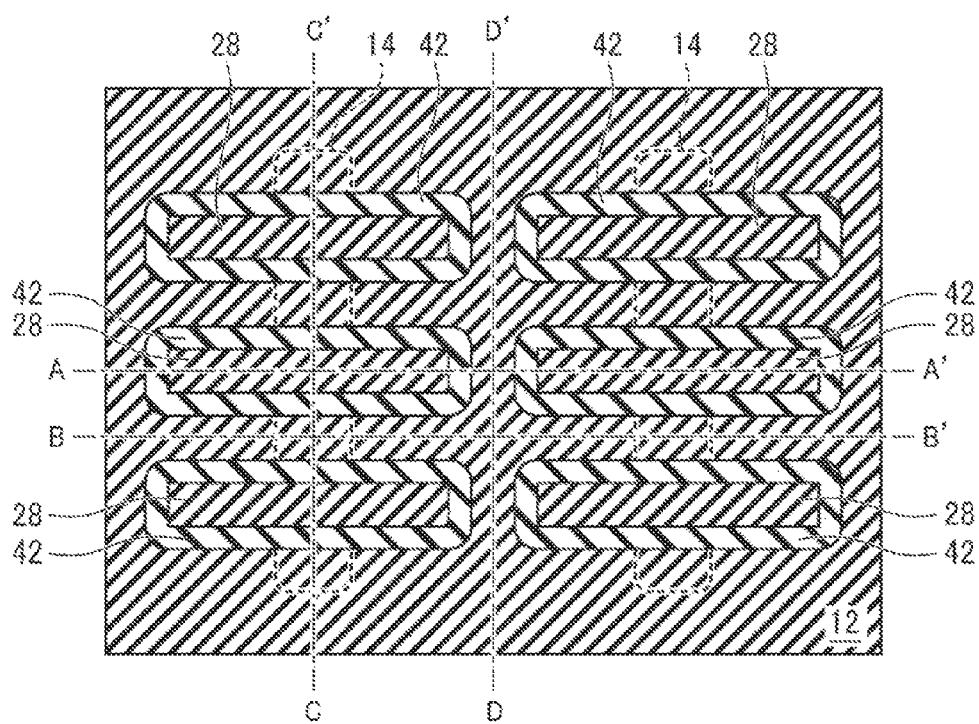
FIGS. 64, 67 and 70 are plan views illustrating a method of manufacturing a semiconductor device according to a second reference embodiment.
Figure 65A:
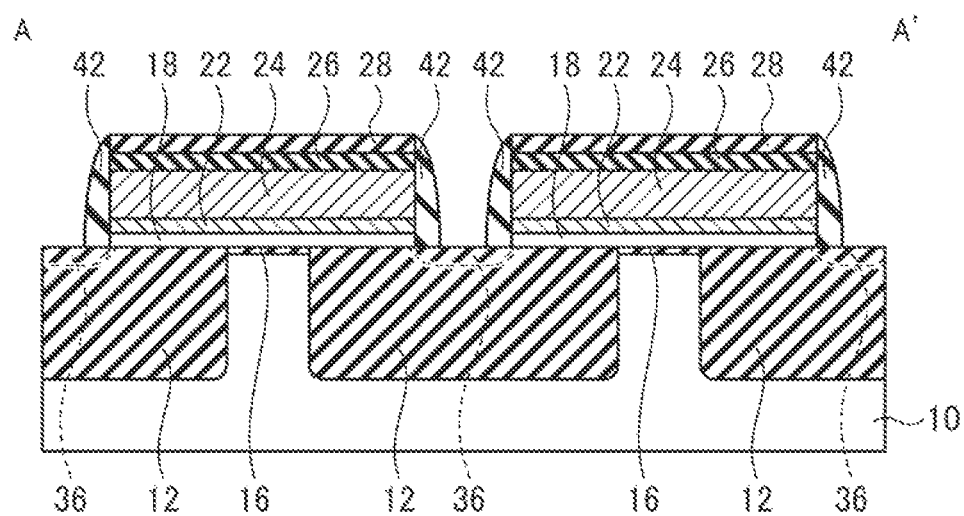
FIGS. 65A, 65B, 66A, 66B, 68A, 68B, 69A, 69B, 71A, 71B, 72A and 72B are cross-sectional views illustrating the method of manufacturing the semiconductor device according to the second reference embodiment.
Figure 65B:
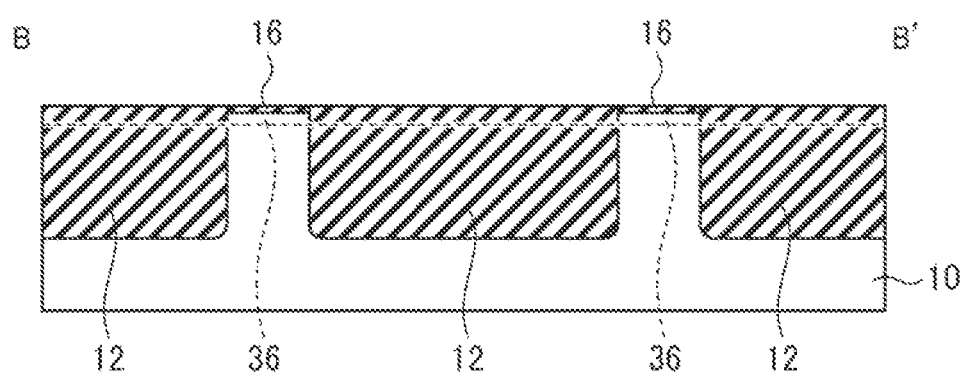
Figure 66A:
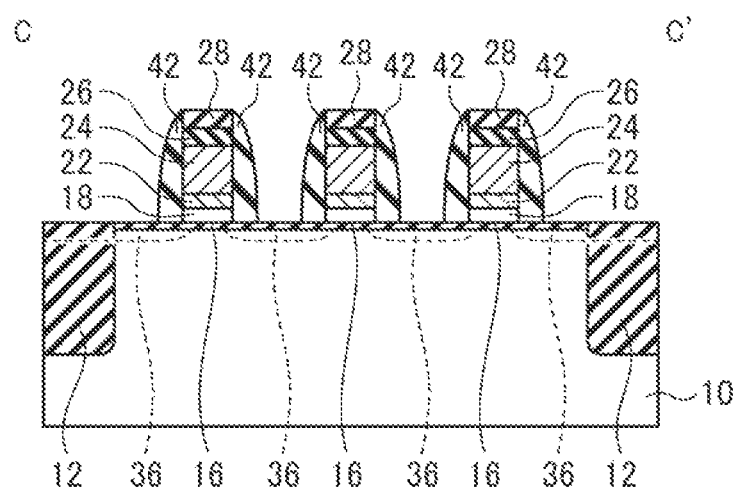
Figure 66B:
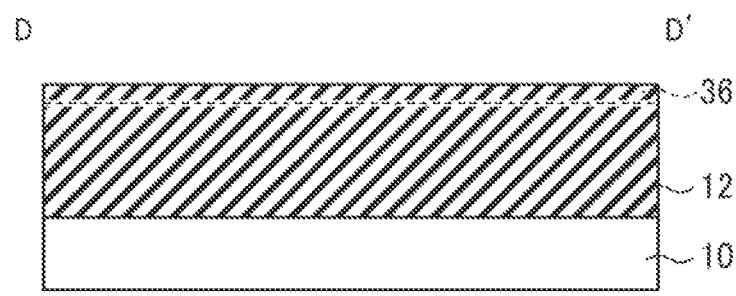

FIG. 64 is a plan view of the semiconductor device after said steps as viewed from above the surface of the semiconductor device. FIG. 65A is the A-A' line cross-sectional view of FIG. 64, and FIG. 65B is the B-B' line cross-sectional view of FIG. 64. FIG. 66A is the C-C' line cross-sectional view of FIG. 64, and FIG. 66B is the D-D' line cross-sectional view of FIG. 64.

In the second reference embodiment, wherein the spacer insulating film 38 is dry etched without using the third mask pattern 40 illustrated in FIG. 19, the sidewall insulating film 42 is formed, surrounding all the side walls of the gate patterns (refer to FIG. 64). That is, different from the embodiment described above, the sidewall insulating film 42 is formed also on the side walls of the shorter sides of the layer structure of the gate pattern.

Next, ion implantation is made with the layer structure of the gate pattern and the sidewall insulating film 42 to form the impurity layer 44 to be the source/drain regions in the active regions 14 (FIGS. 67-69B).

Figure 67:
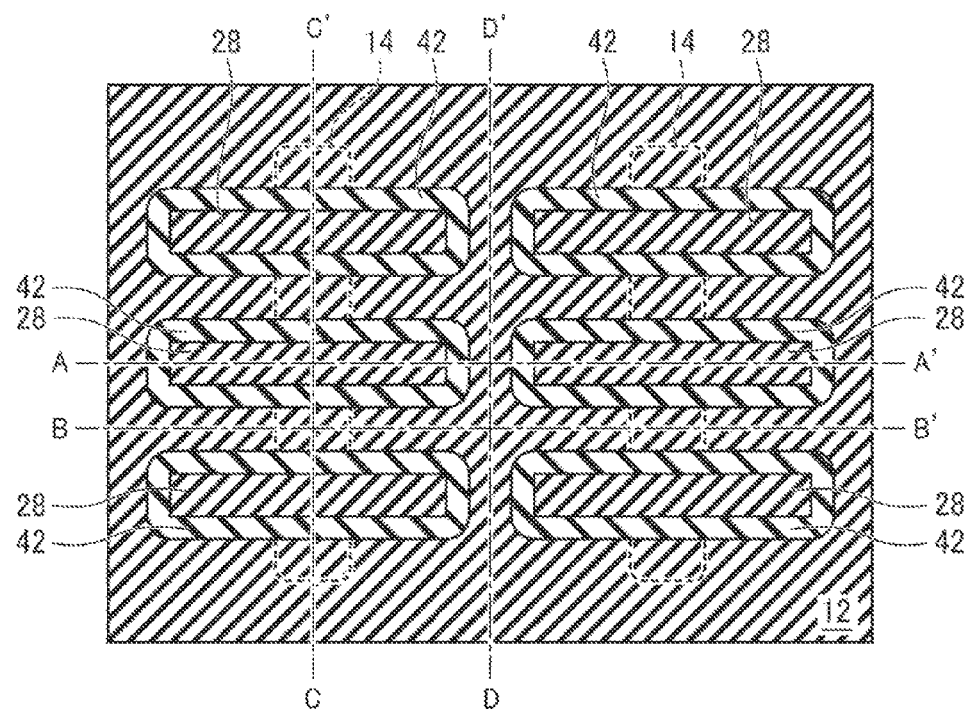
Figure 68A:
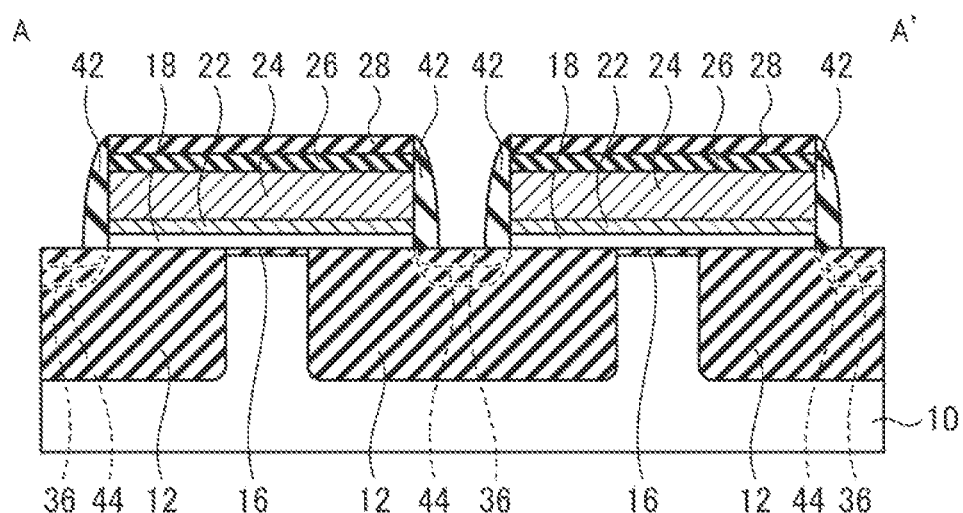
Figure 68B:
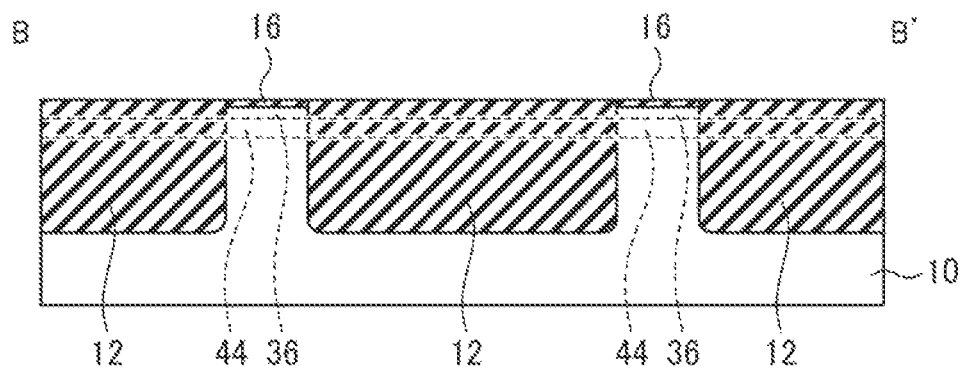
Figure 69A:
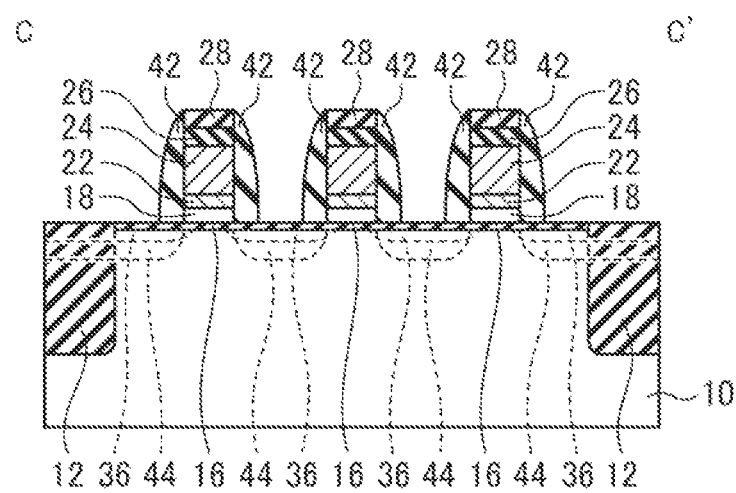
Figure 69B:
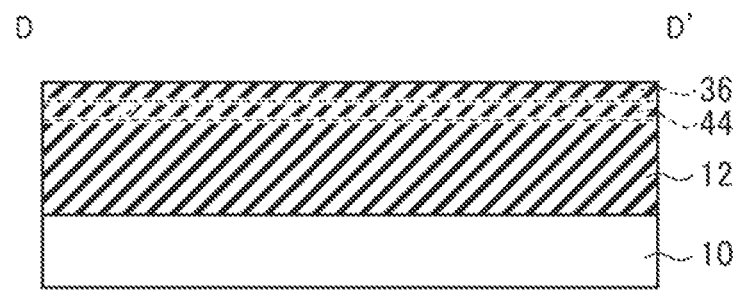

FIG. 67 is a plan view of the semiconductor device after said steps as viewed from above the surface of the semiconductor device. FIG. 68A is the A-A' line cross-sectional view of FIG. 67, and FIG. 68B is the B-B' line cross-sectional view of FIG. 67. FIG. 69A is the C-C' line cross-sectional view of FIG. 67, and FIG. 69B is the D-D' line cross-sectional view of FIG. 67.

Then, as the preprocessing for forming the silicide layer above the surfaces of the active regions 14, the silicon oxide film 16 above the surfaces of the active regions 14 is removed. To remove the silicon oxide film 16, wet etching using hydrofluoric acid aqueous solution or dry etching can be used. In removing the silicon oxide film 16, the second hard mask 28 and the device isolation insulating film 12 of the silicon oxide film are also etched (FIGS. 70-72B).

Figure 70:
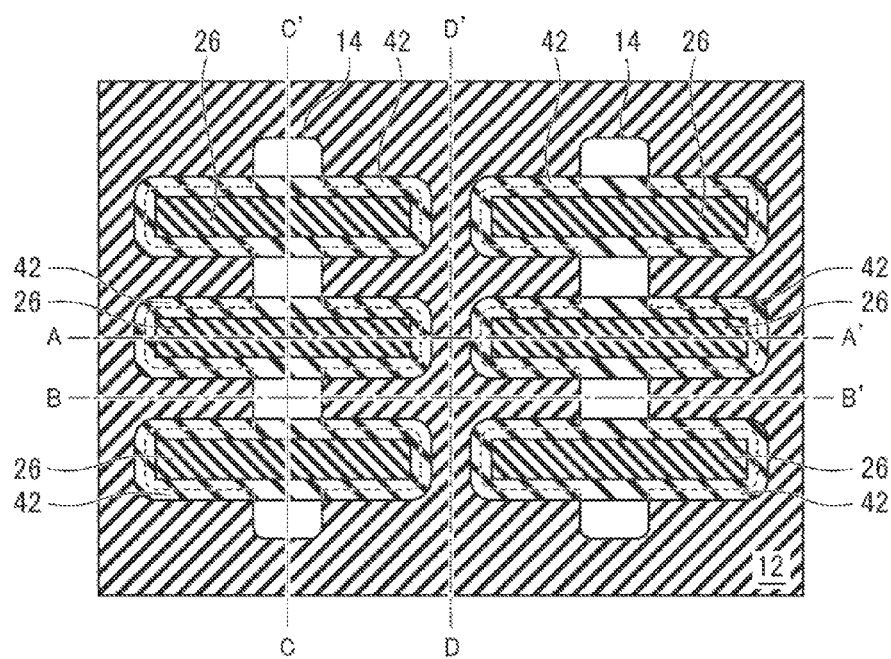
Figure 71A:
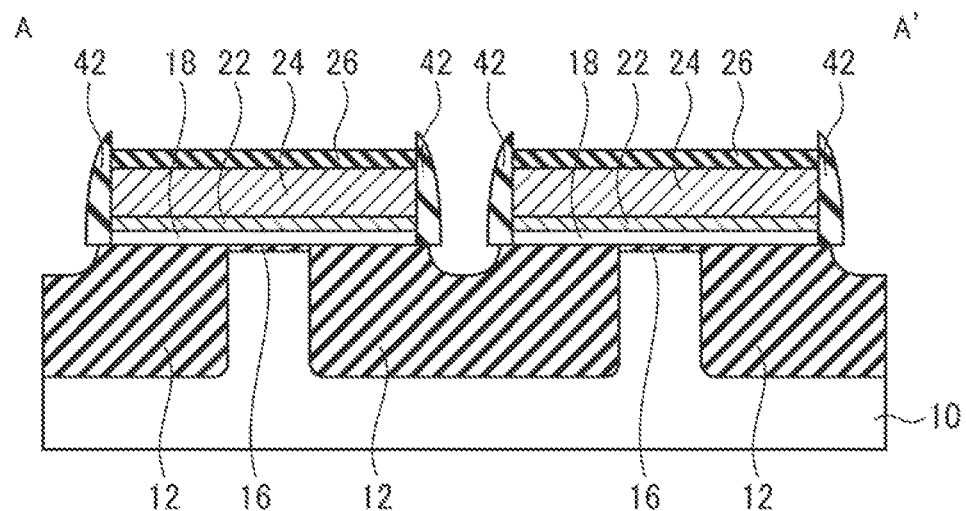
Figure 71B:
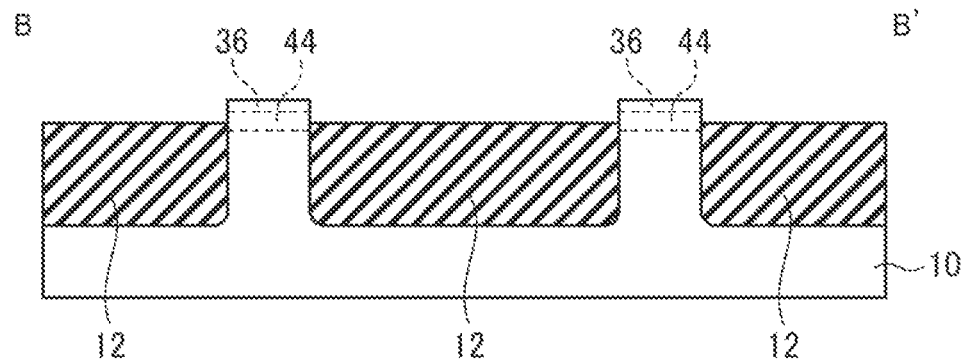
Figure 72A:
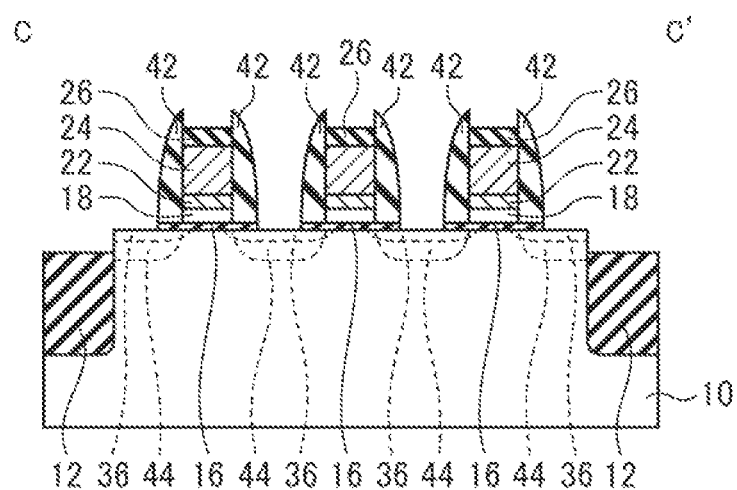
Figure 72B:
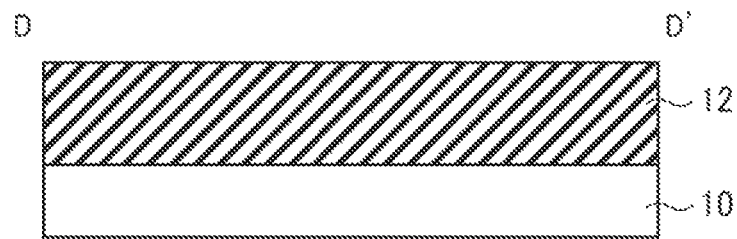
Figure 73A:
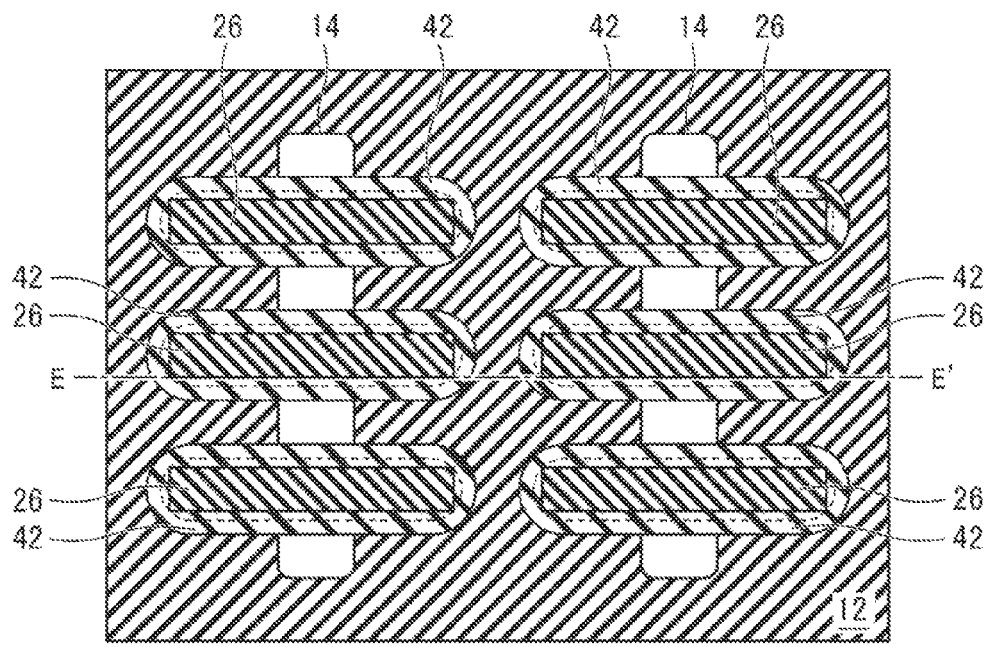
FIG. 73A is a plan view explaining a problem of the method of manufacturing the semiconductor device according to the second reference embodiment.
Figure 73B:
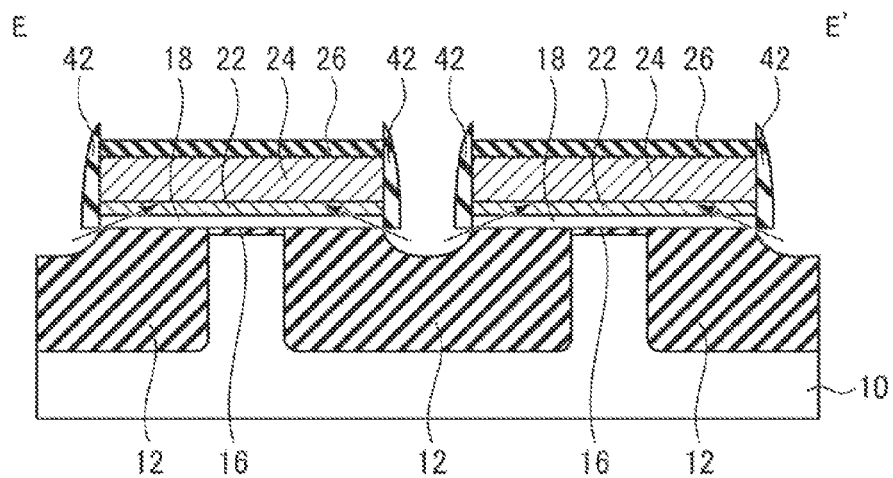
FIG. 73B is a cross-sectional view explaining the problem of the method of manufacturing the semiconductor device according to the second reference embodiment.

FIG. 70 is a plan view of the semiconductor device after said steps as viewed from above the surface of the semiconductor device. FIG. 71A is the A-A' line cross-sectional view of FIG. 70, and FIG. 71B is the B-B' line cross-sectional view of FIG. 70. FIG. 72A is the C-C' line cross-sectional view of FIG. 70, and FIG. 72B is the D-D' line cross-sectional view of FIG. 70.

Silicon oxide film, such as the silicon oxide film forming the device isolation insulating film 12, formed by CVD method has a higher etching rate in comparison with silicon oxide film formed by thermal oxidation method. The etching rate of the silicon oxide film with an impurity implanted has further higher. Accordingly, an amount of the device isolation insulating film 12 to be etched in etching the silicon oxide film 16 is larger in comparison with the film thickness of the silicon oxide film 16.

When the device isolation insulating film 12 is etched by the etching which isotropically advances, the etching of the device isolation insulating film 12 advances into below the sidewall insulating film 42 (refer to FIG. 71A). In FIG. 70, the edges of the device isolation film 12 which has advanced into below the sidewall insulating film 38 are illustrated by the dotted lines.

In this reference embodiment, the gate pattern has corners. At these corners, coverage deterioration of the film, and concentration or mitigation of the film stress will be caused, and the sidewall insulating film 42 is thinned by damages in the rinse step and the dry processing. In such case, when the etching for removing the silicon oxide film 16 excessively advances, as exemplified in FIGS. 73A and 73B, the edges of the device isolation insulating film 12 often reach the gate pattern.

With the edges of the device isolation insulating film 12 arriving at below the gate pattern, in the chemical processing (processing with hydrofluoric acid, hydrochloric acid, ammonium hydroxide, sulfuric acid, phosphoric acid, hydrogen peroxide water solution or others), the chemical liquid intrudes into the interface between the gate insulating film 20 and the gate film 24, or the gate film 24 is dissolved, and resultantly the risk of the gate insulating film 20, the buffer layer 22, the gate film 24, etc. being corroded will be higher.

Resultantly, transistors of prescribed characteristics cannot be manufactured, and there is a risk that the reliability of the transistors will lower.

MODIFIED EMBODIMENTS

The above-described embodiments can cover other various modifications.

For example, the above-described embodiment has been described by means of MOSFETs including the gate insulating film 20 including the high dielectric constant insulating film 18. However, it is not essential that the gate insulating film 20 includes the high dielectric constant insulating film 18, and even when a silicon-based insulating film, such as silicon oxide film or others, is used, the same effect can be produced. The effects produced by the above-described embodiment is not limited to the MOSFETs including the gate insulating film 20 including the high dielectric constant insulating film 18.

In the above-described embodiment, the metal gate electrode is described as one example of the gate electrode combined with the gate insulating film 20 including the high dielectric constant insulating film 18, but it is not essential that the gate electrode material is a metal material. The gate electrode 50 may be formed of polycrystalline silicon film formed by crystallizing amorphous silicon film used in the gate film 24. In this case, the silicide film 46 may be formed also on the gate electrode 50.

In the above-described embodiment, the metal gate electrode is formed by the so-called gate last process but may be formed by the so-called gate first process by using in advance a metal material as the gate film 24.

In the above-described embodiment, a plurality of gate patterns are formed by dividing one line pattern, but one gate pattern may be formed by removing both ends of one line pattern.

In the above-described embodiment, linear line pattern is formed with the first mask pattern. However, the line pattern may not be essentially straight and may have curves and branches.

The structure, the constituent materials, the manufacturing conditions, etc. described in the above-described embodiment are just one example and can be modified or changed suitably in accordance with the technical common sense, etc., of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a gate insulating film above a semiconductor substrate;
    forming a gate film above the gate insulating film;
    forming a hard mask film above the gate insulating film;
    patterning the hard mask with a first mask pattern;
    processing the patterned hard mask film into a gate pattern with a second mask pattern;
    patterning the gate film and the gate insulating film with the hard mask film having the gate pattern as a mask;
    forming a spacer insulating film above the semiconductor substrate with the patterned gate film and the gate insulating film;
    forming above the spacer insulating film a third mask pattern covering an edge of the patterned gate film and the gate insulating film; and
    etching the spacer insulating film with the third mask patterns as the mask to form a sidewall insulating film of the spacer insulating film on side walls of the patterned gate film and the gate insulating film, leaving the spacer insulating film below the third mask pattern.

2. The method of manufacturing a semiconductor device according to claim 1, wherein
    the third mask pattern has an inverted pattern of the second mask pattern.

3. The method of manufacturing a semiconductor device according to claim 1, wherein
    the gate insulating film includes a high dielectric constant insulating film.

4. The method of manufacturing a semiconductor device according to claim 1,
    further comprising, before forming the gate insulating film, forming a device isolation insulating film defining an active region, and in which
    a region where the second mask pattern is exposed is positioned on the device isolation insulating film.

5. The method of manufacturing a semiconductor device according to claim 4, further comprising after removing the third mask pattern:
    exposing the semiconductor substrate in the active region with a chemical processing, and
    forming a silicide film above the active region where the semiconductor substrate is exposed.

6. The method of manufacturing a semiconductor device according to claim 4, further comprising after removing the third mask pattern:
    removing the hard mask film;
    removing the gate film; and
    burying a metal material in a part from which the gate film has been removed to form a gate electrode of the metal material.

7. The method of manufacturing a semiconductor device according to claim 6, further comprising after forming the gate insulating film and before forming the gate film:
    forming a buffer layer, in which
    in removing the gate film, the gate film is removed with the buffer layer as a stopper.

8. The method of manufacturing a semiconductor device according to claim 1, wherein
    the hard mask film includes a first hard mask film and a second hard mask film formed on the first hard mask film,
    in patterning the hard mask film, the second hard mask film is patterned with the first hard mask film as a stopper, and
    in patterning the gate film and the gate insulating film, the first hard mask film, the gate film and the gate insulating film are patterned with the second hard mask film as a mask.

9. The method of manufacturing a semiconductor device according to claim 1, wherein
    in processing the hard mask film with the second mask pattern, a plurality of gate patterns are formed.

* * * * *